United States Patent
Asano

(10) Patent No.: US 11,094,874 B2
(45) Date of Patent: Aug. 17, 2021

(54) PIEZOELECTRIC VIBRATION DEVICE

(71) Applicant: Murata Manufacturing Co., Ltd., Nagaokakyo (JP)

(72) Inventor: Hiroshi Asano, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 857 days.

(21) Appl. No.: 15/888,447

(22) Filed: Feb. 5, 2018

(65) Prior Publication Data
US 2018/0159018 A1 Jun. 7, 2018

Related U.S. Application Data

(63) Continuation of application No. PCT/JP2016/072889, filed on Aug. 4, 2016.

(30) Foreign Application Priority Data

Sep. 10, 2015 (JP) .............................. JP2015-178049
Oct. 23, 2015 (JP) .............................. JP2015-208544
(Continued)

(51) Int. Cl.
*H01L 41/053* (2006.01)
*H01L 41/083* (2006.01)
(Continued)

(52) U.S. Cl.
CPC .......... *H01L 41/053* (2013.01); *H01L 41/044* (2013.01); *H01L 41/0471* (2013.01);
(Continued)

(58) Field of Classification Search
CPC . H01L 41/053; H01L 41/047; H01L 41/0471; H01L 41/0472; H01L 41/0475; H01L 41/083; H01L 41/107
(Continued)

(56) References Cited

U.S. PATENT DOCUMENTS 5,894,185 A 4/1999 Asada et al.
5,949,179 A 9/1999 Kumasaka et al.
(Continued)

FOREIGN PATENT DOCUMENTS

JP H0354878 A 3/1991
JP H05-206539 A 8/1993
(Continued)

OTHER PUBLICATIONS

International Search Report issued in International Application No. PCT/JP2016/072889, dated Sep. 27, 2016.
(Continued)

*Primary Examiner* — Derek J Rosenau
(74) *Attorney, Agent, or Firm* — Arent Fox LLP

(57) ABSTRACT

A piezoelectric vibration device is provided that includes a piezoelectric transformer, a flexible board and a case. The flexible board includes an element-mounting terminal connected to an outer electrode of the piezoelectric transformer, and an external connection terminal connected to a wiring board. The case has a securing member that secures the case to the wiring board and a ceiling. When the piezoelectric vibration device is mounted on the wiring board, the securing member defines a space between the ceiling and the wiring board to accommodate the piezoelectric transformer and the flexible board. Moreover, the piezoelectric transformer is suspended to the ceiling of the case by a holding member. This configuration provides a piezoelectric vibration device with which degradation of characteristics due to causes such as displacement of the piezoelectric vibrator or fluctuations in the pressing force applied by lead terminals is minimized.

18 Claims, 37 Drawing Sheets

(30) Foreign Application Priority Data

Oct. 23, 2015 (JP) .............................. JP2015-208545
Oct. 23, 2015 (JP) .............................. JP2015-208546
Oct. 23, 2015 (JP) .............................. JP2015-208547

(51) Int. Cl.
*H01L 41/107* (2006.01)
*H01L 41/04* (2006.01)
*H02M 3/335* (2006.01)
*H01L 41/047* (2006.01)
*H02M 3/24* (2006.01)

(52) U.S. Cl.
CPC ...... *H01L 41/0472* (2013.01); *H01L 41/0475* (2013.01); *H01L 41/083* (2013.01); *H01L 41/107* (2013.01); *H02M 3/24* (2013.01); *H02M 3/335* (2013.01); *H02M 3/33523* (2013.01)

(58) Field of Classification Search
USPC ......................................... 310/344, 345, 348
See application file for complete search history.

(56) References Cited

U.S. PATENT DOCUMENTS

| | | | |
|---|---|---|---|
| 9,631,926 B2 | 4/2017 | Ogura et al. | |
| 2003/0193270 A1* | 10/2003 | Hyun | H01L 41/053 310/348 |
| 2007/0040477 A1* | 2/2007 | Sugiura | G01S 7/521 310/324 |
| 2015/0162522 A1 | 6/2015 | Ogura et al. | |
| 2015/0188455 A1* | 7/2015 | Oh | B06B 1/0651 310/317 |
| 2015/0280104 A1 | 10/2015 | Asano | |

FOREIGN PATENT DOCUMENTS

| | | |
|---|---|---|
| JP | H09-83034 A | 3/1997 |
| JP | H10-173251 A | 6/1998 |
| JP | H11-26831 A | 1/1999 |
| JP | H11-54811 A | 2/1999 |
| JP | H11-97756 A | 4/1999 |
| JP | H11-121826 A | 4/1999 |
| JP | H11-150310 A | 6/1999 |
| JP | 2000-124519 A | 4/2000 |
| JP | 2002-26414 A | 1/2002 |
| JP | 2002-291253 A | 10/2002 |
| JP | 2003164155 A | 6/2003 |
| JP | 2005-5656 A | 1/2005 |
| JP | 2008-236820 A | 10/2008 |
| JP | 2015-92595 A | 5/2015 |
| JP | 2015-108567 A | 6/2015 |

OTHER PUBLICATIONS

Written Opinion of the International Searching Authority issued in International Application No. PCT/JP2016/072889, dated Sep. 27, 2016.

* cited by examiner

PIEZOELECTRIC VIBRATION DEVICE

CROSS REFERENCE TO RELATED APPLICATIONS

The present application is a continuation of PCT/JP2016/072889 filed Aug. 4 22, 2016, which claims priority to Japanese Patent Application No. 2015-178049, filed Sep. 10, 2015, Japanese Patent Application No. 2015-208544, filed Oct. 23, 2015, Japanese Patent Application No. 2015-208545, filed Oct. 23, 2015, Japanese Patent Application No. 2015-208546, filed Oct. 23, 2015, and Japanese Patent Application No. 2015-208547, filed Oct. 23, 2015, the entire contents of each of which are incorporated herein by reference.

TECHNICAL FIELD

The present disclosure relates to a piezoelectric vibration device, and, in particular, a piezoelectric vibration device mounted to a wiring board.

BACKGROUND

Piezoelectric vibration devices, such as piezoelectric transformers, have a piezoelectric vibrator and a case that are designed with consideration given to factors such as minimization of impediment to the mechanical vibration of the piezoelectric vibrator, miniaturization, and the ease of manufacture. For example, the piezoelectric transformer disclosed in Patent Document 1 (identified below) includes a piezoelectric vibrator, and a resin case having a cavity that accommodates the piezoelectric vibrator. The bottom surface of the cavity of the resin case is provided with pad portions such that when the piezoelectric vibrator is accommodated within the cavity, the nodes of mechanical vibration of the piezoelectric vibrator are supported at the pad portions. Lead terminals in the form of flexible leaf springs are brought into contact with the input and output electrodes of the piezoelectric vibrator for electrical connection with these electrodes.

Patent Document 1: Japanese Unexamined Patent Application Publication No. 2002-26414.

With conventional piezoelectric vibration devices, such as the piezoelectric vibration device disclosed in Patent Document 1, if the mounting position of the piezoelectric vibrator on the case is displaced, or if the pressing force exerted by the lead terminals deviates from a designed value, the mechanical vibration of the piezoelectric vibrator is impeded, leading to degradation of the characteristics of the piezoelectric vibration device. In the case of a piezoelectric transformer, for example, its power conversion efficiency decreases.

SUMMARY OF THE INVENTION

It is an object of the present disclosure to provide a piezoelectric vibration device with which degradation of characteristics due to causes such as displacement of the piezoelectric vibrator or fluctuations in the pressing force applied by lead terminals is minimized.

Thus, according to an exemplary embodiment, a piezoelectric vibration device is provided that includes a piezoelectric vibrator, a flexible board, and a case, wherein the piezoelectric vibrator has a piezoelectric element, and an outer electrode provided on a surface of the piezoelectric element, wherein the flexible board includes an element-mounting terminal to which the outer electrode of the piezoelectric vibrator is connected, and an external connection terminal that is connected to the wiring board, wherein the case has a securing portion that secures the case to the wiring board, and a ceiling portion, wherein the securing portion defines, when the piezoelectric vibration device is mounted on the wiring board, a space between the ceiling portion and the wiring board to accommodate the piezoelectric vibrator and the flexible board, and wherein the outer electrode of the piezoelectric vibrator is connected to the element-mounting terminal of the flexible board, and the piezoelectric vibrator is suspended inside the case onto the ceiling portion of the case by using a holding member.

As a result of the above-mentioned configuration, electrically speaking, the piezoelectric vibrator is connected via the flexible board to the wiring board on which the piezoelectric vibrator is to be mounted, and mechanically speaking, the piezoelectric vibrator is suspended onto the ceiling of the case by using the holding member. As a result, displacement of the mounting position of the piezoelectric vibrator on the flexible board creates relatively little impediment to mechanical vibration. Thus, variations in characteristics resulting from variations in mounting position are relatively small. Further, with the piezoelectric vibration device mounted on the wiring board, the securing portion defines a space between the ceiling of the case and the wiring board to accommodate the piezoelectric vibrator and the flexible board. Therefore, impediment to the mechanical vibration of the piezoelectric vibrator is minimized by means of a simple structure with only the flexible board interposed between the piezoelectric vibrator and the wiring board.

According to an exemplary aspect, the outer electrode is disposed on a first surface of the piezoelectric element, and a second surface of the piezoelectric element opposite to the first surface is held onto the ceiling portion of the case. As a result, the ceiling of the case and the flexible board are arranged parallel to each other, and a low-profile piezoelectric vibration device is obtained.

According to another exemplary aspect, the holding member is disposed between a node of mechanical vibration of the piezoelectric vibrator and the ceiling portion. This effectively minimizes impediment to the mechanical vibration of the piezoelectric vibrator.

According to yet another exemplary aspect, the outer electrode is connected to the element-mounting terminal at a node of mechanical vibration on the first surface by using a conductive joining material. This effectively minimizes impediment to the mechanical vibration of the piezoelectric vibrator.

According to yet another exemplary aspect, the case includes a first case portion having the ceiling portion, and a second case portion having the securing portion, and the first case portion is held by the second case portion. As a result, the case can be formed by using a material suited for the ceiling portion and a material suited for the securing portion.

According to yet another exemplary aspect, the first case portion is a resin molding, and the second case portion is a metal molding. As a result, electrical insulation between the first case portion and the piezoelectric vibrator is readily provided by the first case portion.

According to yet another exemplary aspect, the piezoelectric vibrator is a piezoelectric transformer. This enables construction of a transformer circuit with high power conversion efficiency.

According to yet another exemplary aspect, the piezoelectric transformer includes an input vibration portion on one side and an output vibration portion on another side with respect to the longitudinal direction of the piezoelectric element having a rectangular parallelepiped shape, and the piezoelectric vibrator vibrates in a longitudinal vibration mode. As a result, the outer electrode can be easily disposed on the first surface of the piezoelectric element for both the input vibration portion and the output vibration portion.

According to yet another exemplary aspect, the flexible board has a frame, and an extended portion extended from the frame, the element-mounting terminal is provided on the extended portion, and the external connection terminal is provided on the frame. This ensures that even though the flexible board has a limited area, the piezoelectric vibrator can be easily mounted on such a flexible board without covering up the external connection terminal. Further, the external connection terminal can be disposed at a peripheral portion of the flexible board, thus facilitating connection of the external connection terminal of the flexible board to the wiring board.

According to yet another exemplary aspect, the extended portion is connected to the frame at a basal portion, and the element-mounting terminal is located at the distal end portion of the extended portion. This configuration thus minimizes impediment to mechanical vibration.

According to yet another exemplary aspect, the piezoelectric vibrator is a piezoelectric transformer that includes a first piezoelectric transformer, and a second piezoelectric transformer, where the flexible board has a first mounting region to which the first piezoelectric transformer is mounted, and a second mounting region to which the second piezoelectric transformer is mounted, the first mounting region and the second mounting region being located on opposite sides of an axis of symmetry, the outer electrode of the first piezoelectric transformer and the outer electrode of the second piezoelectric transformer each include a primary-side first outer electrode, a primary-side second outer electrode, and a secondary-side outer electrode, and the first piezoelectric transformer and the second piezoelectric transformer are mounted to the flexible board such that the primary-side first outer electrode, the primary-side second outer electrode, and the secondary-side outer electrode of the first piezoelectric transformer, and the primary-side first outer electrode, the primary-side second outer electrode, and the secondary-side outer electrode of the second piezoelectric transformer are positioned line-symmetric to each other with respect to the axis of symmetry, the element-mounting terminal of the flexible board has a first mounting electrode to which the primary-side first outer electrode of the first piezoelectric transformer is connected, a second mounting electrode to which the primary-side second outer electrode of the first piezoelectric transformer is connected, a third mounting electrode to which the secondary-side outer electrode of the first piezoelectric transformer is connected, a fourth mounting electrode to which the primary-side first outer electrode of the second piezoelectric transformer is connected, a fifth mounting electrode to which the primary-side second outer electrode of the second piezoelectric transformer is connected, and a sixth mounting electrode to which the secondary-side outer electrode of the second piezoelectric transformer is connected, the first mounting electrode and the fourth mounting electrode are line-symmetric to each other with respect to the axis of symmetry, the second mounting electrode and the fifth mounting electrode are line-symmetric to each other with respect to the axis of symmetry, and the third mounting electrode and the sixth mounting electrode are line-symmetric to each other with respect to the axis of symmetry This configuration ensures that adjacent electrodes of the first and second piezoelectric transformers have the same polarity. Thus, the first and second piezoelectric transformers do not need to be spaced away from each other. This helps to minimize an increase in size while ensuring insulation between the electrodes of the two piezoelectric transformers.

According to yet another exemplary aspect, the flexible board includes a frame, a first extended portion extended from the frame, and a second extended portion extended from the frame, and a first element-mounting terminal provided on the first extended portion and to which a first outer electrode of the piezoelectric vibrator is connected, and a second element-mounting terminal provided on the second extended portion and to which a second outer electrode of the piezoelectric vibrator is connected, and a first basal portion of the first extended portion connected to the frame is located closer to the second element-mounting terminal than is the first element-mounting terminal.

The above-mentioned configuration helps increase the length of the first extended portion of the flexible board, thus ensuring that the portion of the flexible board from the basal portion of the first extended portion to a position corresponding to the first outer electrode of the piezoelectric vibrator has high springiness. Advantageously, this design minimizes impediment to the mechanical vibration of the piezoelectric vibrator.

According to yet another exemplary aspect, the outer electrode includes a first outer electrode, a second outer electrode, a third outer electrode, and a fourth outer electrode, the piezoelectric vibrator is a piezoelectric transformer, and application of a voltage to one of the first and second outer electrodes and the third and fourth outer electrodes of the piezoelectric transformer causes a voltage to be excited in the other one of the first and second outer electrodes and the third and fourth outer electrodes, the piezoelectric transformer includes the piezoelectric element having a rectangular first surface, a plurality of first inner electrodes disposed inside the piezoelectric element and connected to the first outer electrode, a plurality of second inner electrodes disposed inside the piezoelectric element and connected to the second outer electrode, a plurality of third inner electrodes disposed inside the piezoelectric element and connected to the third outer electrode, and a plurality of fourth inner electrodes disposed inside the piezoelectric element and connected to the fourth outer electrode, the first outer electrode, the second outer electrode, the third outer electrode, and the fourth outer electrode are disposed on the first surface of the piezoelectric element such that the first, second, third, and fourth outer electrodes are insulated from each other, the first outer electrode and the second outer electrode are arranged along a direction of one side of the first surface of the piezoelectric element, the third outer electrode and the fourth outer electrode are arranged along the direction of the one side of the first surface of the piezoelectric element, the first outer electrode and the third outer electrode are arranged along a direction orthogonal to the direction of the one side of the first surface of the piezoelectric element, and the second outer electrode and the fourth outer electrode are arranged along the direction orthogonal to the direction of the one side of the first surface of the piezoelectric element.

This configuration ensures that the first outer electrode and the second outer electrode, and the third outer electrode and the fourth outer electrode are spaced away from each other, thus maintaining insulation between the electrodes. Further, the electrodes are disposed on the same surface of the piezoelectric body, thus allowing for easy mounting of the piezoelectric transformer.

According to yet another exemplary aspect, the piezoelectric vibrator is a piezoelectric transformer, the piezoelectric element has an input portion that is polarized, an output portion that is polarized, and an insulating portion disposed between the input portion and the output portion, the piezoelectric transformer includes an input-side first inner electrode and an input-side second inner electrode that are disposed in the input portion and located opposite to each other, and an output-side first inner electrode and an output-side second inner electrode that are disposed in the output portion and located opposite to each other, the input-side second inner electrode is connected to an input-side reference potential, and at least a part of the input-side second inner electrode is located closer to the insulating portion than is the input-side first inner electrode, and the output-side second inner electrode is connected to an output-side reference potential, and at least a part of the output-side second inner electrode is located closer to the insulating portion than is the output-side first inner electrode.

This configuration makes it possible to increase the stray capacitance generated between the input-side second inner electrode and the output-side second inner electrode, and decrease the stray capacitance generated between the input-side first inner electrode and the output-side first inner electrode. This minimizes coupling due to the stray capacitance between the input-side first inner electrode to which voltage is applied, and the output-side first inner electrode that outputs voltage. As a result, this helps to minimize propagation of an undesired signal between the input-side first inner electrode and the output-side first inner electrode via the stray capacitance.

Supposing that the input-side reference potential is the ground, and the output-side reference potential is a reference potential within an apparatus equipped with the piezoelectric transformer, then the output-side reference potential is floating with respect to the input-side reference potential. If the user touches (operates) the load connected to the output-side portion (output-side first inner electrode) of the piezoelectric transformer in this state, this may cause the output-side reference potential to fluctuate in some cases. Accordingly, the above-mentioned configuration is employed so that the input-side second inner electrode and the output-side second inner electrode are coupled to each other by the stray capacitance generated between the two electrodes. This helps to reduce the difference in alternating-current potential between the output-side reference potential to which the output-side second inner electrode is connected, and the input-side reference potential to which the input-side second inner electrode is connected. This allows the output-side reference potential to stabilize, thus preventing malfunction of the load.

The exemplary embodiments provide a piezoelectric vibration device with stable characteristics that addresses the problem of degradation of characteristics due to causes such as displacement of the piezoelectric vibrator or fluctuations in the pressing force applied to hold the piezoelectric vibrator in place.

DETAILED DESCRIPTION OF EMBODIMENTS

First Embodiment

Figure 1:
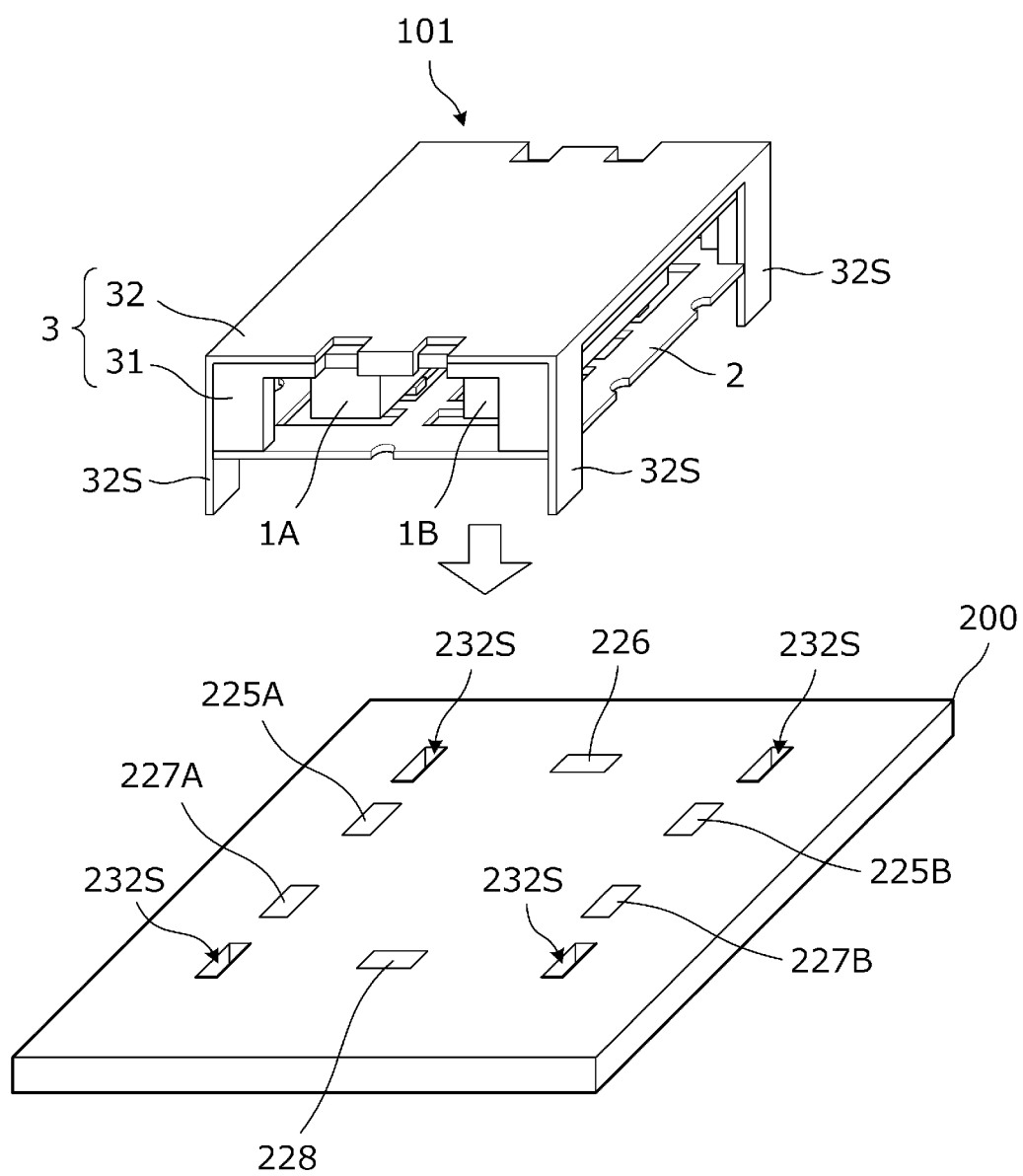
FIG. 1 is a perspective view of a piezoelectric transformer module according to a first exemplary embodiment, and a wiring board to which the piezoelectric transformer module is mounted.
Figure 2:
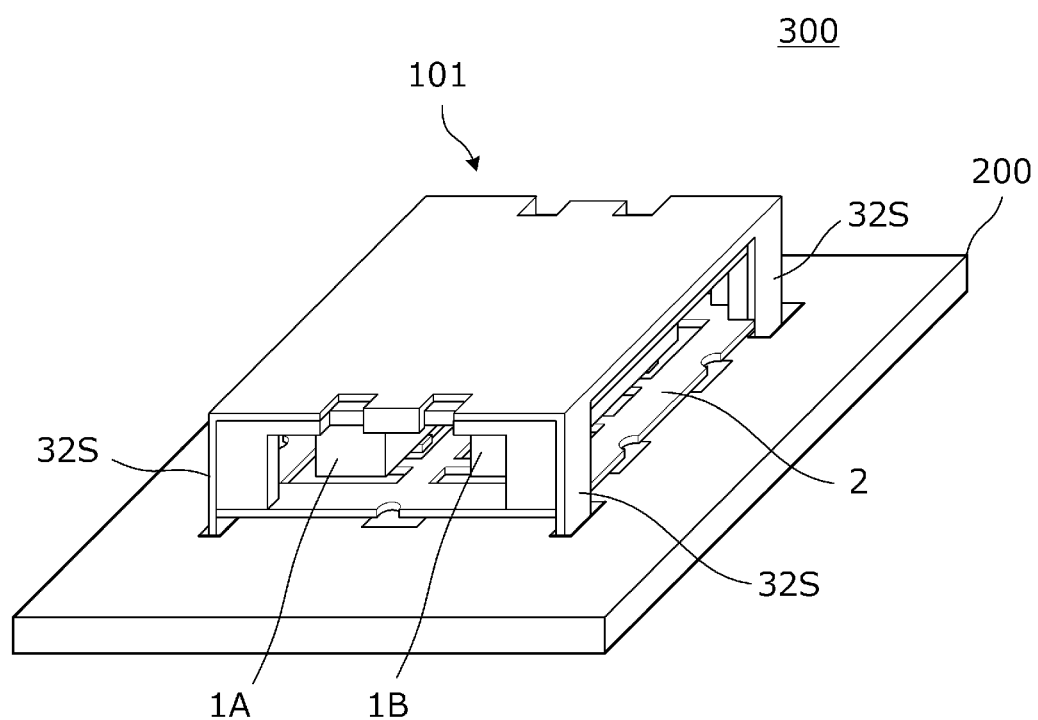
FIG. 2 is a perspective view of a mounting structure of the piezoelectric transformer module mounted on a wiring board.

FIG. 1 is a perspective view of a piezoelectric transformer module 101 according to an exemplary embodiment, that includes a wiring board 200 on which the piezoelectric transformer module 101 is mounted. FIG. 2 is a perspective view of a mounting structure 300 of the piezoelectric transformer module 101 mounted on the wiring board 200. It is noted that FIGS. 1 and 2 do not depict various terminals, conductor patterns, or other components provided on a flexible board 2.

The piezoelectric transformer module 101 includes piezoelectric transformers 1A and 1B, the flexible board 2, and a case 3 that holds the piezoelectric transformers 1A and 1B and the flexible board 2. The piezoelectric transformers 1A and 1B each represent an example of "piezoelectric vibrator" according to the exemplary embodiment. The piezoelectric transformer module 101 represents an example of "piezoelectric vibration device" according to the exemplary embodiment.

The piezoelectric transformers 1A and 1B each have a piezoelectric element, and an outer electrode (details of which will be described later) provided on the surface of the piezoelectric element. The flexible board 2 includes an element-mounting terminal to which the outer electrode of each of the piezoelectric transformers 1A and 1B is connected, and an external connection terminal that is connected to the wiring board 200.

The case 3 has a securing portion 32S (or securing member, details of which will be described later) that secures the case 3 to the wiring board 200, and a ceiling or ceiling portion (there terms are used interchangeably). The securing portion 32S defines, when the piezoelectric transformer module 101 is mounted on the wiring board 200, a space between the ceiling portion and the wiring board 200 to accommodate the piezoelectric transformers 1A and 1B and the flexible board 2.

The case 3 includes a first case portion 31 having the ceiling portion, and a second case portion 32 having the securing portion 32S. The first case portion 31 is held by the second case portion 32.

The wiring board 200 is provided with a slot 232S into which the securing portion 32S is inserted. The wiring board 200 is also provided with connection terminals (lands) 225A, 225B, 226, 227A, 227B, and 228 to which the corresponding external connection terminals of the flexible board 2 are connected.

A solder paste is printed onto the connection terminals 225A, 225B, 226, 227A, 227B, and 228 of the wiring board 200, and the securing portion 32S of the piezoelectric transformer module 101 is inserted into the slot 232S of the wiring board 200, followed by soldering by reflow. This process creates the mounting structure 300 of the piezoelectric transformer module 101 illustrated in FIG. 2.

Figure 3:
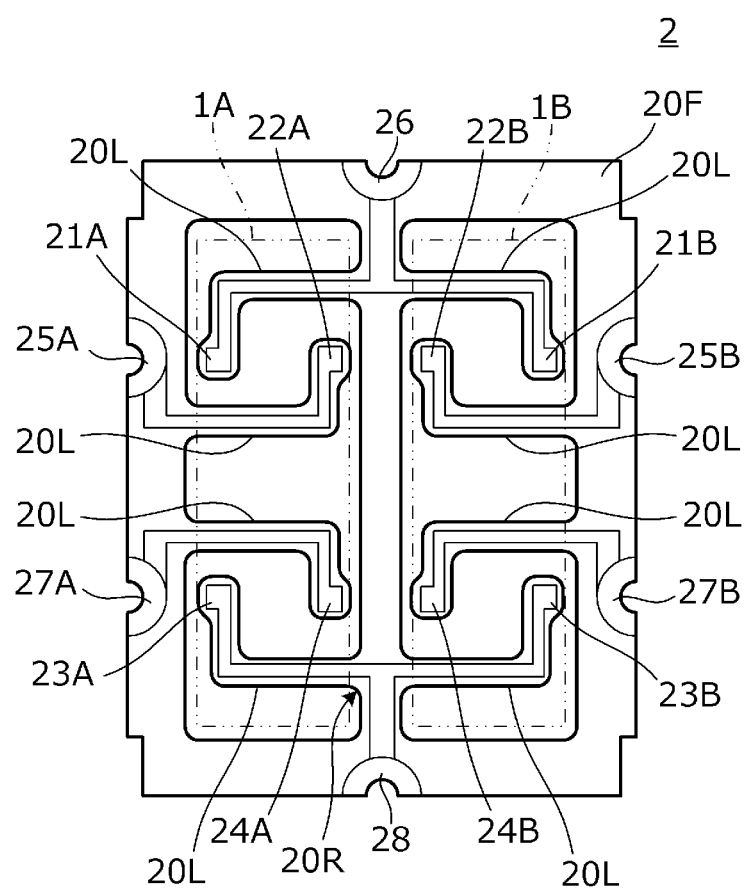
FIG. 3 is a plan view of a flexible board.

FIG. 3 is a plan view of the flexible board 2. The flexible board 2 includes element-mounting terminals 21A, 21B, 22A, 22B, 23A, 23B, 24A, and 24B to which the corresponding outer electrodes of the piezoelectric transformers 1A and 1B are connected, and external connection terminals 25A, 25B, 26, 27A, 27B, and 28 that are connected to the wiring board.

The flexible board 2 has a frame 20F in the form of a closed rectangular frame, and a plurality of extended portions 20L or extended members (the terms are used interchangeably), which are extended inward from the frame 20F while being bent in an L-shape. Each of the element-mounting terminals 21A, 21B, 22A, 22B, 23A, 23B, 24A, and 24B is provided on the extended portion 20L. In the first exemplary embodiment, the extended portion 20L is connected to the frame 20F at its basal portion 20R, and the element-mounting terminals 21A, 21B, 22A, 22B, 23A, 23B, 24A, and 24B are each located at the distal end portion of the extended portion 20L. That is, each of the element-mounting terminals 21A, 21B, 22A, 22B, 23A, 23B, 24A, and 24B are located at positions where these element-mounting terminals are unlikely to impede the mechanical vibration of the flexible board 2.

The frame 20F of the flexible board 2 is provided with the external connection terminals 25A, 25B, 26, 27A, 27B, and 28. In the first embodiment, in particular, the external connection terminals 25A, 25B, 26, 27A, 27B, and 28 are disposed at a peripheral portion of the frame 20F.

Figure 4A:
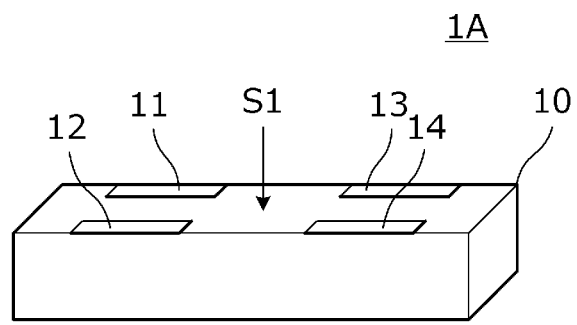
FIG. 4(A) and FIG. 4(B) are perspective views of a piezoelectric transformer.
Figure 4B:
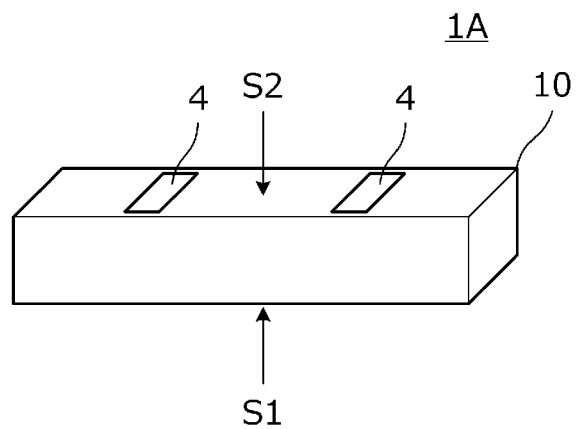

FIG. 4(A) and FIG. 4(B) are perspective views of the piezoelectric transformer 1A. FIG. 4(A) is a perspective view of the piezoelectric transformer 1A with its first surface S1 facing up, and FIG. 4(B) is a perspective view of the piezoelectric transformer 1A with its second surface S2 facing up.

As shown, the piezoelectric transformer 1A includes a piezoelectric element 10 having a rectangular parallelepiped shape, and outer electrodes 11, 12, 13, and 14 provided along two opposite sides of the first surface S1 of the piezoelectric element 10. The outer electrodes 11 and 12 are located in an input vibration portion (to be referred to as input region hereinafter), and the outer electrodes 13 and 14 are located in an output vibration portion (to be referred to as output region hereinafter). The second surface S2 opposite to the first surface S1 of the piezoelectric transformer 1A is provided with two holding members 4. Each of the holding members 4 is an elastic member capable of absorbing the vibration of the piezoelectric vibrator, for example, a minute double faced adhesive tape. The holding member 4 is affixed to a node of mechanical vibration of the piezoelectric transformer 1A described later. The configuration of the piezoelectric transformer 1B is such that each of its outer electrodes has a polarity that is in mirror symmetry to the polarity of each outer electrode of the piezoelectric transformer 1A. Otherwise, the piezoelectric transformer 1B is of the same configuration as the piezoelectric transformer 1A.

FIGS. 5(A), 5(B), 5(C), 5(D), and 5(E) are perspective views of the piezoelectric transformer module 101, each illustrating the structure of the piezoelectric transformer module 101 in the corresponding step of its manufacture. FIGS. 5(A) to 5(E) do not depict various terminals, conductor patterns, or other components provided on the flexible board 2.

Figure 5A:
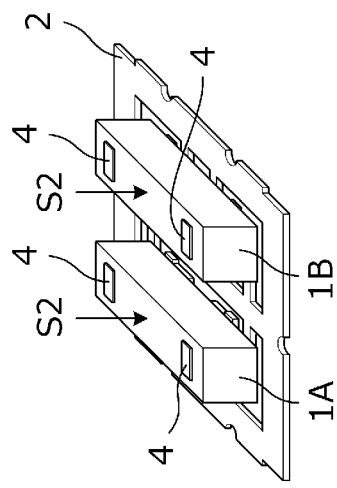
FIGS. 5(A), 5(B), 5(C), 5(D), and 5(E) are perspective views of a piezoelectric transformer module, each illustrating the structure of the piezoelectric transformer module in the corresponding step of its manufacture.
Figure 5B:
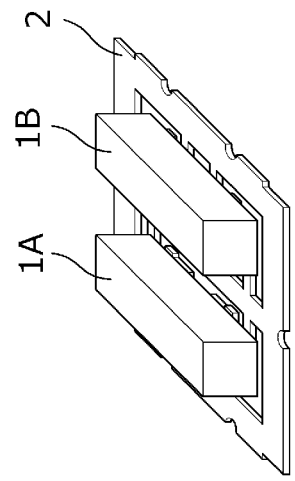

FIG. 5(A) is a perspective view of the flexible board 2, and FIG. 5(B) is a perspective view of the flexible board with the piezoelectric transformers 1A and 1B mounted on the flexible board. The piezoelectric transformers 1A and 1B are connected to the flexible board 2 with the respective first surfaces S1 of the piezoelectric transformers 1A and 1B facing the flexible board 2. Specifically, a solder paste is printed onto the element-mounting terminals 21A, 21B, 22A, 22B, 23A, 23B, 24A, and 24B of the flexible board 2, and then the piezoelectric transformers 1A and 1B are mounted onto the flexible board 2, followed by reflow soldering to connect the flexible board 2 and the piezoelectric transformers 1A and 1B. At this time, each of the element-mounting terminals 21A, 22A, 23A, and 24A is preferably connected to a node of mechanical vibration of the piezoelectric transformer 1A. Likewise, each of the element-mounting terminals 21B, 22B, 23B, and 24B is preferably connected to a node of mechanical vibration of the piezoelectric transformer 1B.

Figure 5C:
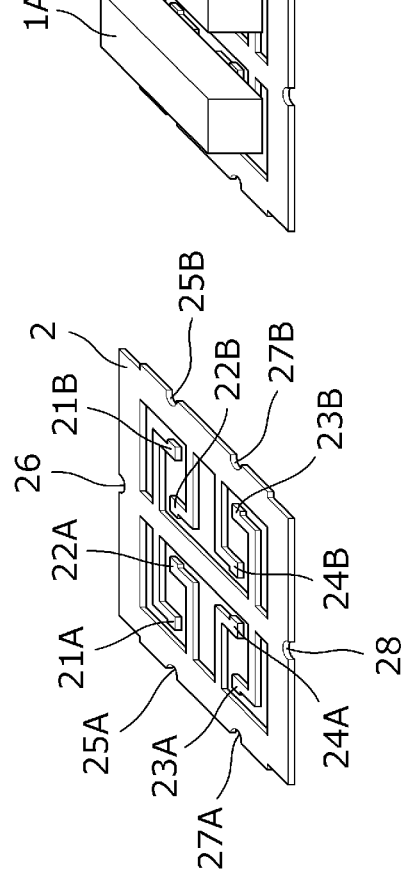

FIG. 5(C) illustrates a state in which the holding member 4 is affixed to the second surface S2 of each of the piezoelectric transformers 1A and 1B.

Figure 5D:
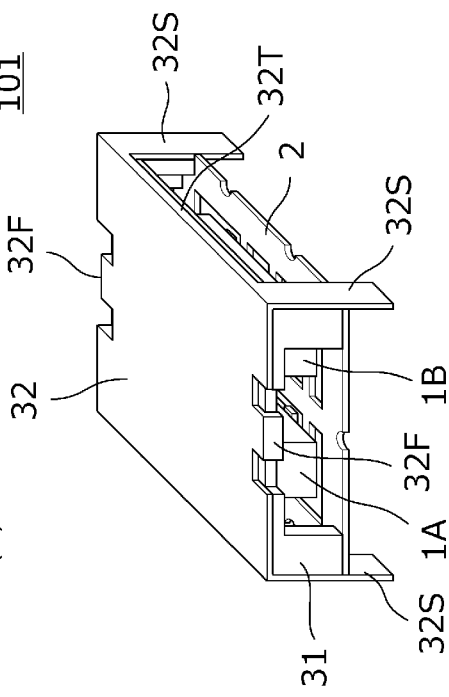

FIG. 5(D) illustrates a state in which the first case portion 31 is placed over the flexible board 2. The first case portion 31 has a top plate portion 31T, and four leg portions 31S. With the first case portion 31 placed over the flexible board 2, a space for accommodating the piezoelectric transformers 1A and 1B is defined between the inner surface of the top plate portion 31T (the ceiling of the first case portion 31) and the upper surface of the flexible board 2. By placing the first case portion 31 over the flexible board 2, the second surface S2 of each of the piezoelectric transformers 1A and 1B is affixed to the ceiling of the first case portion 31 by using the holding member 4.

Figure 5E:
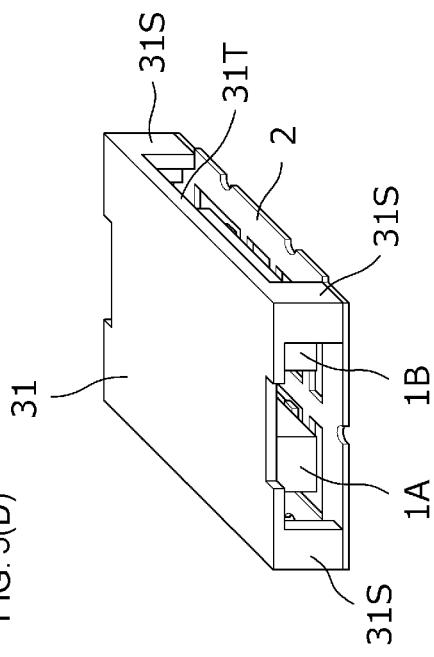

FIG. 5(E) illustrates a state in which the second case portion 32 is placed over the first case portion 31. The second case portion 32 has a top plate portion 32T, and four securing portions 32S. The second case portion 32 is integrated with the first case portion 31 as two securing portions 32F of the second case portion 32 are bent so as to embrace the first case portion 31.

In the exemplary aspect, the components mentioned above are assembled together to form the piezoelectric transformer module 101 illustrated in FIG. 1.

Figure 6:
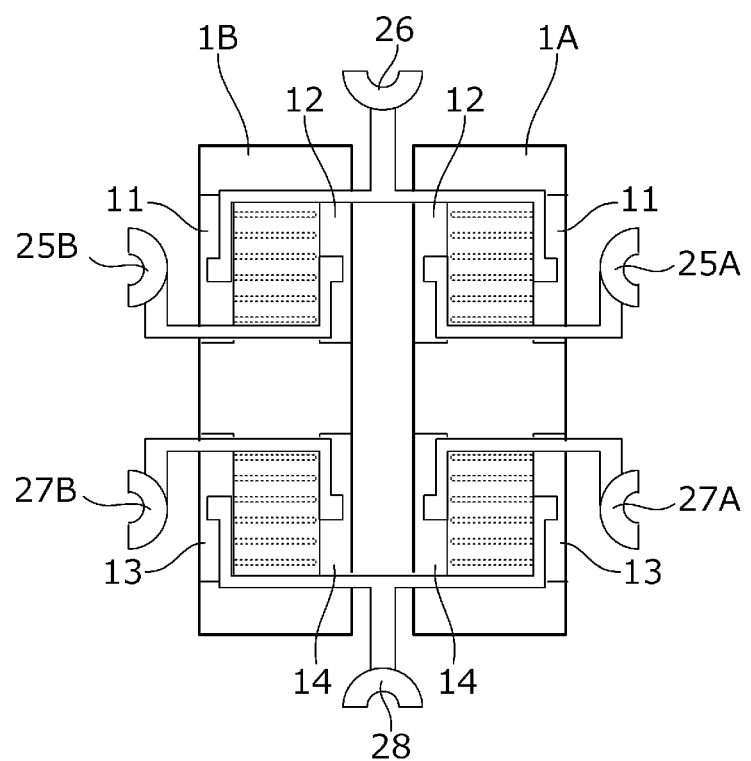
FIG. 6 illustrates how external connection terminals, and two piezoelectric transformers of a piezoelectric transformer module are connected to each other.

FIG. 6 illustrates how the external connection terminals, and two piezoelectric transformers 1A and 1B of the piezoelectric transformer module 101 are connected with each other. With the piezoelectric transformers 1A and 1B mounted on the flexible board 2, the outer electrodes 11 and 12 in the input region of the piezoelectric transformer 1A are respectively connected to the external connection terminals 26 and 25A, and the outer electrodes 13 and 14 in the output region of the piezoelectric transformer 1A are respectively connected to the external connection terminals 28 and 27A. The outer electrodes 11 and 12 in the input region of the piezoelectric transformer 1B are respectively connected to the external connection terminals 26 and 25B, and the outer electrodes 13 and 14 in the output region of the piezoelectric transformer 1B are respectively connected to the external connection terminals 28 and 27B. With the piezoelectric transformer module 101 according to the first exemplary embodiment, when a voltage is input between the external connection terminal 26 and the external connection terminal 25A or 25B, a voltage is output from between the external connection terminal 28 and the external connection terminal 27A or 27B.

Figure 7:
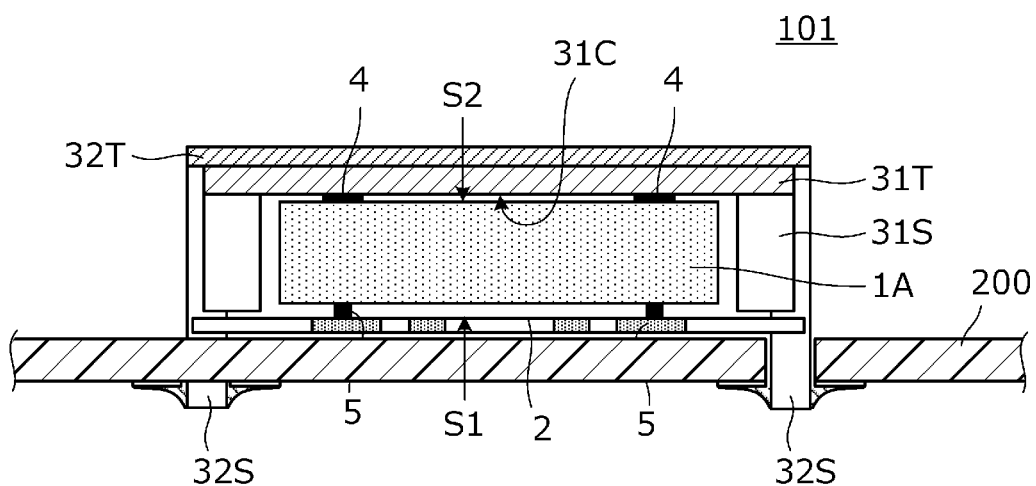
FIG. 7 is a longitudinal sectional view of a piezoelectric transformer module and its mounting structure.

FIG. 7 is a longitudinal sectional view of the piezoelectric transformer module 101. As illustrated in FIG. 7, the first surface S1 of the piezoelectric transformer 1A is joined to the element-mounting terminals of the flexible board 2 by using a solder 5. The second surface S2 of the piezoelectric transformer 1A is affixed to a ceiling portion 31C of the first case portion 31 by using the holding member 4.

Figure 8:
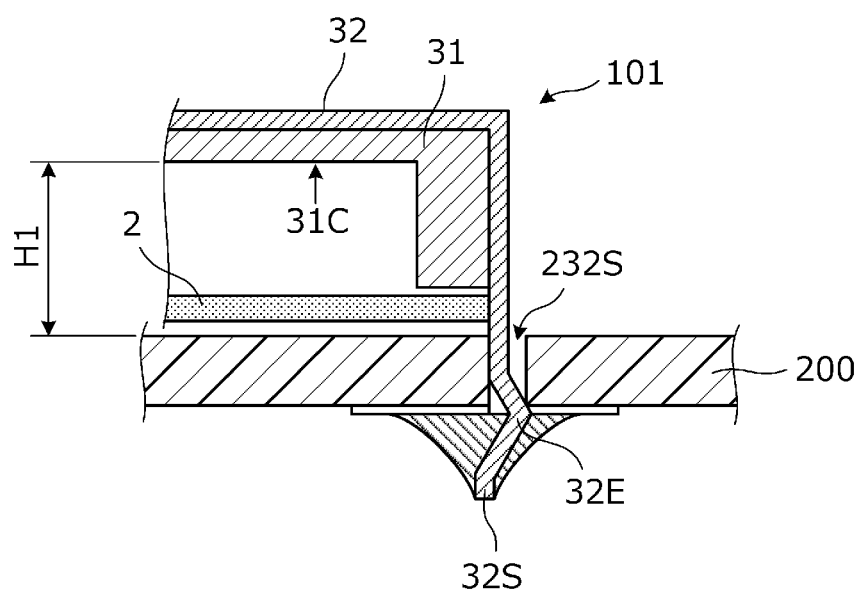
FIG. 8 is a partial cross-sectional view of the location corresponding to a securing portion when a piezoelectric transformer module is mounted on a wiring board.

FIG. 8 is a partial cross-sectional view of the location corresponding to the securing portion 32S when the piezoelectric transformer module 101 is mounted on the wiring board 200.

The securing portion 32S of the second case portion 32 has a bent engaging portion 32E at its distal end. As the securing portion 32S is inserted into the slot 232S, the flexible board 2 is placed over the wiring board 200, and the engaging portion 32E becomes engaged with the slot 232S of the wiring board 200. In this state, the securing portion 32S is soldered on the lower surface of the wiring board 200. With the piezoelectric transformer module 101 mounted on the wiring board 200 as described above, a space with a height H1 is defined between the ceiling portion 31C of the first case portion 31 and the wiring board 200. The piezoelectric transformers 1A and 1B and the flexible board 2 are accommodated in the space having the height H1.

Figure 9:
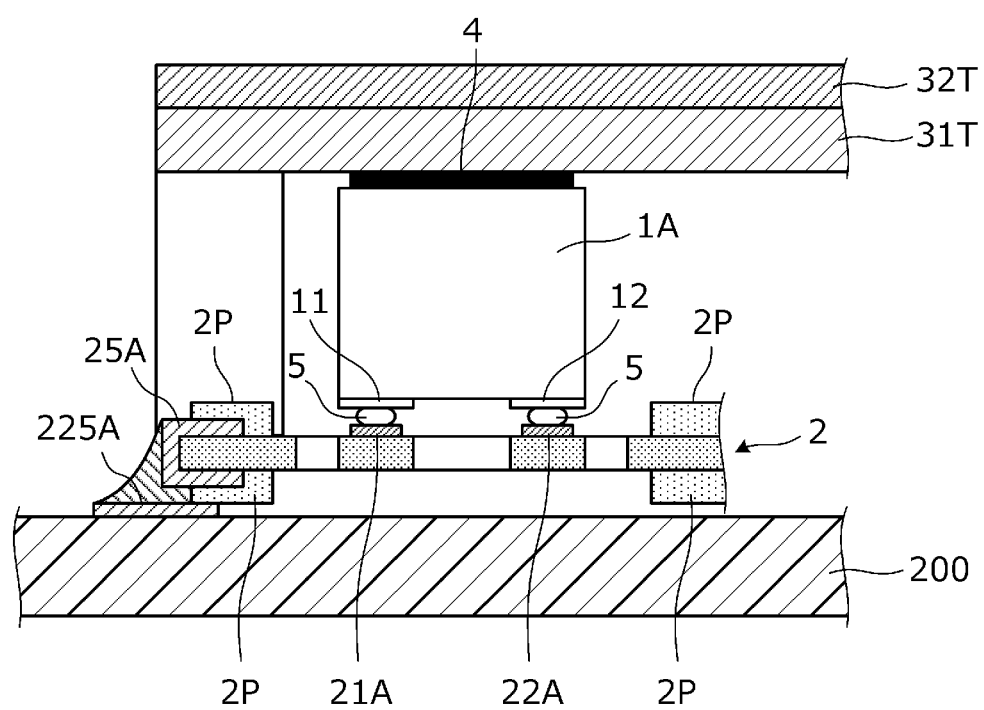
FIG. 9 is a partial cross-sectional view of a piezoelectric transformer module and its mounting structure.

FIG. 9 is a partial cross-sectional view illustrating the structure of the connecting part of the flexible board 2 with the wiring board 200, and the positional relationship between the piezoelectric transformer 1A and the wiring board 200.

A protective film 2P is provided on the upper and lower surfaces of the flexible board 2. The flexible board 2 is connected to the connection terminals (e.g., the connection terminal 225A) on the wiring board 200 by the external connection terminals (e.g., the external connection terminal 25A) provided at the periphery of the frame of the flexible board 2. Thus, a gap is present between the wiring board 200, and the lower surface of the flexible board 2 that is connected with components such as the piezoelectric transformer 1A. Due to the presence of the gap, the element-mounting terminals (e.g., the element-mounting terminals 21A and 22A) are unlikely to impede mechanical vibration.

This configuration thus minimizes impediment to the mechanical vibration of the piezoelectric transformer 1A.

Figure 10A:
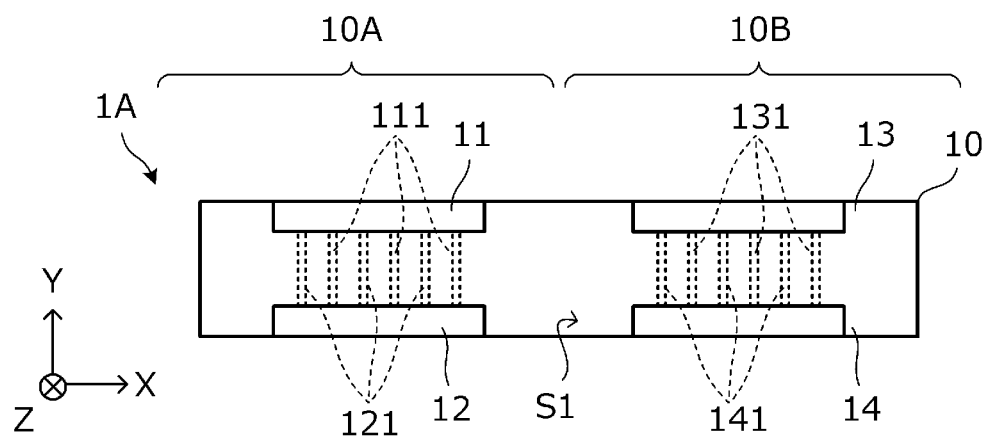
FIG. 10(A) is a plan view of a piezoelectric transformer.
Figure 10B:
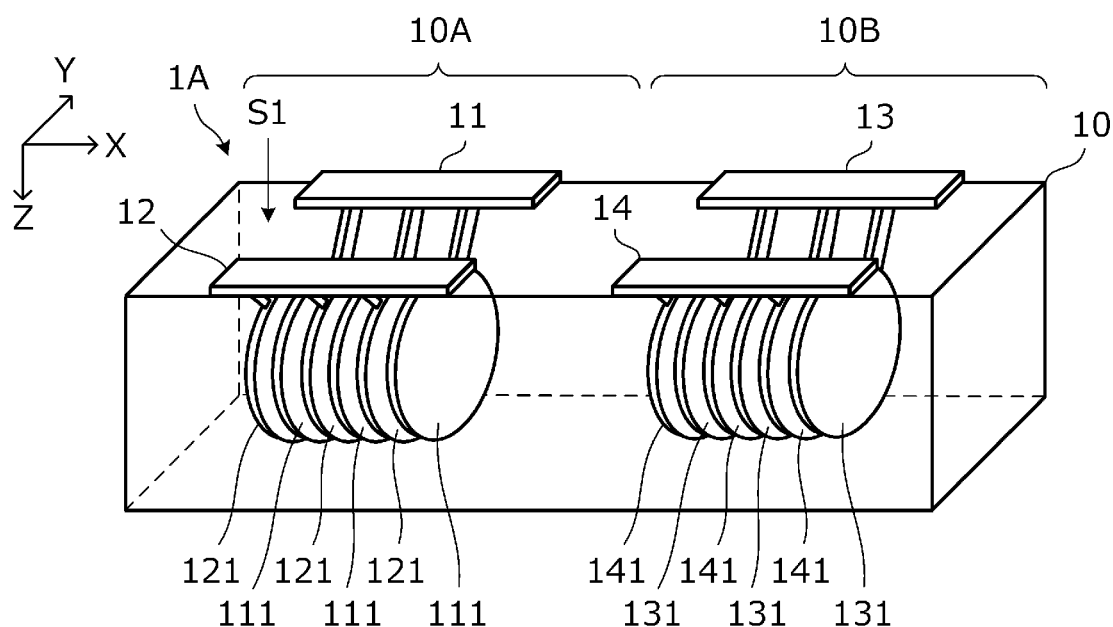
FIG. 10(B) is a see-through perspective view of the piezoelectric transformer, illustrating the internal structure of the piezoelectric transformer.

FIG. 10(A) is a plan view of the piezoelectric transformer 1A, and FIG. 10(B) is a see-through perspective view of the piezoelectric transformer 1A, illustrating the internal structure of the piezoelectric transformer 1A.

The input-side first outer electrode 11, the input-side second outer electrode 12, the output-side first outer electrode 13, and the output-side second outer electrode 14 are disposed on the first surface S1 of the piezoelectric element 10. Preferably, all of the outer electrodes 11, 12, 13, and 14 are in the shape of a rectangle having a surface with short and long sides. The outer electrodes 11, 12, 13, and 14 are disposed on the first surface S1 of the piezoelectric element 10 such that their long side is aligned with the X-axis direction and their short side is aligned with the Y-axis direction.

A plurality of input-side first inner electrodes 111, and a plurality of input-side second inner electrodes 121 are provided in an input region 10A. Each of the input-side first inner electrodes 111, which has a circular principal surface, is electrically continuous with the input-side first outer electrode 11. Each of the input-side second inner electrodes 121, which has a circular principal surface, is electrically continuous with the input-side second outer electrode 12.

The input-side first inner electrode 111 and the input-side second inner electrode 121 are disposed alternately in the X-axis direction such that the normals to their respective principal surfaces are aligned with the X-axis direction.

A plurality of output-side first inner electrodes 131, and a plurality of output-side second inner electrodes 141 are provided in an output region 10B. Each of the output-side first inner electrodes 131, which has a circular principal surface, is electrically continuous with the output-side first outer electrode 13. Each of the output-side second inner electrodes 141, which has a circular principal surface, is electrically continuous with the output-side second outer electrode 14.

The output-side first inner electrode 131 and the output-side second inner electrode 141 are disposed alternately in the X-axis direction such that the normals to their respective principal surfaces are aligned with the X-axis direction.

Figure 11:
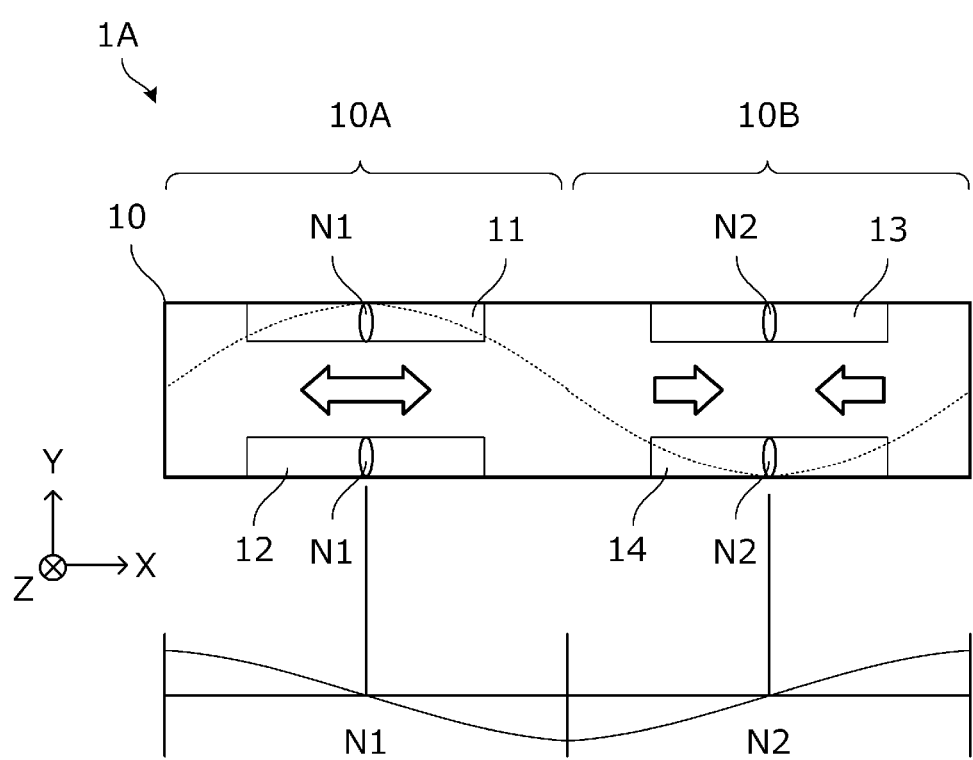
FIG. 11 is an illustration for explaining the direction in which each of an input vibration portion and an output vibration portion vibrates.

FIG. 11 is an illustration for explaining the direction in which each of the input region 10A and the output region 10B vibrates. The arrows in FIG. 11 indicate the direction of expansion/contraction of the piezoelectric element 10 in each of the input region 10A and the output region 10B. The dashed line indicates stress distribution in the piezoelectric element 10. The solid waveform in the lower part of FIG. 11 indicates the distribution of displacement of the piezoelectric element 10 due to vibration.

An alternating-current voltage applied on the input-side first outer electrode 11 and the input-side second outer electrode 12 creates an electric field between the input-side first inner electrode 111 and the input-side second inner electrode 121. That is, an electric field is applied to the input region 10A in the polarization direction. At this time, for example, the electric field is applied to the input-side first inner electrode 111 in opposite directions on the positive and negative sides of the X-axis. Then, due to the inverse piezoelectric effect, a thickness longitudinal vibration is excited in the direction of the thickness defined in the polarization direction, that is, in the X-axis direction along the first surface S1 of the piezoelectric element 10. This causes the input region 10A to expand/contract in the X-axis direction as indicated by the arrow in FIG. 11.

The excited longitudinal vibration causes a mechanical strain to develop in the output region 10B in the X-axis direction (polarization direction), causing the output region 10B to expand/contract in the X-axis direction as indicated by the arrows in FIG. 11. Since the vibration mode is $2\lambda/2$, the input region 10A and the output region 10B expand/contract in opposite directions. The resulting longitudinal piezoelectric effect creates a potential difference between the output-side first inner electrode 131 and the output-side second inner electrode 141, and a voltage is output from the output-side first outer electrode 13 and the output-side second outer electrode 14.

A first node N1 in the input region 10A, where vibration displacement is minimum, lies within each of an area where the input-side first outer electrode 11 is provided and an area where the input-side second outer electrode 12 is provided. A second node N2 in the output region 10B, where vibration displacement is minimum lies within each of an area where the output-side first outer electrode 13 is provided and an area where the output-side second outer electrode 14 is provided. In mounting the piezoelectric transformer 1A, the piezoelectric transformer 1A is supported at the positions (nodal points N1 and N2) of minimum vibration displacement, thus minimizing impediment to the vibration of the piezoelectric transformer 1A. The same applies to the piezoelectric transformer 1B.

Second Embodiment

Figure 12:
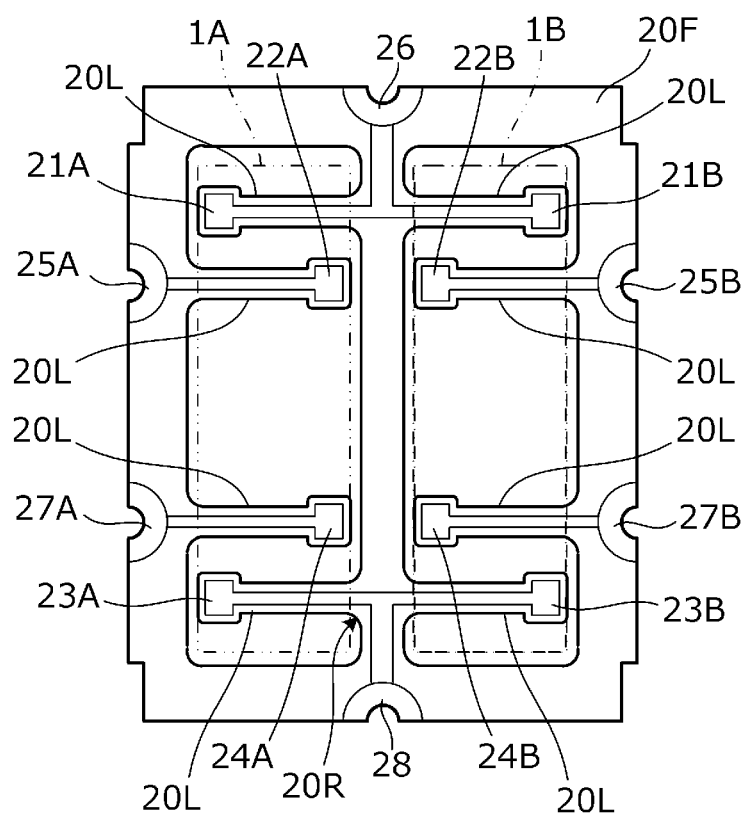
FIG. 12 is a plan view of a flexible board included in a piezoelectric transformer module according to a second exemplary embodiment.

FIG. 12 is a plan view of a flexible board included in a piezoelectric transformer module according to a second exemplary embodiment. The second embodiment differs from the first embodiment illustrated in FIG. 3 in the configuration of extended portions 20L.

The flexible board according to the second embodiment has a frame 20F in the form of a rectangular closed frame, and a plurality of extended portions 20L extended inward from the frame 20F. Element-mounting terminals 21A, 21B, 22A, 22B, 23A, 23B, 24A, and 24B are provided on the corresponding extended portions 20L. Otherwise, the second embodiment is of the same configuration as the first embodiment.

According to the second embodiment, each of the extended portions 20L is linearly extended inward from the frame 20F. Thus, in some cases, the element-mounting terminals 21A, 22A, 23A, and 24A may be connected at positions displaced from the nodes of mechanical vibration of the piezoelectric transformer 1A. Likewise, in some cases, the element-mounting terminals 21B, 22B, 23B, and 24B may be connected at positions displaced from the nodes of mechanical vibration of the piezoelectric transformer 1B. In this regard, the extended portion 20L constituting a part of the flexible board has flexibility, and hence the above-mentioned configuration is unlikely to impede the mechanical vibration of the piezoelectric transformers 1A and 1B.

The mounting structure of a piezoelectric vibration device according to each of the first and second embodiments may not necessarily have the configuration mentioned above but may be of any configuration including the features described below.

That is, such a mounting structure of a piezoelectric vibration device may be a mounting structure including a piezoelectric vibration device having a piezoelectric vibrator, a flexible board, and a case; and a wiring board to which the piezoelectric vibration device is mounted, wherein the piezoelectric vibrator has a piezoelectric element, and an outer electrode provided on a surface of the piezoelectric element, wherein the flexible board includes an element-mounting terminal to which the outer electrode of the piezoelectric vibrator is connected, and an external connection terminal that is connected to an electrode on the wiring board, wherein the case has a securing portion that secures the case to the wiring board, and a ceiling portion, wherein the securing portion defines, when the piezoelectric vibration device is mounted on the wiring board, a space between the ceiling portion and the wiring board to accommodate the piezoelectric vibrator and the flexible board, and wherein the outer electrode of the piezoelectric vibrator is connected to the element-mounting terminal of the flexible board, and the piezoelectric vibrator is suspended inside the case onto the ceiling portion of the case by using a holding member.

This configuration provides a mounting structure of a piezoelectric vibration device with which variations in characteristics are reduced and impediment to the mechanical vibration of the piezoelectric vibrator is minimized.

The following description of a third exemplary embodiment will be directed to a configuration that, for the piezoelectric transformer module according to each of the first and second embodiments, ensures insulation between the electrodes of a plurality of piezoelectric transformers while minimizing an increase in the size of the piezoelectric transformer module.

Third Embodiment

Figure 13A:
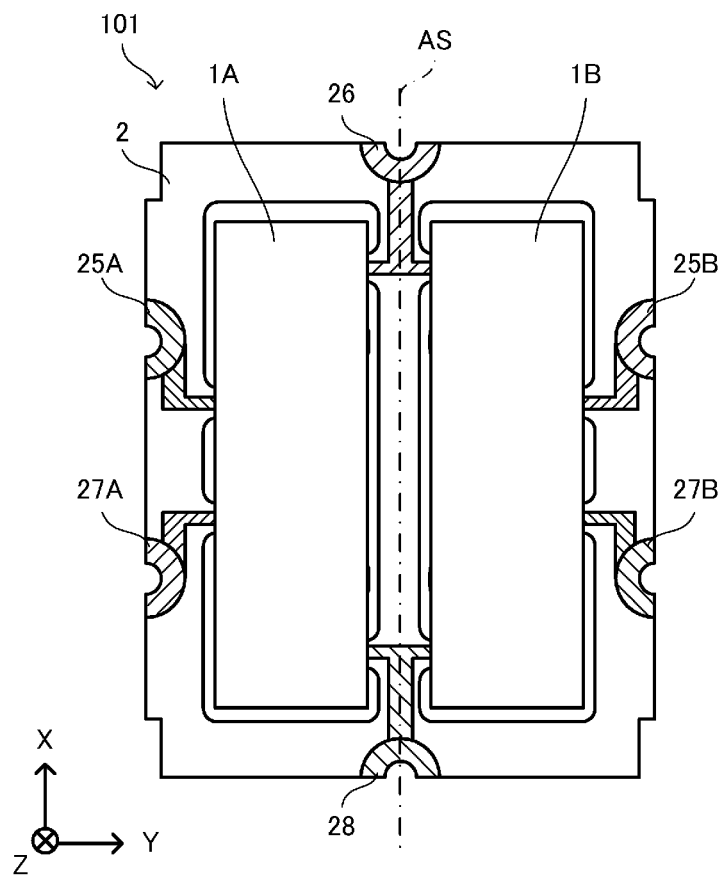
FIG. 13(A) is a plan view of a piezoelectric transformer module according to a third exemplary embodiment.
Figure 13B:
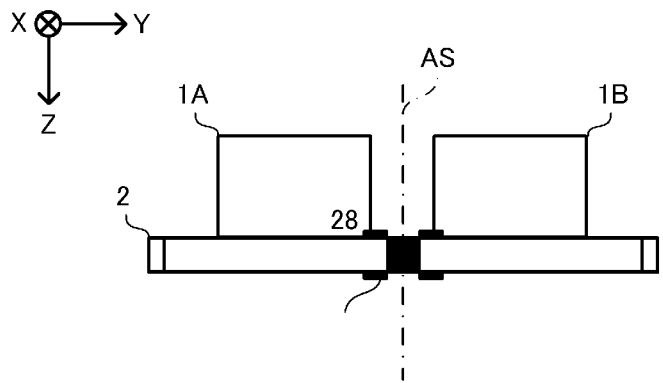
FIG. 13(B) is a front view of the piezoelectric transformer module.

FIG. 13(A) is a plan view of a piezoelectric transformer module 101 according to the third exemplary embodiment, and FIG. 13(B) is a front view of the piezoelectric transformer module 101. In this example, a case (the case 3 in FIG. 1) as a component of the piezoelectric transformer module 101 will not be depicted nor described.

The piezoelectric transformer module 101 includes piezoelectric transformers 1A and 1B, and a flexible board 2 to which the piezoelectric transformers 1A and 1B are mounted. The piezoelectric transformer 1A represents an example of "first piezoelectric transformer" according to the present disclosure, and the piezoelectric transformer 1B represents an example of "second piezoelectric transformer" according to the present disclosure.

In plan view, the flexible board 2 has a substantially rectangular principal surface with long and short sides. In the following description, the direction of the long side of the principal surface will be referred to as X-axis direction, the direction of the short side will be referred to as Y-axis direction, and the direction of the thickness of the flexible board will be referred to as Z-axis direction. In plan view of the principal surface of the flexible board 2, an axis of symmetry AS passes through the center of the flexible board 2 with respect to the Y-axis direction.

Although their detailed structure will be described later, the piezoelectric transformers 1A and 1B each have a piezoelectric element, and a plurality of outer electrodes (not illustrated) provided on the same surface of the piezoelectric element. The piezoelectric transformers 1A and 1B are mounted onto the flexible board 2 by soldering with this surface facing the flexible board 2. The piezoelectric element has a rectangular parallelepiped shape that is elongated in one direction. The piezoelectric transformers 1A and 1B are arranged in parallel along the Y-axis direction, with the longitudinal direction of their piezoelectric elements aligned with the X-axis direction. At this time, in plan view of the principal surface of the flexible board 2, the piezoelectric transformers 1A and 1B are positioned substantially line-symmetric to each other with respect to the axis of symmetry AS.

In plan view of the principal surface of the flexible board 2, the flexible board 2 is substantially line-symmetric with respect to the axis of symmetry AS. The flexible board 2 includes a plurality of element-mounting terminals (not illustrated) to which the outer electrodes of the piezoelectric transformers 1A and 1B are connected, external connection terminals 25A, 25B, 26, 27A, 27B, and 28 connected to, for example, a mother board, and a conductor pattern. The external connection terminals 25A, 25B, 26, 27A, 27B, and 28 are electrodes extending over both the front and back principal surfaces of the flexible board 2. The conductor pattern connects each element-mounting terminal with the corresponding external connection terminal 25A, 25B, 26, 27A, 27B, or 28.

The external connection terminals 25A, 25B, 27A, and 27B are located at the edges along the X-axis of the flexible board 2. In plan view of the principal surface of the flexible board 2, the external connection terminals 25A and 27A, and the external connection terminals 25B and 27B are substantially line-symmetric to each other with respect to the axis of symmetry AS. The external connection terminals 26 and 28, which lie on the axis of symmetry AS, are disposed at the edges along the Y-axis of the flexible board 2, and located opposite to each other with respect to the X-axis direction.

The external connection terminal 26 represents an example of "first outer terminal electrode" according to the present disclosure. The external connection terminal 28 represents an example of "second outer terminal electrode" according to the present disclosure.

In the piezoelectric transformer module 101 according to the third embodiment, the external connection terminals 25A, 25B, and 26 serve as input-side (primary side) terminals of the piezoelectric transformer module 101, and the external connection terminals 27A, 27B, and 28 serve as output-side (secondary side) terminals. The piezoelectric transformer module 101 steps down the voltage input from the external connection terminal 25A, 25B, or 26, and outputs the resulting voltage from the external connection terminal 27A, 27B, or 28.

The external connection terminals 25A and 25B are connected to a reference potential on the primary side, and the external connection terminals 27A and 27B are connected to a reference potential on the secondary side. The external connection terminal 26 is connected to the output portion of a power supply or some other component, and the external connection terminal 28 is connected to a load. That is, the external connection terminals 25A, 27A, 25B, and 27B are electrodes that differ in polarity from the external connection terminals 26 and 28.

Figure 14A:
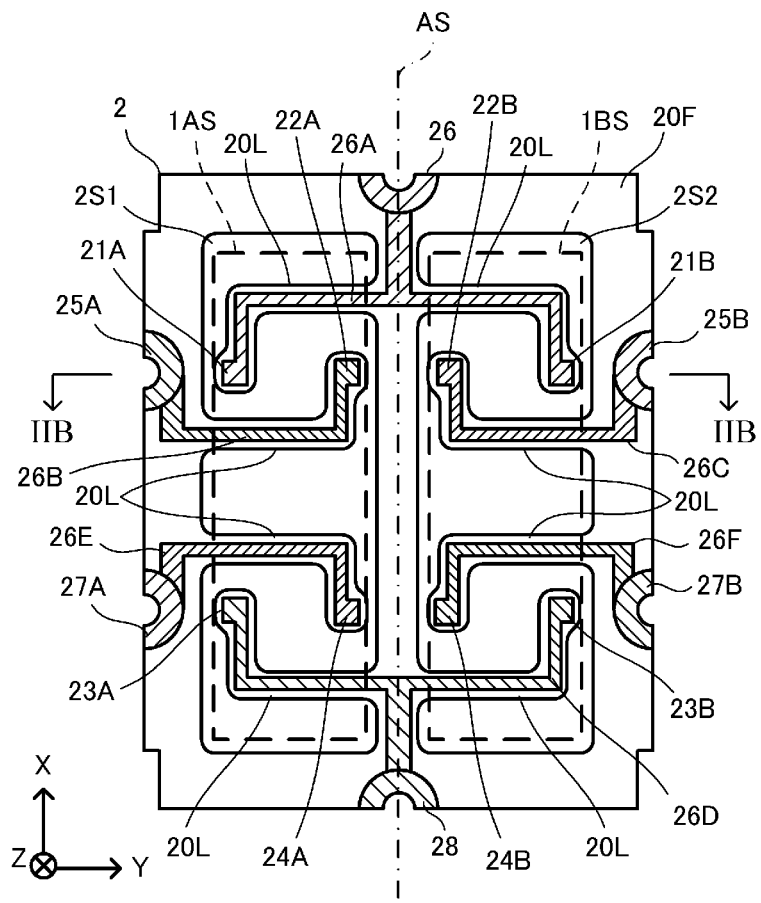
FIG. 14(A) is a plan view of a flexible board.
Figure 14B:
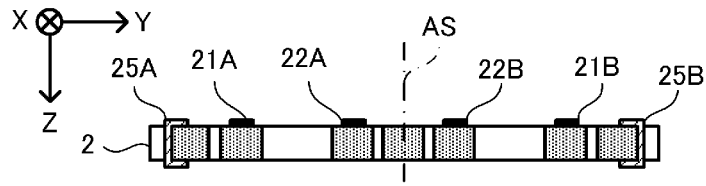
FIG. 14(B) is a cross-sectional view taken along a line IIB-IIB of FIG. 14(A).

FIG. 14(A) is a plan view of the flexible board 2, and FIG. 14(B) is a cross-sectional view taken along a line IIB-IIB of FIG. 14(A). As described above, in plan view of the principal surface of the flexible board 2, the flexible board 2 is substantially line-symmetric with respect to the axis of symmetry AS.

The flexible board 2 has a frame 20F. In plan view of the principal surface of the flexible board 2, the frame 20F defines spaces 2S1 and 2S2 that are substantially line-symmetric to each other with respect to the axis of symmetry AS. A mounting region 1AS on which to mount the piezoelectric transformer 1A is defined in the space 2S1, and a mounting region 1BS on which to mount the piezoelectric transformer 1B is defined in the space 2S2.

The mounting region 1AS represents an example of "first mounting region" according to the present disclosure. The mounting region 1BS represents an example of "second mounting region" according to the present disclosure.

The flexible board 2 has a plurality of extended portions 20L extended into the spaces 2S1 and 2S2 from the frame 20F. In plan view of the principal surface of the flexible board 2, the extended portions 20L within the mounting region 1AS, and the extended portions 20L within the mounting region 1BS are substantially line-symmetric to each other with respect to the axis of symmetry AS.

Element-mounting terminals 21A, 22A, 23A, 24A, 21B, 22B, 23B, and 24B for connection with the corresponding outer electrodes of the piezoelectric transformers 1A and 1B are located at the distal end portions of the corresponding extended portions 20L. That is, the element-mounting terminals 21A, 22A, 23A, 24A, 21B, 22B, 23B, and 24B are located at positions that allow mechanical vibration of the flexible board 2. This configuration ensures that vibration of the piezoelectric transformers 1A and 1B is not impeded when the piezoelectric transformers 1A and 1B are mounted on the flexible board 2.

The element-mounting terminals 21A, 22A, 23A, and 24A, which are located within the mounting region 1AS, are terminals to which the corresponding outer electrodes of the piezoelectric transformer 1A are connected. The element-mounting terminals 21B, 22B, 23B, and 24B, which are located within the mounting region 1BS, are terminals to which the corresponding outer electrodes of the piezoelectric transformer 1B are connected. In plan view of the principal surface of the flexible board 2, the element-mounting terminals 21A, 22A, 23A, and 24A in the mounting region 1AS, and the element-mounting terminals 21B, 22B, 23B, and 24B in the mounting region 1BS are substantially line-symmetric to each other with respect to the axis of symmetry AS.

Specifically, the element-mounting terminals 21A, 22A, 22B, and 21B are disposed in this order on the same straight line extending along the Y-axis. In plan view of the principal surface of the flexible board 2, the element-mounting terminals 21A and 21B are located at positions that are substantially line-symmetric to each other with respect to the axis of symmetry AS, and the element-mounting terminals 22A and 22B are located at positions that are substantially line-symmetric to each other with respect to the axis of symmetry AS.

Likewise, the element-mounting terminals 23A, 24A, 24B, and 23B are disposed in this order on the same straight line extending along the Y-axis. In plan view of the principal surface of the flexible board 2, the element-mounting terminals 23A and 23B are located at positions that are substantially line-symmetric to each other with respect to the axis of symmetry AS, and the element-mounting terminals 24A and 24B are located at positions that are substantially line-symmetric to each other with respect to the axis of symmetry AS.

The element-mounting terminal 21A represents an example of "first mounting electrode" according to the present disclosure. The element-mounting terminal 22A represents an example of "second mounting electrode" according to the present disclosure. The element-mounting terminals 23A and 24A each represent an example of "third mounting electrode" according to the present disclosure. The element-mounting terminal 21B represents an example of "fourth mounting electrode" according to the present disclosure. The element-mounting terminal 22B represents an example of "fifth mounting electrode" according to the present disclosure. The element-mounting terminals 23B and 24B each represent an example of "sixth mounting electrode" according to the present disclosure.

The element-mounting terminals 21A, 22A, 23A, 24A, 21B, 22B, 23B, and 24B are connected to the external connection terminals 25A, 25B, 26, 27A, 27B, and 28 by conductor patterns provided in the corresponding extended portions 20L.

More specifically, the element-mounting terminals 21A and 21B are connected to the external connection terminal 26 by a common conductor pattern 26A. The element-mounting terminal 22A is connected to the external connection terminal 25A by a conductor pattern 26B. The element-mounting terminal 22B is connected to the external connection terminal 25B by a conductor pattern 26C.

The element-mounting terminals 23A and 23B are connected to the external connection terminal 28 by a common conductor pattern 26D. The element-mounting terminal 24A is connected to the external connection terminal 27A by a conductor pattern 26E. The element-mounting terminal 24B is connected to the external connection terminal 27B by a conductor pattern 26F.

The conductor pattern 26A represents an example of "first conductor pattern" according to the present disclosure. The conductor pattern 26D represents an example of "second conductor pattern" according to the present disclosure.

The conductor patterns 26A to 26F, which are located in the same layer of the flexible board 2 without crossing each other, are each covered by an insulating film (not illustrated). Since the conductor patterns 26A to 26F are located in the same layer, the conductor patterns 26A to 26F do not cross each other. This facilitates formation of the conductor patterns 26A to 26F.

As described above, on the input side, the external connection terminals 25A and 25B differ in polarity from the external connection terminal 26. Consequently, the element-mounting terminals 21A and 21B connected to the external connection terminal 26 also differ in polarity from the element-mounting terminals 22A and 22B connected to the external connection terminals 25A and 25B. In the third embodiment, on the straight line along the Y-axis, the element-mounting terminals 22A and 22B are located in the inner side portion, and the element-mounting terminals 21A and 21B are located in the outer side portion. Although the element-mounting terminals 22A and 22B are disposed in close proximity to each other, the two terminals are of the same polarity, and hence insulation between the element-mounting terminals 22A and 22B is not required. This eliminates the need to space the element-mounting terminals 22A and 22B away from each other.

Likewise, on the output side, the external connection terminals 27A and 27B differ in polarity from the external connection terminal 28. Consequently, the element-mounting terminals 23A and 23B connected to the external connection terminal 28 also differ in polarity from the element-mounting terminals 24A and 24B connected to the external connection terminals 27A and 27B. In the third embodiment, on the straight line along the Y-axis, the element-mounting terminals 24A and 24B are located in the inner side portion, and the element-mounting terminals 23A and 23B are located in the outer side portion. Although the element-mounting terminals 24A and 24B are disposed in close proximity to each other, the two terminals are of the same polarity, and hence insulation between the element-mounting terminals 24A and 24B is not required. This eliminates the need to space the element-mounting terminals 24A and 24B away from each other.

As described above, the element-mounting terminals 22A and 22B have the same polarity and thus can be disposed in close proximity to each other, and the element-mounting terminals 24A and 24B have the same polarity and thus can be disposed in close proximity to each other. This ensures that electrodes of opposite polarities are not disposed in close proximity to each other, thus eliminating the need to space the mounting regions 1AS and 1BS away from each other to ensure insulation between the two mounting regions. This helps to minimize an increase in the size of the flexible board 2.

The element-mounting terminals 21A, 22A, 23A, and 24A are each located at a nodal point of the piezoelectric transformer 1A to be mounted. The element-mounting terminals 21B, 22B, 23B, and 24B are each located at a nodal point of the piezoelectric transformer 1B to be mounted. Accordingly, the flexible board 2 supports the piezoelectric transformers 1A and 1B at such nodal points. This ensures that vibration of the piezoelectric transformers 1A and 1B is not impeded.

Figure 15:
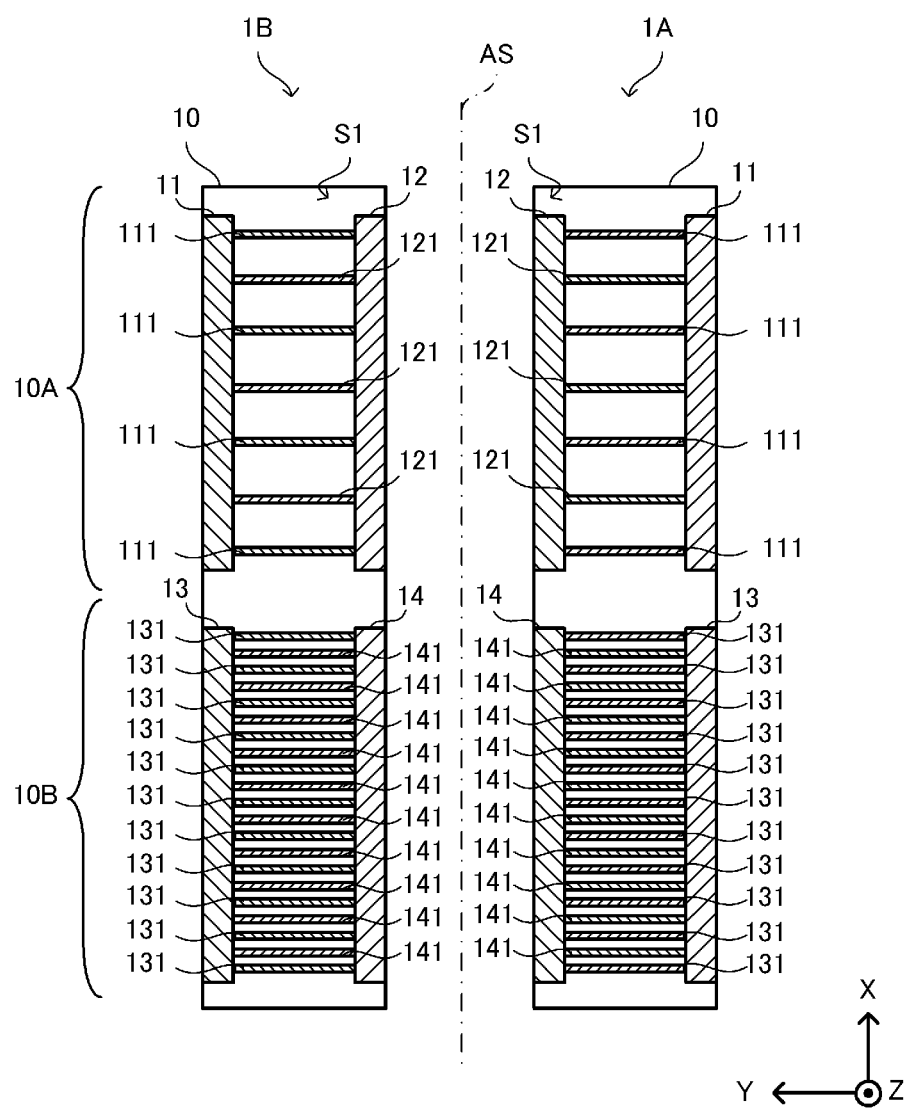
FIG. 15 is a plan view of piezoelectric transformers.

FIG. 15 is a plan view of the piezoelectric transformers 1A and 1B. FIG. 15 is a plan view of the piezoelectric transformers 1A and 1B as seen from the first surface S1, and is a see-through representation of their internal structure. The first surface S1 represents a mounting surface that is mounted onto the flexible board 2.

In plan view of the principal surface of the flexible board 2, when mounted on the flexible board 2, the piezoelectric transformers 1A and 1B are positioned substantially line-symmetric to each other with respect to the axis of symmetry AS. In the following, the piezoelectric transformer 1A will be described.

The piezoelectric transformer 1A has a piezoelectric element 10 having a rectangular parallelepiped shape that is elongated in one direction. The piezoelectric element 10 is formed as, for example, a laminate of PZT ceramic sheets. The piezoelectric element 10 has an input region (primary side) 10A and an output region (secondary side) 10B that are provided in the longitudinal direction.

Outer electrodes 11, 12, 13, and 14 are provided along two opposite sides of the first surface S1 of the piezoelectric element 10. The outer electrode 11, which is an input-side outer electrode located in the input region 10A, represents an example of "primary-side first outer electrode" according to the present disclosure. The outer electrode 12, which is an input-side outer electrode located in the input region 10A, represents an example of "primary-side second outer electrode" according to the present disclosure. The outer electrodes 13 and 14, which are output-side outer electrodes located in the output region 10B, each represent an example of "secondary-side outer electrode" according to the present disclosure.

The outer electrodes 11 and 12 are each located at a position in the input region 10A that includes a nodal point where vibration displacement is minimum. The outer electrodes 13 and 14 are each located at a position in the output region 10B that includes a nodal point where vibration displacement is minimum.

The outer electrodes 11, 12, 13, and 14 are in the shape of a rectangle having a surface with short and long sides. The outer electrodes 11, 12, 13, and 14 are disposed on the first surface S1 of the piezoelectric element 10 such that their long side is aligned with the X-axis direction and their short side is aligned with the Y-axis direction.

A plurality of inner electrodes 111, and a plurality of inner electrodes 121 are provided in the input region 10A. The inner electrodes 111 and 121 have a principal surface, and are respectively in electrical continuity with the outer electrodes 11 and 12. The inner electrodes 111 and 121 are disposed alternately in the X-axis direction such that the normals to their respective principal surfaces are aligned with the X-axis direction.

A plurality of inner electrodes 131, and a plurality of inner electrodes 141 are provided in the output region 10B. The inner electrodes 131 and 141 have a principal surface, and are respectively in electrical continuity with the outer electrodes 13 and 14. The inner electrodes 131 and 141 are disposed alternately in the X-axis direction such that the normals to their respective principal surfaces are aligned with the X-axis direction.

As described above, the piezoelectric transformer 1B is substantially line-symmetric to the piezoelectric transformer 1A with respect to the axis of symmetry AS. That is, the polarities of the individual electrodes of the piezoelectric transformer 1B are substantially in mirror symmetry to those of the piezoelectric transformer 1A about the axis of symmetry AS. Otherwise, the piezoelectric transformer 1B is of the same configuration as the piezoelectric transformer 1A.

Figure 16:
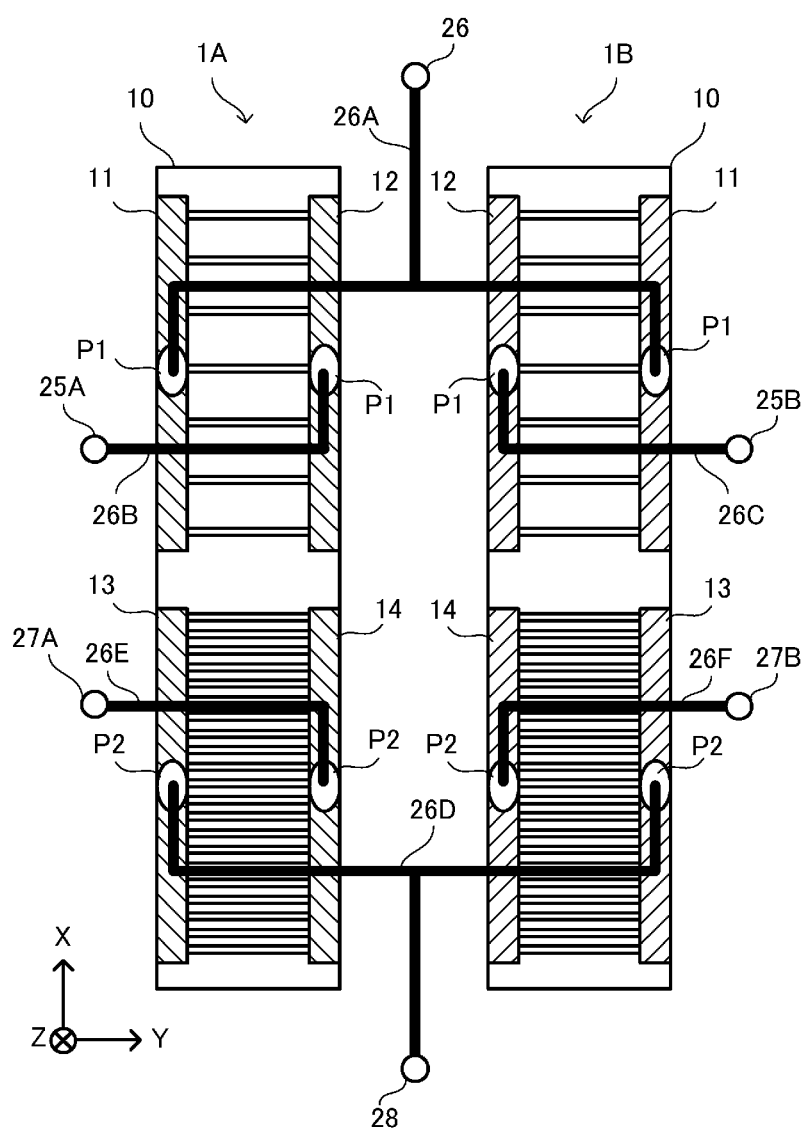
FIG. 16 is an illustration for explaining the wiring arrangement when piezoelectric transformers are mounted on a flexible board.

The piezoelectric transformers 1A and 1B are wired to the flexible board 2 when respectively mounted on the mounting regions 1AS and 1BS of the flexible board 2. FIG. 16 is an illustration for explaining the wiring arrangement when the piezoelectric transformers 1A and 1B are mounted on the flexible board 2.

As described above, the respective outer electrodes 11 and 12 of the piezoelectric transformers 1A and 1B are each located at a position in the input region 10A that includes a nodal point P1, and the respective outer electrodes 13 and 14 of the piezoelectric transformers 1A and 1B are each located at a position in the output region 10B that includes a nodal point P2. The piezoelectric transformers 1A and 1B are supported and wired onto the flexible board 2 by being soldered to the flexible board 2 at the nodal points P1 and P2 where vibration displacement is minimum. This ensures that the vibration of the piezoelectric transformers 1A and 1B is not impeded, and also prevents a decrease in the reliability of connection caused by displacement of the piezoelectric element 10 after the piezoelectric transformers 1A and 1B are mounted.

In mounting the piezoelectric transformers 1A and 1B to the flexible board 2, the outer electrode 11 of the piezoelectric transformer 1A and the element-mounting terminal 21A (see FIG. 2) are soldered to each other, and the outer electrode 11 of the piezoelectric transformer 1B and the element-mounting terminal 21B are soldered to each other. Since the element-mounting terminals 21A and 21B are connected to the external connection terminal 26 by the conductor pattern 26A, the respective outer electrodes 11 of the piezoelectric transformers 1A and 1B are connected to the external connection terminal 26 via the conductor pattern 26A.

The outer electrode 12 of the piezoelectric transformer 1A is soldered to the element-mounting terminal 22A, and connected to the external connection terminal 25A via the conductor pattern 26B. The outer electrode 12 of the piezoelectric transformer 1B is soldered to the element-mounting terminal 22B, and connected to the external connection terminal 25B via the conductor pattern 26C.

The outer electrode 13 of the piezoelectric transformer 1A is soldered to the element-mounting terminal 23A, and the outer electrode 13 of the piezoelectric transformer 1B is soldered to the element-mounting terminal 23B. The respective outer electrodes 13 of the piezoelectric transformers 1A and 1B are connected to the external connection terminal 28 via the conductor pattern 26D.

The outer electrode 14 of the piezoelectric transformer 1A is soldered to the element-mounting terminal 24A, and connected to the external connection terminal 27A via the conductor pattern 26E. The outer electrode 14 of the piezoelectric transformer 1B is soldered to the element-mounting terminal 24B, and connected to the external connection terminal 27B via the conductor pattern 26F.

The piezoelectric transformers 1A and 1B are mounted on the flexible board 2 as described above. As a result, the piezoelectric transformers 1A and 1B are connected in parallel in the piezoelectric transformer module 101. The parallel connection of the piezoelectric transformers 1A and 1B ensures high output from the piezoelectric transformer module 101. Further, the piezoelectric transformer module 101 configured as described above can be used as a circuit with a low output impedance (large output current capacity) on the secondary side.

Since the external connection terminals 25A and 25B are each connected to the reference potential, the outer electrode 12 of the piezoelectric transformer 1A, and the outer electrode 12 of the piezoelectric transformer 1B are of the same polarity. Likewise, the outer electrode 14 of the piezoelectric transformer 1A, and the outer electrode 14 of the piezoelectric transformer 1B are of the same polarity. When the two piezoelectric transformers 1A and 1B are arranged in place, two adjacent outer electrodes 11 have the same polarity, and two adjacent outer electrodes 14 have the same polarity. This eliminates the need to space the mounting regions 1AS and 1BS away from each other to ensure insulation between the two mounting regions, thus minimizing an increase in the size of the piezoelectric transformer module 101.

Since two piezoelectric transformers 1A and 1B are mounted on the flexible board 2, the number of input/output terminals can be reduced from eight, which is the sum of the numbers of input/output terminals on the two piezoelectric transformers 1A and 1B, to six, which is the total number of input/output terminals on the flexible board 2. This facilitates operations such as soldering and wiring performed in mounting the piezoelectric transformer module 101 to a mother board or other components, for example.

Although the configuration of the flexible board 2 illustrated in FIG. 14 is such that the extended portions 20L are also substantially line-symmetric with respect to the axis of symmetry AS in plan view of the principal surface of the flexible board 2, the extended portions 20L may not necessarily be line-symmetric. For example, the respective extended portions 20L of the mounting regions 1AS and 1BS may be made asymmetric to enhance their visibility to thereby ensure easy recognition of, for example, the orientation in which the piezoelectric transformers 1A and 1B are mounted.

Hereinafter, a method for manufacturing the piezoelectric transformers 1A and 1B will be described.

Figure 17:
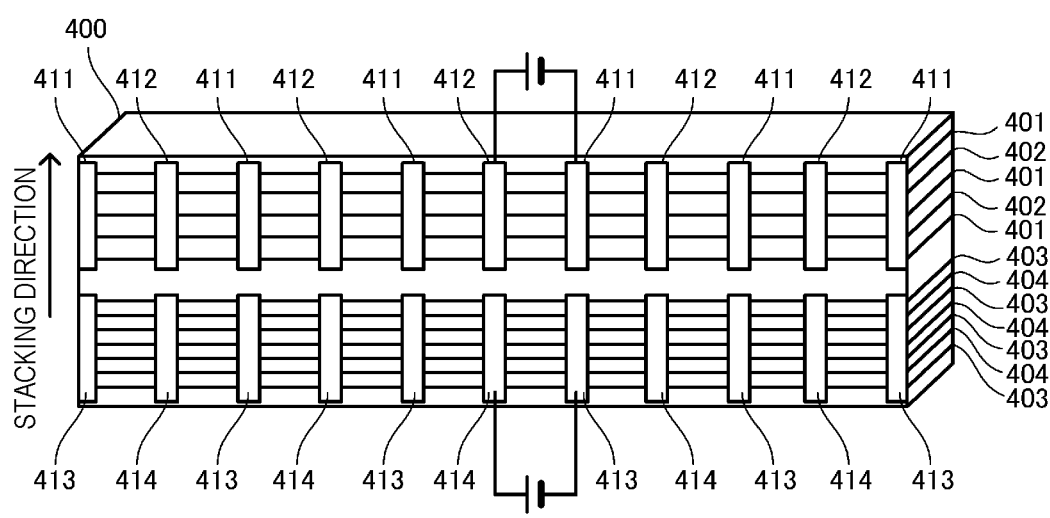
FIG. 17 is an illustration for explaining a method for manufacturing piezoelectric transformers.
Figure 18:
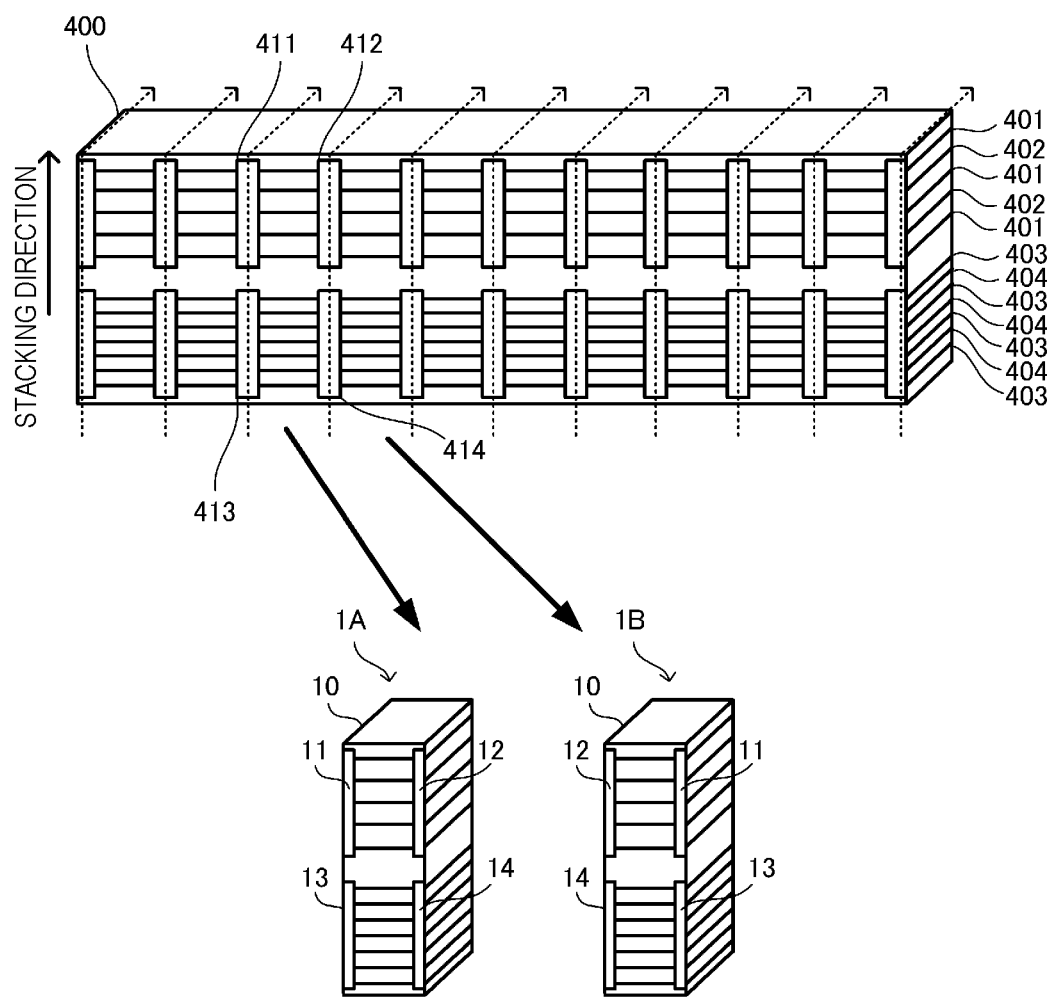
FIG. 18 is an illustration for explaining a method for manufacturing piezoelectric transformers.

FIGS. 17 and 18 are illustrations for explaining a method for manufacturing the piezoelectric transformers 1A and 1B.

First, a plurality of piezoelectric ceramic green sheets and a plurality of inner electrodes 401, 402, 403, and 404 are stacked, followed by sintering the resulting stack to form a ceramic body 400. The inner electrodes 401 and 402 are alternately stacked in an upper portion (upper side in FIGS. 17 and 18) in the stacking direction of the ceramic body 400. The inner electrodes 403 and 404 are alternately stacked in a lower portion (lower side in FIGS. 17 and 18) in the stacking direction of the ceramic body 400. In the third embodiment, it is assumed that the upper portion in the stacking direction of the ceramic body 400 represents the side of the piezoelectric transformer that becomes the high voltage side after its manufacture, and the lower portion in the stacking direction represents the side of the piezoelectric transformer that becomes the low voltage side after its manufacture. Accordingly, the inner electrodes 401 and 402 represent the high voltage-side of the piezoelectric transformer and are stacked with a relatively long distance between the electrodes to reduce capacitance, and the inner electrodes 403 and 404 represent the low voltage side of the piezoelectric transformer and are stacked with a relatively short distance between the electrodes to increase capacitance.

Next, outer electrodes 411, 412, 413, and 414 are formed on one surface of the ceramic body 400. The outer electrodes 411, 412, 413, and 414, which are in the shape of a rectangle having a surface with long and short sides, are formed with their long side aligned with the stacking direction of the ceramic body 400.

The outer electrodes 411 and 412 are disposed alternately along a direction orthogonal to the stacking direction such that the outer electrodes 411 and 412 overlap the inner electrodes 401 and 402. At this time, the outer electrodes 411 and 412 are formed such that the outer electrode 411 is electrically continuous with the inner electrode 401, and the outer electrode 412 is electrically continuous with the inner electrode 402.

The outer electrodes 413 and 414 are disposed alternately along a direction orthogonal to the stacking direction such that the outer electrodes 413 and 414 overlap the inner electrodes 403 and 404. At this time, the outer electrodes 413 and 414 are formed such that the outer electrode 413 is electrically continuous with the inner electrode 403, and the outer electrode 414 is electrically continuous with the inner electrode 404.

Next, voltage is applied on the outer electrodes 411 and 412, and voltage is applied on the outer electrodes 413 and 414, thus polarizing the ceramic body 400. At this time, for the plurality of outer electrodes 411, for example, voltage may be applied to only one of the outer electrodes 411. This is due to the following reason: since each one outer electrode 411 is electrically continuous with the other outer electrodes 411, applying voltage to one outer electrode 411 is equivalent to applying voltage to the other outer electrodes 411 via the inner electrodes 401.

After polarization, the ceramic body 400 is split in a direction perpendicular to the one surface on which the outer electrodes are provided. At this time, the ceramic body 400 is split so as to divide each of the outer electrodes 411, 412, 413, and 414 in two. The two divided parts of the outer electrode 411 serve as the respective outer electrodes 11 of the piezoelectric transformers 1A and 1B. Likewise, the outer electrodes 412, 413, and 414 respectively serve as the outer electrodes 12, 13, and 14 of the piezoelectric transformers 1A and 1B. The inner electrodes 401, 402, 403, and 404 respectively serve as the inner electrodes 111, 121, 131, and 141 of the piezoelectric transformers 1A and 1B.

Thus, each two adjoining pieces into which the ceramic body 400 is split serve as the piezoelectric transformers 1A and 1B. The above-mentioned manufacturing method enables a plurality of piezoelectric transformers 1A and a plurality of piezoelectric transformers 1B to be manufactured simultaneously by a single manufacturing process. Further, the outer electrodes are divided in two, thus allowing the outer electrodes to be formed to extend to the very edges of the first surface S1 of the piezoelectric element 10.

Although the foregoing description of the third embodiment is directed to a case in which the piezoelectric transformers 1A and 1B each have four input/output terminals, the piezoelectric transformers 1A and 1B may each have three input/output terminals.

Figure 19:
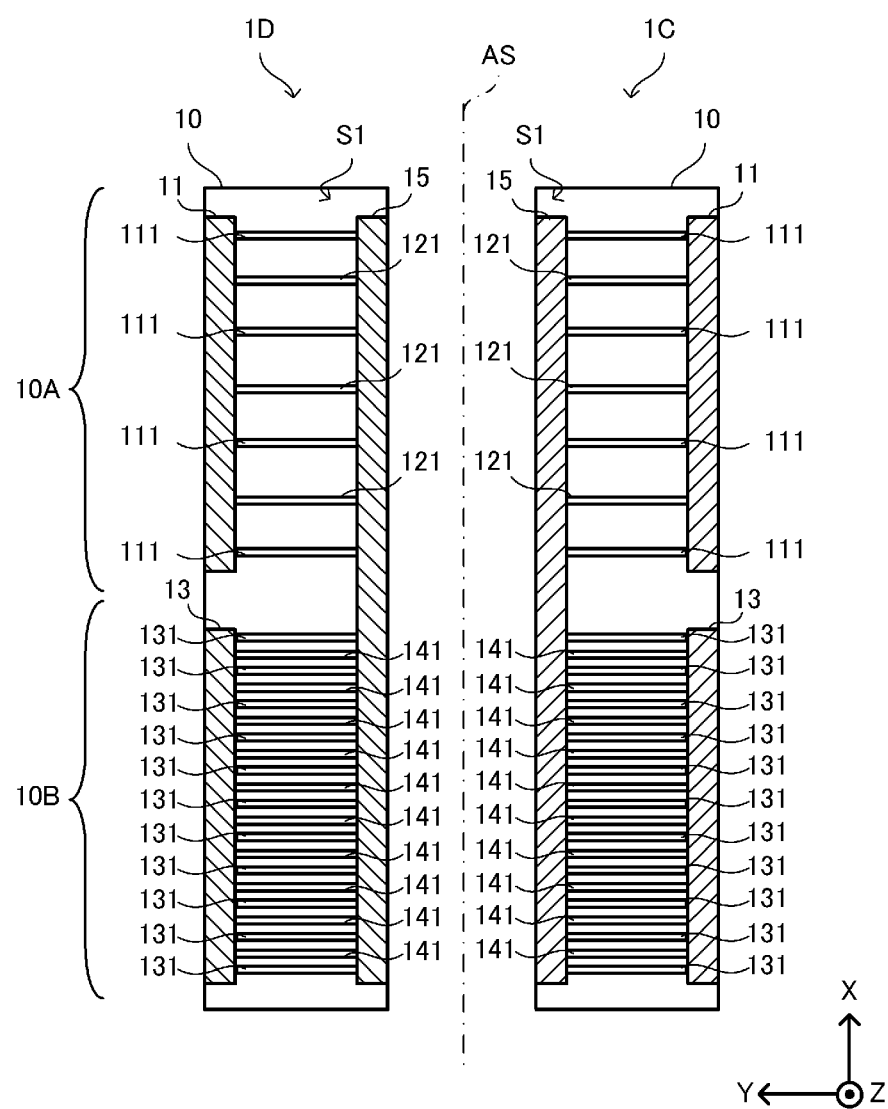
FIG. 19 is a plan view of piezoelectric transformers each having three input/output terminals.

FIG. 19 is a plan view of piezoelectric transformers 1C and 1D each having three input/output terminals.

The piezoelectric transformers 1C and 1D in this example are configured such that the input region 10A and the output region 10B are connected to a common reference potential. For the piezoelectric transformers 1C and 1D, the outer electrodes 12 and 14 of the piezoelectric transformers 1A and 1B illustrated in FIG. 15 are formed as a single outer electrode 15. In this case, each of the piezoelectric transformers 1C and 1D has three input/output terminals including the outer electrodes 11, 13, and 15.

In this example, the outer electrode 11 represents an example of "primary-side first outer electrode" according to the present disclosure. The outer electrode 15 represents an example of "primary-side second outer electrode" according to the present disclosure. The outer electrode 13 represents an example of "secondary-side outer electrode" according to the present disclosure.

Figure 20:
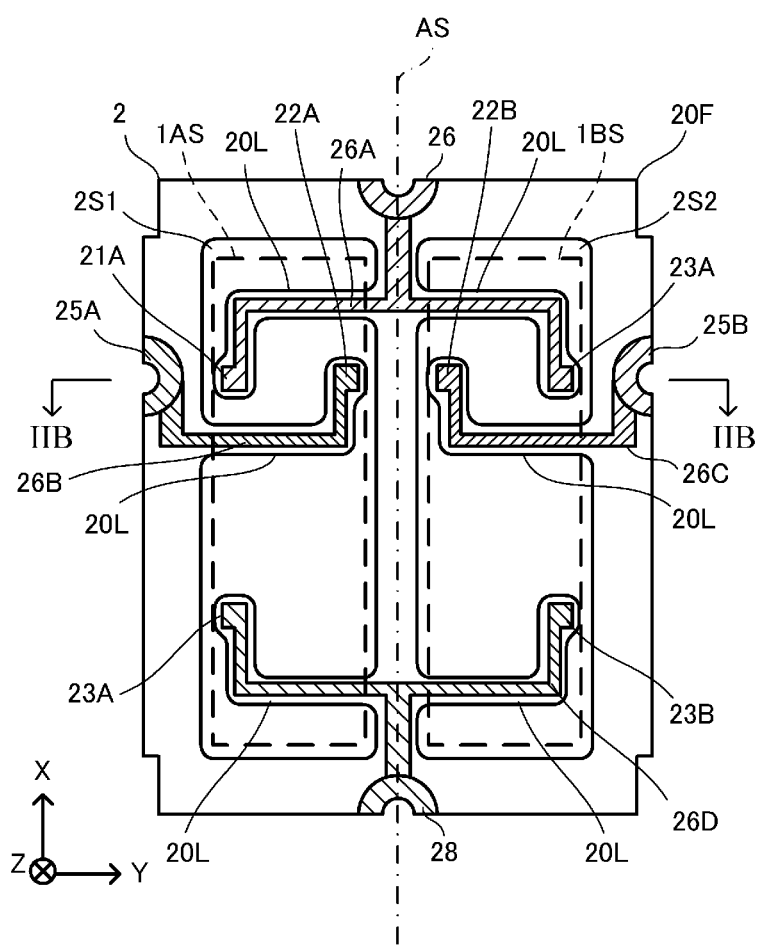
FIG. 20 is a plan view of a flexible board to which the piezoelectric transformers illustrated in FIG. 19 are mounted.

FIG. 20 is a plan view of the flexible board 2 to which the piezoelectric transformers 1C and 1D illustrated in FIG. 19 are mounted.

The flexible board 2 in this example does not include the following components illustrated in FIG. 14: the external connection terminals 27A and 27B, the conductor patterns 26E and 26F, the extended portions 20L where the conductor patterns 26E and 26F are provided, and the element-mounting terminals 24A and 24B.

In this example, the element-mounting terminal 21A represents an example of "first mounting electrode" according to the present disclosure. The element-mounting terminal 22A represents an example of "second mounting electrode" according to the present disclosure. The element-mounting terminal 23A represents an example of "third mounting electrode" according to the present disclosure. The element-mounting terminal 21B represents an example of "fourth mounting electrode" according to the present disclosure. The element-mounting terminal 22B represents an example of "fifth mounting electrode" according to the present disclosure. The element-mounting terminal 23B represents an example of "sixth mounting electrode" according to the present disclosure.

This configuration also ensures that two adjacent element-mounting terminals 22A and 22B have the same polarity, and two adjacent outer electrodes 11 and two adjacent outer electrodes 15 have the same polarity. This eliminates the need to space the mounting regions 1AS and 1BS away from each other to ensure insulation between the two mounting regions, thus minimizing an increase in the size of the piezoelectric transformer module.

Such a piezoelectric transformer with three input/output terminals may be a Rosen-type piezoelectric transformer. The plurality of outer electrodes of the piezoelectric transformer may be provided on different surfaces of the piezoelectric body, for example, on both lateral surfaces of the piezoelectric body.

The piezoelectric transformer module according to the third embodiment, and the manufacturing method for the piezoelectric transformer module are not limited to those described above. It suffices that the piezoelectric transformer module and its manufacturing method have the following features.

(Feature 1)

A piezoelectric transformer module including: a first piezoelectric transformer; a second first piezoelectric transformer; and a circuit board to which the first piezoelectric transformer and the second piezoelectric transformer are mounted, wherein the circuit board includes a first mounting region to which the first piezoelectric transformer is mounted, and a second mounting region to which the second piezoelectric transformer is mounted, the first mounting region and the second mounting region being located on opposite sides of an axis of symmetry, wherein the first piezoelectric transformer and the second piezoelectric transformer each have, on a surface of a piezoelectric body, a primary-side first outer electrode, a primary-side second outer electrode, and a secondary-side outer electrode, and the first piezoelectric transformer and the second piezoelectric transformer are mounted to the circuit board such that the primary-side first outer electrode, the primary-side second outer electrode, and the secondary-side outer electrode of the first piezoelectric transformer and the primary-side first outer electrode, the primary-side second outer electrode, and the secondary-side outer electrode of the second piezoelectric transformer are positioned line-symmetric to each other with respect to the axis of symmetry, wherein the circuit board includes a first mounting electrode to which the primary-side first outer electrode of the first piezoelectric transformer is connected, a second mounting electrode to which the primary-side second outer electrode of the first piezoelectric transformer is connected, a third mounting electrode to which the secondary-side outer electrode of the first piezoelectric transformer is connected, a fourth mounting electrode to which the primary-side first outer electrode of the second piezoelectric transformer is connected, a fifth mounting electrode to which the primary-side second outer electrode of the second piezoelectric transformer is connected, and a sixth mounting electrode to which the secondary-side outer electrode of the second piezoelectric transformer is connected, wherein the first mounting electrode and the fourth mounting electrode are line-symmetric to each other with respect to the axis of symmetry, wherein the second mounting electrode and the fifth mounting electrode are line-symmetric to each other with respect to the axis of symmetry, and wherein the third mounting electrode and the sixth mounting electrode are line-symmetric to each other with respect to the axis of symmetry.

(Feature 2)

The piezoelectric transformer module according to Feature 1, wherein the circuit board includes a first conductor pattern that connects the first mounting electrode and the fourth mounting electrode to each other.

(Feature 3)

The piezoelectric transformer module according to Feature 2, wherein the circuit board includes a first outer terminal electrode, and wherein the first conductor pattern is connected to the first outer terminal electrode.

(Feature 4)

The piezoelectric transformer module according to any one of Features 1 to 3, wherein the circuit board includes a second conductor pattern that connects the third mounting electrode and the sixth mounting electrode to each other.

(Feature 5)

The piezoelectric transformer module according to Feature 4, wherein the second conductor pattern includes a second outer terminal electrode, and wherein the second conductor pattern is connected to the second outer terminal electrode.

(Feature 6)

The piezoelectric transformer module according to any one of Features 1 to 5, wherein the circuit board includes a plurality of conductor patterns, and wherein the conductor patterns are located in one layer of the circuit board.

(Feature 7)

A method for manufacturing the piezoelectric transformer module according to any one of Features 1 to 6, the method including: forming, on one surface of a ceramic body extending parallel to a stacking direction of the ceramic body formed by stacking and sintering a plurality of ceramic green sheets and a plurality of inner electrodes, an outer electrode that is connected to each of the inner electrodes; polarizing the ceramic body by applying a voltage to the outer electrode; and forming a plurality of piezoelectric transformers by splitting the polarized ceramic body in a direction perpendicular to the one surface.

Fourth to sixth embodiments described below differ from the first and second embodiments in the number of piezoelectric transformers and in the configuration of a flexible board. The following description of the fourth to sixth embodiments will be directed to a flexible board on which to mount a piezoelectric vibrator that ensures springiness of a support portion that supports the piezoelectric vibrator to thereby minimize degradation of characteristics resulting from impeded vibration mechanical vibration of the piezoelectric vibrator, and a piezoelectric vibration device including the flexible board.

Fourth Embodiment

Figure 21:
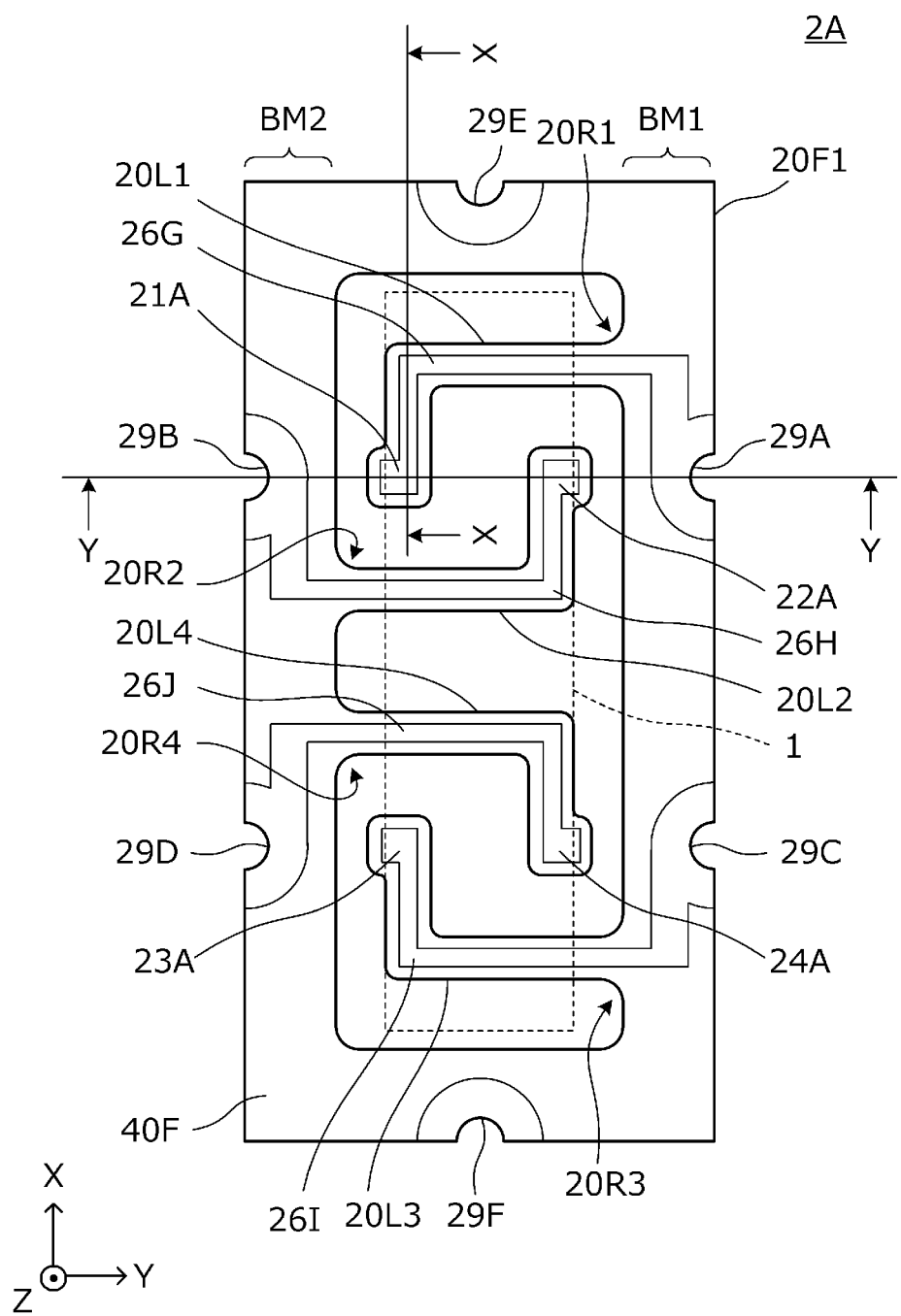
FIG. 21 is a plan view of a flexible board according to a fourth embodiment.

FIG. 21 is a plan view of a flexible board 2A according to a fourth exemplary embodiment. A piezoelectric transformer 1 is mounted onto the flexible board 2A. In FIG. 21, the piezoelectric transformer 1 is depicted only by its contours. The piezoelectric transformer 1 represents an example of "piezoelectric vibrator" according to the present disclosure.

The flexible board 2A includes a frame (support structure) 20F1, and an input-side first extended portion 20L1 and an input-side second extended portion 20L2 that are extended inward from the frame 20F1. The frame 20F1 has a first support portion BM1 and a second support portion BM2 that are parallel to each other. The input-side first extended portion 20L1 extends from the first support portion BM1 toward the second support portion BM2 while bending in an L-shape, and the input-side second extended portion 20L2 extends from the second support portion BM2 toward the first support portion BM1 while bending in an L-shape.

The input-side first extended portion 20L1 is provided with an input-side first element-mounting terminal 21A, and the input-side second extended portion 20L2 is provided with an input-side second element-mounting terminal 22A. An input-side first external connection terminal 29A and an input-side second external connection terminal 29B are disposed at a peripheral portion of the frame 20F1. The input-side first extended portion 20L1 is also provided with an input-side first conductor pattern 26G that electrically connects the input-side first element-mounting terminal 21A and the input-side first external connection terminal 29A to each other. Likewise, the input-side second extended portion 20L2 is provided with an input-side second conductor pattern 26H that electrically connects the input-side second element-mounting terminal 22A and the input-side second external connection terminal 29B to each other.

An input-side first basal portion 20R1 of the input-side first extended portion 20L1 connected to the frame 20F1 is located closer to the input-side second element-mounting terminal 22A than to the input-side first element-mounting terminal 21A. An input-side second basal portion 20R2 of the input-side second extended portion 20L2 connected to the frame 20F1 is located closer to the input-side first element-mounting terminal 21A than to the input-side second element-mounting terminal 22A.

The above-mentioned piezoelectric-vibrator connection structure including the first extended portion 20L1, the second extended portion 20L2, the first element-mounting terminal 21A, the second element-mounting terminal 22A, the first external connection terminal 29A, the second external connection terminal 29B, the first conductor pattern 26Q and the second conductor pattern 26H represents a structure for the connecting part with the input side (primary side) of the piezoelectric transformer. As described below, the structure of the connecting part with the output side (secondary side) of the piezoelectric transformer is identical to the structure mentioned above.

The flexible board 2A includes an output-side first extended portion 20L3 and an output-side second extended portion 20L4 that are extended inward from the frame 20F1. The output-side first extended portion 20L3 extends from the first support portion BM1 toward the second support portion BM2 while bending in an L-shape, and the output-side second extended portion 20L4 extends from the second support portion BM2 toward the first support portion BM1 while bending in an L-shape.

The output-side first extended portion 20L3 is provided with an output-side first element-mounting terminal 23A, and the output-side second extended portion 20L4 is provided with an output-side second element-mounting terminal 24A. An output-side first external connection terminal 29C and an output-side second external connection terminal 29D are located at a peripheral portion of the frame 20F1. The output-side first extended portion 20L3 is also provided with an output-side first conductor pattern 26I that electrically connects the output-side first element-mounting terminal 23A and the output-side first external connection terminal 29C to each other. Likewise, the output-side second extended portion 20L4 is provided with an output-side second conductor pattern 26J that electrically connects the output-side second element-mounting terminal 24A and the output-side second external connection terminal 29D to each other.

An output-side first basal portion 20R3 of the output-side first extended portion 20L3 connected to the frame 20F1 is located closer to the output-side second element-mounting terminal 24A than to the output-side first element-mounting terminal 23A. An output-side second basal portion 20R4 of the output-side second extended portion 20L4 connected to the frame 20F1 is located closer to the output-side first element-mounting terminal 23A than to the output-side second element-mounting terminal 24A.

External connection terminals 29E and 29F, which are non-connect terminals not connected to the piezoelectric transformer, are terminals used for mounting the piezoelectric transformer to the wiring board.

Figure 22:
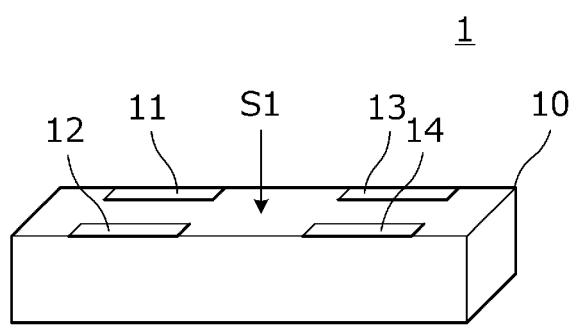
FIG. 22 is a perspective view of a piezoelectric transformer.

FIG. 22 is a perspective view of the piezoelectric transformer 1. FIG. 22 is a perspective view of the piezoelectric transformer 1 with a first surface S1 facing up.

The piezoelectric transformer 1 includes a piezoelectric element 10 having a rectangular parallelepiped shape, and outer electrodes 11, 12, 13, and 14 provided along two opposite sides of the first surface S1 of the piezoelectric element 10. The outer electrodes 11 and 12 are outer electrodes for an input region, and the outer electrodes 13 and 14 are outer electrodes for an output region.

The piezoelectric transformer 1 is mounted to the flexible board 2A illustrated in FIG. 21 as follows. A solder paste is applied to each of the element-mounting terminals 21A, 22A, 23A, and 24A of the flexible board 2A, and the piezoelectric transformer 1 is placed over the flexible board 2A with the first surface S1 facing down, followed by soldering the piezoelectric transformer 1 to the flexible board 2A by reflow soldering. At this time, the piezoelectric transformer 1 is placed such that the piezoelectric transformer 1 is connected to the element-mounting terminals 21A, 22A, 23A, and 24A at its nodes (nodes N1 and N2 described later).

Figure 23A:
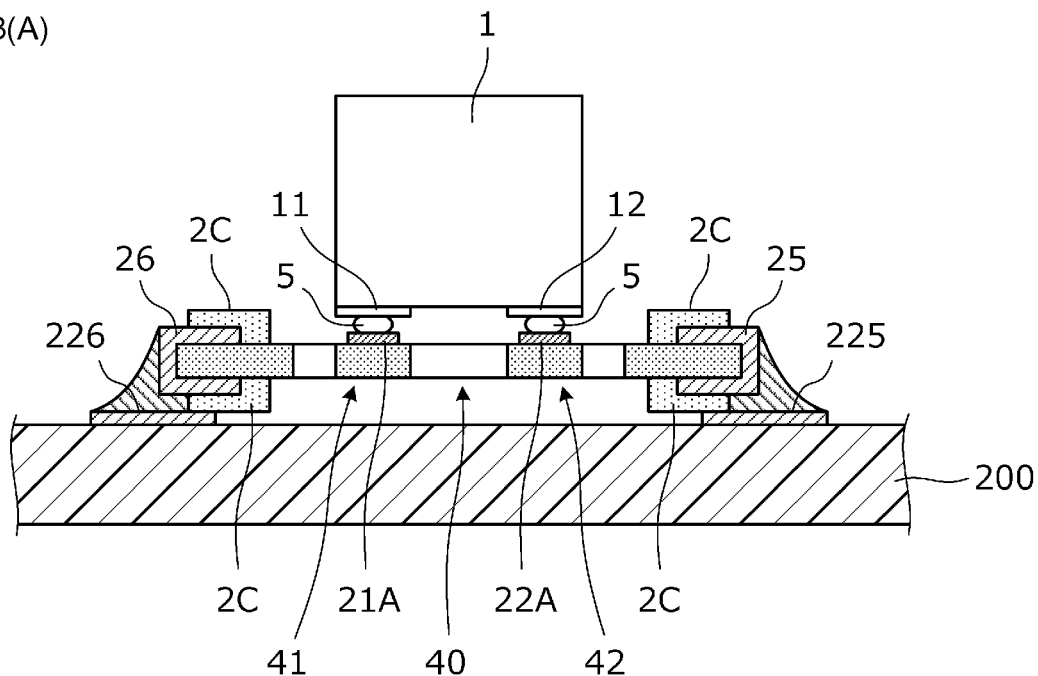
FIG. 23(A) and FIG. 23(B) are partial cross-sectional views illustrating the structure of the connecting part of a flexible board with a wiring board, and the positional relationship between a piezoelectric transformer 1 and the wiring board.
Figure 23B:
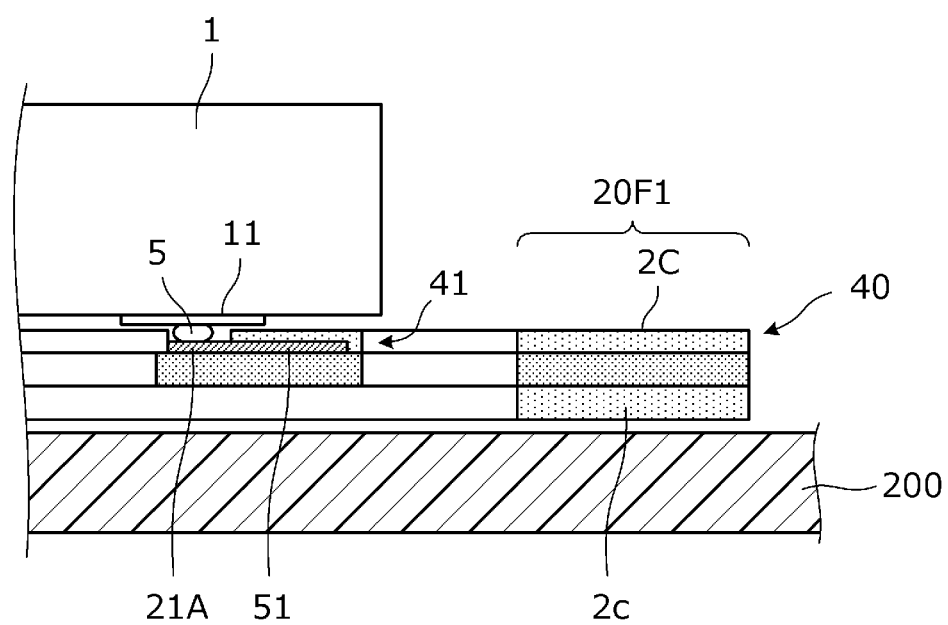

FIG. 23(A) and FIG. 23(B) are partial cross-sectional views illustrating the connecting part of the flexible board 2A with the wiring board 200, and the positional relationship between the piezoelectric transformer 1 and the wiring board 200. FIG. 23(A) is a partial cross-sectional view of the portion Y-Y illustrated in FIG. 21, and FIG. 23(B) is a partial cross-sectional view of the portion X-X illustrated in FIG. 21.

The piezoelectric transformer 1 is joined to components such as the element-mounting terminals 21A and 22A of the flexible board 2A by using a solder 5. A protective film 2P is provided on the upper and lower surfaces of the flexible board 2A. Terminals such as the external connection terminals 29A and 29B located at the periphery of the frame 20F1 of the flexible board 2A are soldered to terminals such as connection terminals 225 and 226 on the wiring board 200. Thus, as illustrated in FIG. 23(A), a gap is present between the wiring board 200, and the lower surface of the flexible board 2A on top of which components such as the piezoelectric transformer 1 are mounted, thus allowing mechanical vibration of the element-mounting terminals 21A and 22A or other components. This configuration ensures that the mechanical vibration of the piezoelectric transformer 1 mounted over the element-mounting terminals 21A and 22A is not impeded.

As illustrated in FIG. 23(B), the protective film 2P is provided on the upper and lower surfaces of the frame 20F1 of the flexible board 2A. Thus, the frame 20F1 has a high rigidity. In other words, the frame 20F1 has a high elastic modulus. In contrast, the extended portions 20L1, 20L2, 20L3, and 20L4 have a small overall thickness, and thus exhibit high springiness. The term "springiness" as used herein is a measure of the ease of deformation under an applied load on the element-mounting terminals 21A, 22A, 23A, and 24A. In other words, the extended portions 20L1, 20L2, 20L3, and 20L4 have a lower elastic modulus than the frame 20F1.

As illustrated in FIG. 21, the extended portions 20L1, 20L2, 20L3, and 20L4 are bent in an L-shape, and thus exhibit a high springiness not only in the Z-axis direction but also in both the X-axis direction and the Y-axis direction.

Figure 24A:
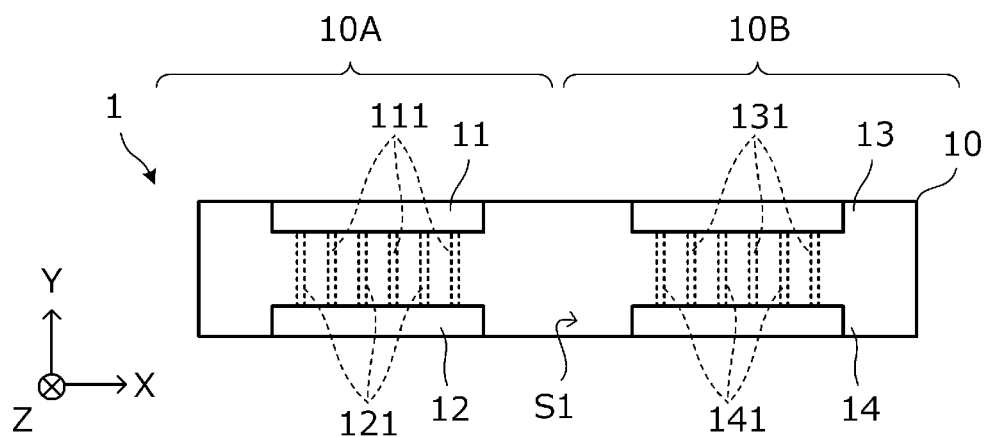
FIG. 24(A) is a plan view of a piezoelectric transformer.
Figure 24B:
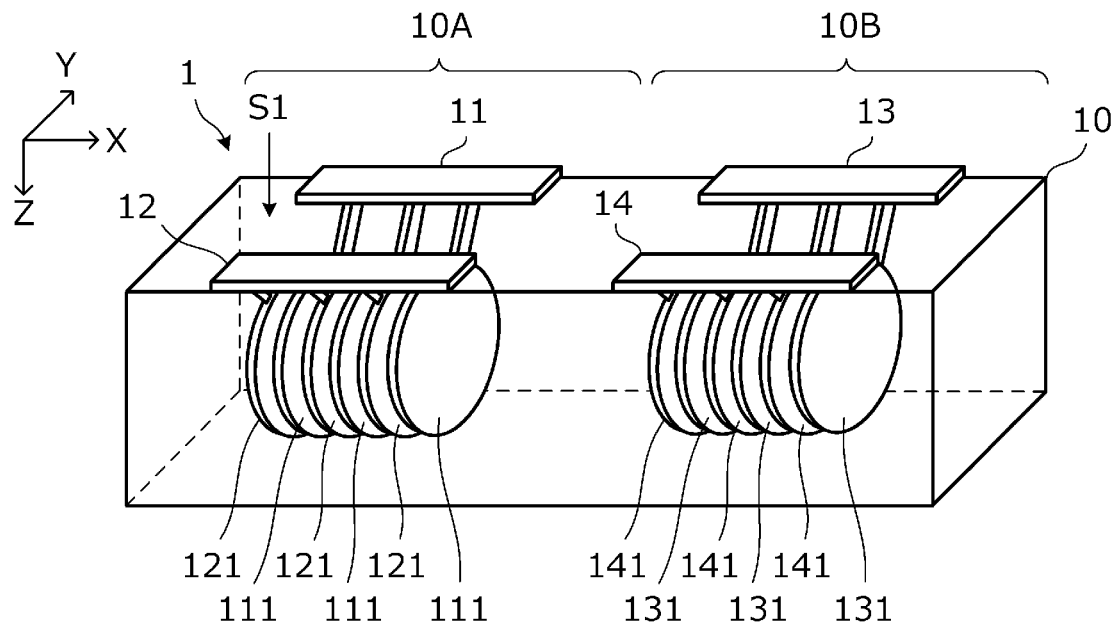
FIG. 24(B) is a see-through perspective view of the piezoelectric transformer, illustrating the internal structure of the piezoelectric transformer.

FIG. 24(A) is a plan view of the piezoelectric transformer 1. FIG. 24(B) is a see-through perspective view of the piezoelectric transformer 1, illustrating the internal structure of the piezoelectric transformer 1.

The input-side first outer electrode 11, the input-side second outer electrode 12, the output-side first outer electrode 13, and the output-side second outer electrode 14 are disposed on the first surface S1 of the piezoelectric element 10. All of the outer electrodes 11, 12, 13, and 14 are in the shape of a rectangle having a surface with short and long sides. The outer electrodes 11, 12, 13, and 14 are disposed on the first surface S1 of the piezoelectric element 10 such that their long side is aligned with the X-axis direction and their short side is aligned with the Y-axis direction.

A plurality of input-side first inner electrodes 111, and a plurality of input-side second inner electrodes 121 are provided in an input region 10A. Each of the input-side first inner electrodes 111, which has a circular principal surface, is electrically continuous with the input-side first outer electrode 11. Each of the input-side second inner electrodes 121, which has a circular principal surface, is electrically continuous with the input-side second outer electrode 12.

The input-side first inner electrode 111 and the input-side second inner electrode 121 are disposed alternately in the X-axis direction such that the normals to their respective principal surfaces are aligned with the X-axis direction.

A plurality of output-side first inner electrodes 131, and a plurality of output-side second inner electrodes 141 are provided in an output region 10B. Each of the output-side first inner electrodes 131, which has a circular principal surface, is electrically continuous with the output-side first outer electrode 13. Each of the output-side second inner electrodes 141, which has a circular principal surface, is electrically continuous with the output-side second outer electrode 14.

The output-side first inner electrode 131 and the output-side second inner electrode 141 are disposed alternately in the X-axis direction such that the normals to their respective principal surfaces are aligned with the X-axis direction.

Figure 25:
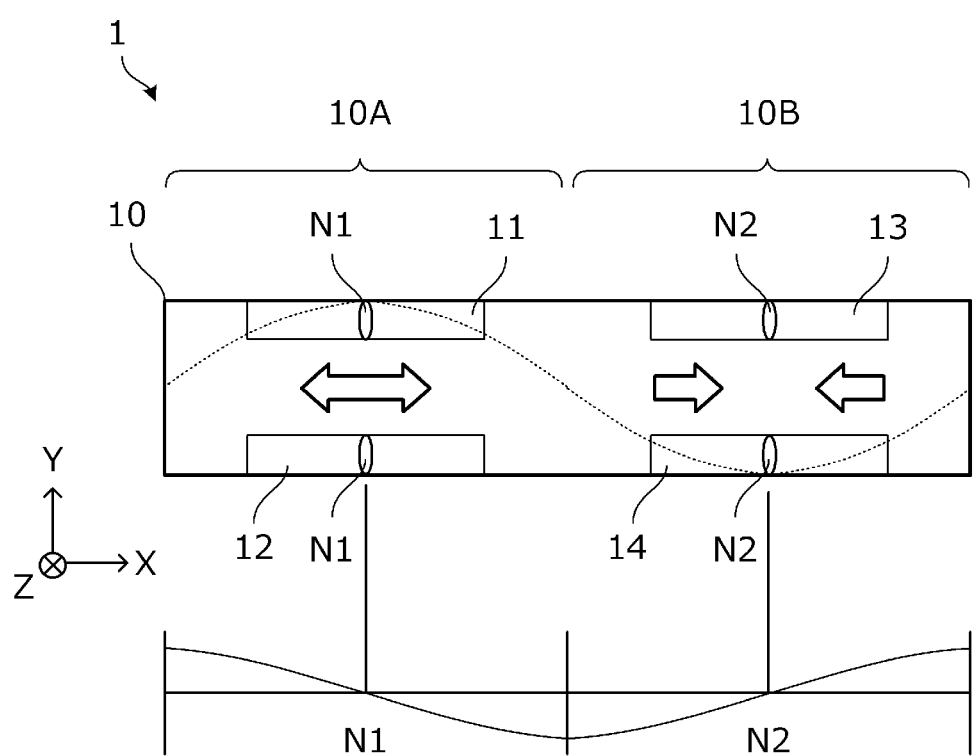
FIG. 25 is an illustration for explaining the direction in which each of an input vibration portion and an output vibration portion vibrates.

FIG. 25 is an illustration for explaining the direction in which each of the input region 10A and the output region 10B vibrates. The arrows in FIG. 25 indicate the direction of expansion/contraction of the piezoelectric element 10 in each of the input region 10A and the output region 10B. The dashed line indicates stress distribution in the piezoelectric element 10. The solid waveform in the lower part of FIG. 25 indicates the distribution of displacement of the piezoelectric element 10 due to vibration.

An alternating-current voltage applied on the input-side first outer electrode 11 and the input-side second outer electrode 12 creates an electric field between the input-side first inner electrode 111 and the input-side second inner electrode 121. That is, an electric field is applied to the input region 10A in the polarization direction. At this time, for example, the electric field is applied to the input-side first inner electrode 111 in opposite directions on the positive and negative sides of the X-axis. Then, due to the inverse piezoelectric effect, a thickness longitudinal vibration is excited with the thickness being defined in the polarization direction, that is, in the X-axis direction along the first surface S1 of the piezoelectric element 10. This causes the input region 10A to expand/contract in the X-axis direction as indicated by the arrow in FIG. 25.

The excited longitudinal vibration causes a mechanical strain to develop in the output region 10B in the X-axis direction (polarization direction), causing the output region 10B to expand/contract in the X-axis direction as indicated by the arrows in FIG. 25. Since the vibration mode is $2\lambda/2$, the input region 10A and the output region 10B expand/contract in opposite directions. The resulting longitudinal piezoelectric effect creates a potential difference between the output-side first inner electrode 131 and the output-side second inner electrode 141, and a voltage is output from the output-side first outer electrode 13 and the output-side second outer electrode 14.

A first node N1 in the input region 10A, where vibration displacement is minimum, lies within each of an area where the input-side first outer electrode 11 is provided and an area where the input-side second outer electrode 12 is provided. A second node N2 in the output region 10B, where vibration displacement is minimum lies, within each of an area where the output-side first outer electrode 13 is provided and an area where the output-side second outer electrode 14 is provided. In mounting the piezoelectric transformer 1, the piezoelectric transformer 1 is supported at the positions (nodes N1 and N2) of minimum vibration displacement, thus minimizing impediment to the vibration of the piezoelectric transformer 1.

In the fourth embodiment, although the spacing between the input-side second conductor pattern 26H and the output-side second conductor pattern 26J is narrow, if the input-side second external connection terminal 29B and the output-side second external connection terminal 29D are both set at the ground potential, there is no difference in potential between the input-side second conductor pattern 26H and the output-side second conductor pattern 26J, and thus the issue of insulation distance does not arise. In contrast, the comparatively large spacing between the input-side first conductor pattern 26G and the output-side first conductor pattern 26I ensures sufficient insulation distance between the input and output sides. In other words, the above-mentioned configuration facilitates miniaturization of the piezoelectric module including the flexible board 2A and the piezoelectric transformer 1 mounted on the flexible board 2A.

Fifth Embodiment

A fifth exemplary embodiment is directed to an example of a flexible board having extended portions that differ in shape from those of the flexible board according to the fourth embodiment.

Figure 26:
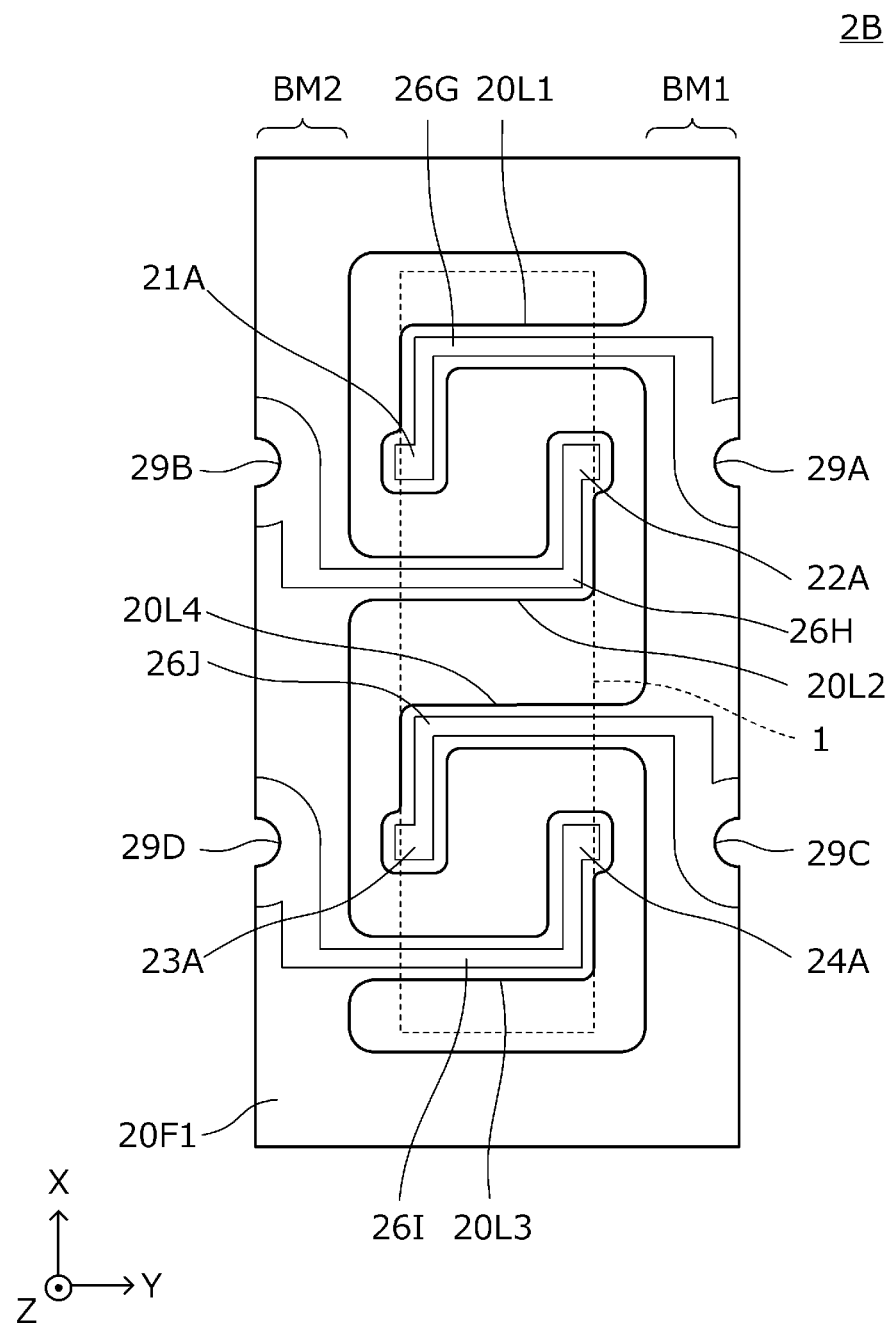
FIG. 26 is a plan view of a flexible board according to a fifth exemplary embodiment.

FIG. 26 is a plan view of a flexible board 2B according to the fifth exemplary embodiment. A piezoelectric transformer 1 is mounted onto the flexible board 2B. In FIG. 26, the piezoelectric transformer 1 is depicted only by its contours.

The flexible board 2B differs from the flexible board 2A according to the fourth embodiment illustrated in FIG. 21 in the configuration of extended portions 20L3 and 20L4. In the flexible board 2A according to the fourth embodiment, the layout of the output-side first extended portion 20L3 and the output-side second extended portion 20L4, and the layout of the input-side first extended portion 20L1 and the input-side second extended portion 20L2 are vertically line-symmetric to each other. In the flexible board 2B according to the fifth embodiment, the layout of the output-side first extended portion 20L3 and the output-side second extended portion 20L4, and the layout of the input-side first extended portion 20L1 and the input-side second extended portion 20L2 are congruent and have rotational symmetries through 180 degrees.

Sixth Embodiment

A sixth embodiment is directed to an example of a flexible board whose frame differs in configuration from the flexible board according to each of the fourth and fifth embodiments.

Figure 27:
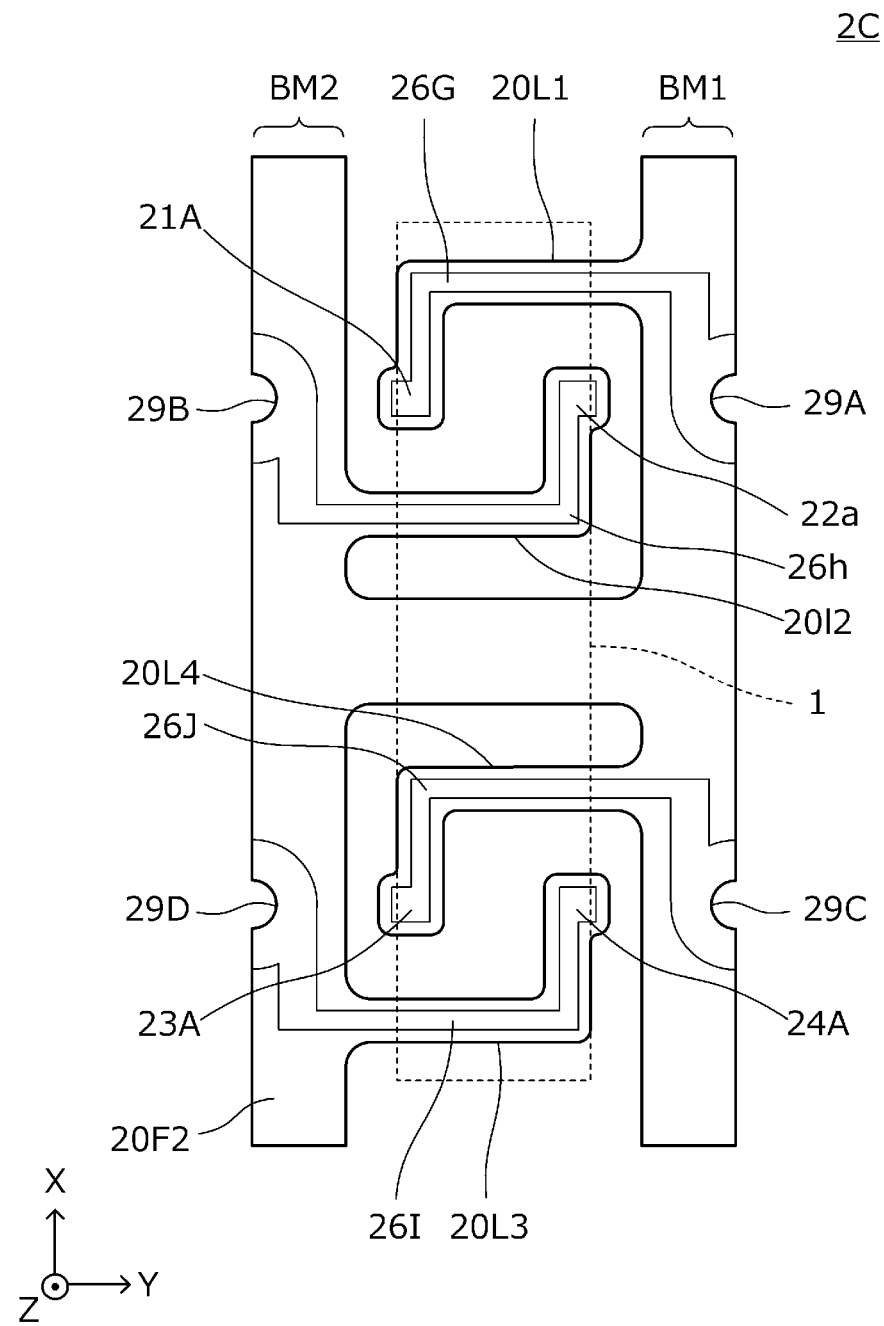
FIG. 27 is a plan view of a flexible board according to a sixth exemplary embodiment.

FIG. 27 is a plan view of a flexible board 2C according to the sixth embodiment. A piezoelectric transformer 1 is mounted onto the flexible board 2C. In FIG. 27, the piezoelectric transformer 1 is depicted only by its contours.

The flexible board 2A according to the fourth embodiment illustrated in FIG. 21, and the flexible board 2B according to the fifth embodiment illustrated in FIG. 26 both include a frame in the form of a rectangular closed frame. In contrast, the flexible board 2C illustrated in FIG. 27 includes a frame 20F2 having an H-shape. Otherwise, the flexible board 2C is of the same configuration as the flexible board 2B according to the fifth embodiment.

As in this example, the frame of the flexible board may not necessarily be in the form of a closed frame. Any support structure that supports the extended portions may serve as such a frame.

The fourth to sixth embodiments mentioned above have the following effects. Specifically, no special lead wire for connection to the piezoelectric vibrator is necessary, thus allowing for easy mounting of the piezoelectric vibrator. Moreover, the extended portions having springiness may be provided with a sufficient length while keeping the overall outer dimensions of the flexible board small, thus minimizing impediment to the vibration of the piezoelectric vibrator. The presence of the extended portions ensures that thermal stress resulting from the difference in the coefficient of thermal expansion between the piezoelectric vibrator and the flexible board, and between the flexible board and the wiring board is absorbed. Consequently, stress does not concentrate at the solder joints, thus improving reliability.

The flexible board according to each of the fourth to sixth embodiments, and the piezoelectric transformer mounted to the flexible board may not necessarily be configured as mentioned above but may be of any configuration including the features described below.

(Feature 1)

A flexible board to which a piezoelectric vibrator is mounted, the flexible board including: a frame, a first extended portion extended from the frame, and a second extended portion extended from the frame; and a first element-mounting terminal provided on the first extended portion and to which a first outer electrode of the piezoelectric vibrator is connected, and a second element-mounting terminal provided on the second extended portion and to which a second outer electrode of the piezoelectric vibrator is connected, wherein a first basal portion of the first extended portion connected to the frame is located closer to the second element-mounting terminal than is the first element-mounting terminal.

(Feature 2)

The flexible board according to Feature 1, wherein a second basal portion of the second extended portion connected to the frame is located closer to the first element-mounting terminal than is the second element-mounting terminal.

(Feature 3)

The flexible board according to Feature 2, wherein the first extended portion extends with a bend from the first basal portion toward the second basal portion.

(Feature 4)

The flexible board according to Feature 2 or 3, wherein the second extended portion extends with a bend from the second basal portion toward the first basal portion.

(Feature 5)

The flexible board according to any one of Features 1 to 4, including a first external connection terminal provided on the frame, and a first conductor pattern that is provided in the first extended portion and electrically connects the first element-mounting terminal and the first external connection terminal to each other, wherein the first external connection terminal is disposed at a peripheral portion of the frame.

(Feature 6)

The flexible board according to any one of Features 1 to 5, including a second external connection terminal provided on the frame, and a second conductor pattern that is provided in the second extended portion and electrically connects the second element-mounting terminal and the second external connection terminal to each other, wherein the second external connection terminal is disposed at a peripheral portion of the frame.

(Feature 7)

The flexible board according to any one of Features 1 to 6, wherein a protective film is provided in an area of the flexible board excluding an area where the first element-mounting terminal is provided.

(Feature 8)

The flexible board according to any one of Features 1 to 7, wherein a protective film is provided in an area of the flexible board excluding an area where the second element-mounting terminal is provided.

(Feature 9)

The flexible board according to any one of Features 1 to 8, including a plurality of piezoelectric-vibrator connection structures, the piezoelectric-vibrator connection structures each including the first extended portion, the second extended portion, the first element-mounting terminal, and the second element-mounting terminal.

(Feature 10)

A piezoelectric vibration device including the flexible board according to any one of claims 1 to 9, and the piezoelectric vibrator mounted on the flexible board.

(Feature 11)

A piezoelectric vibration device including the flexible board according to Feature 9, and the piezoelectric vibrator mounted on the flexible board, wherein the piezoelectric vibrator is a piezoelectric transformer.

(Feature 12)

The piezoelectric vibration device according to Feature 10 or 11, wherein the first outer electrode and the second outer electrode are respectively connected to the first element-mounting terminal and the second element-mounting terminal at a node of mechanical vibration.

Seventh to ninth embodiments described below differ from the first and second embodiments in the configuration of a piezoelectric transformer module. With the piezoelectric transformer module according to each of the seventh to ninth embodiments, an increase in size can be minimized while ensuring insulation between the electrodes of a plurality of piezoelectric transformers.

Seventh Embodiment

Figure 28A:
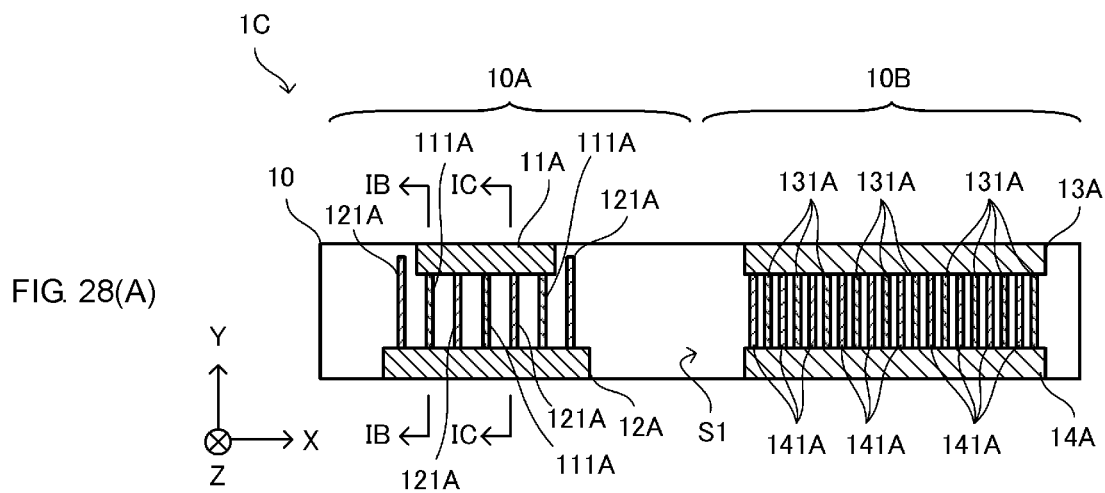
FIG. 28(A) is a plan view of a piezoelectric transformer according to a seventh exemplary embodiment.
Figure 28B:
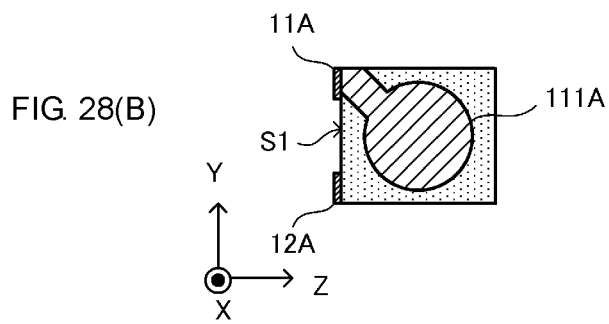
FIG. 28(B) is a cross-sectional view taken along a line IB-IB of FIG. 28(A)
Figure 28C:
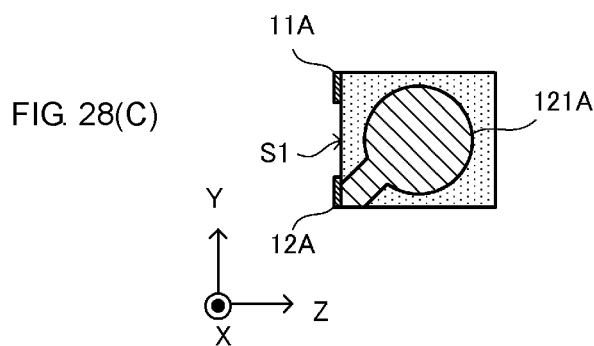
FIG. 28(C) is a cross-sectional view taken along a line IC-IC of FIG. 28(A).

FIG. 28(A) is a plan view of a piezoelectric transformer 1C according to a seventh exemplary embodiment. FIG. 28(B) is a cross-sectional view taken along a line IB-IB of FIG. 28(A). FIG. 28(C) is a cross-sectional view taken along a line IC-IC of FIG. 28(A). FIG. 28(A) is a see-through view of the interior of the piezoelectric element 10.

The piezoelectric transformer 1C has a piezoelectric element 10 having a rectangular parallelepiped shape that is elongated in one direction. The piezoelectric element 10 is formed as, for example, a laminate of PZT ceramic sheets. In the following description, the longitudinal direction is defined along the X-axis, the width direction is defined along the Y-axis (which corresponds to "direction of one side" according to the present disclosure), and the thickness direction is defined along the Z-axis. It is assumed that the piezoelectric transformer 1C according to the seventh embodiment vibrates in the length direction in a $(2\lambda/2)$ resonant mode. In this case, $\lambda$ represents one wave length of vibration in the X-axis direction. Accordingly, the piezoelectric element 10 has a length in the X-axis direction of $(2\lambda/2)$.

The piezoelectric element 10 has an input region 10A on the primary side and an output region 10B on the secondary side that are defined along the X-axis. The piezoelectric transformer 1C according to the seventh embodiment is a transformer that receives an input of an alternating-current voltage from the input region 10A, steps down the voltage, and outputs the resulting voltage from the output region 10B. That is, the input region 10A represents the high voltage side, and the output region 10B represents the low voltage side. The input region 10A and the output region 10B are each polarized in the X-axis direction. The input region 10A and the output region 10B may be polarized in either the same direction or opposite directions.

An input-side first outer electrode 11A, an input-side second outer electrode 12A, an output-side first outer electrode 13A, and an output-side second outer electrode 14A are disposed on a first surface S1 of the input region 10A that extends in the X- and Y-axis directions. The first surface S1 on which the electrodes 11A, 12A, 13A, and 14A are provided serves as the mounting surface of the piezoelectric transformer 1. The input-side first outer electrode 11A represents an example of "first outer electrode" according to the present disclosure, and the input-side second outer electrode 12A represents an example of "second outer electrode" according to the present disclosure. The output-side first outer electrode 13A represents an example of "third outer electrode" according to the present disclosure, and the output-side second outer electrode 14A represents an example of "fourth outer electrode" according to the present disclosure. The input-side first outer electrode 11A and the input-side second outer electrode 12A represent an example of "primary-side electrode pair" according to the present disclosure, and the output-side first outer electrode 13A and the output-side second outer electrode 14A represent an example of "secondary-side electrode pair" according to the present disclosure.

The input-side first outer electrode 11A, the input-side second outer electrode 12A, the output-side first outer electrode 13A, and the output-side second outer electrode 14A are in the shape of a rectangle having a principal surface with long and short sides. The electrodes 11A, 12A, 13A, and 14A are disposed on the first surface S1 of the piezoelectric element 10 such that their long side is aligned with the X-axis direction and their short side is aligned with the Y-axis direction.

More specifically, the input-side first outer electrode 11A and the output-side first outer electrode 13A are disposed along one long side of the first surface S1 of the piezoelectric element 10. The input-side second outer electrode 12A and the output-side second outer electrode 14A are disposed along the other long side of the first surface S1 of the piezoelectric element 10. The input-side first outer electrode 11A and the input-side second outer electrode 12A are located opposite to each other in the Y-axis direction. The output-side first outer electrode 13A and the output-side second outer electrode 14A are located opposite to each other in the Y-axis direction.

The input-side first outer electrode 11A, the input-side second outer electrode 12A, the output-side first outer electrode 13A, and the output-side second outer electrode 14A are disposed as described above. As a result, the input-side first outer electrode 11A and the input-side second outer electrode 12A, which are located on the high voltage side, and the output-side first outer electrode 13A and the output-side second outer electrode 14A, which are located on the low voltage side, can be easily spaced away from each other to maintain insulation between the electrodes. Further, the outer electrodes 11A, 12A, 13A, and 14A are disposed on the same surface of the piezoelectric element 10. This facilitates mounting of the piezoelectric transformer 1C onto the board (not illustrated).

A plurality of input-side first inner electrodes 111A, and a plurality of input-side second inner electrodes 121A are provided in the input region 10A. As illustrated in FIG. 28(B), each of the input-side first inner electrodes 111A has a circular principal surface, and is electrically continuous with the input-side first outer electrode 11A. That is, the input-side first outer electrode 11A and the input-side first inner electrode 111A constitute electrodes of the same potential. As illustrated in FIG. 28(C), each of the input-side second inner electrodes 121A has a circular principal surface, and is electrically continuous with the input-side second outer electrode 12A. That is, the input-side second outer electrode 12A and the input-side second inner electrode 121A constitute electrodes of the same potential. The circular principal surface of the input-side first inner electrode 111A and the circular principal surface of the input-side second inner electrode 121A have substantially the same size. The input-side first inner electrode 111A and the input-side second inner electrode 121A are disposed alternately in the X-axis direction such that the normals to their respective principal surfaces are aligned with the X-axis direction.

A plurality of output-side first inner electrodes 131A, and a plurality of output-side second inner electrodes 141A are provided in the output region 10B. Each of the output-side first inner electrodes 131A has a shape (not illustrated) identical to the shape (see FIG. 28(B)) of the input-side first inner electrode 111A, and is electrically continuous with the output-side first outer electrode 13A. That is, the output-side first outer electrode 13A and the output-side first inner electrode 131A constitute electrodes of the same potential. Each of the output-side second inner electrodes 141A has a shape (not illustrated) identical to the shape (see FIG. 28(C)) of the input-side second inner electrode 121A, and is electrically continuous with the output-side second outer electrode 14A. That is, the output-side second outer electrode 14A and the output-side second inner electrode 141A constitute electrodes of the same potential. The output-side first inner electrode 131A and the output-side second inner electrode 141A are disposed alternately in the X-axis direction such that the normals to their respective principal surfaces are aligned with the X-axis direction.

As described above, the input region 10A is on the high voltage side, and the output region 10B is on the low voltage side. Accordingly, the distance between the input-side first inner electrode 111A and the input-side second inner electrode 121A is greater than the distance between the output-side first inner electrode 131A and the output-side second inner electrode 141A. The respective numbers of the electrodes 111A, 121A, 131A, and 141A are not limited to the numbers illustrated in FIG. 28(A).

Figure 29:
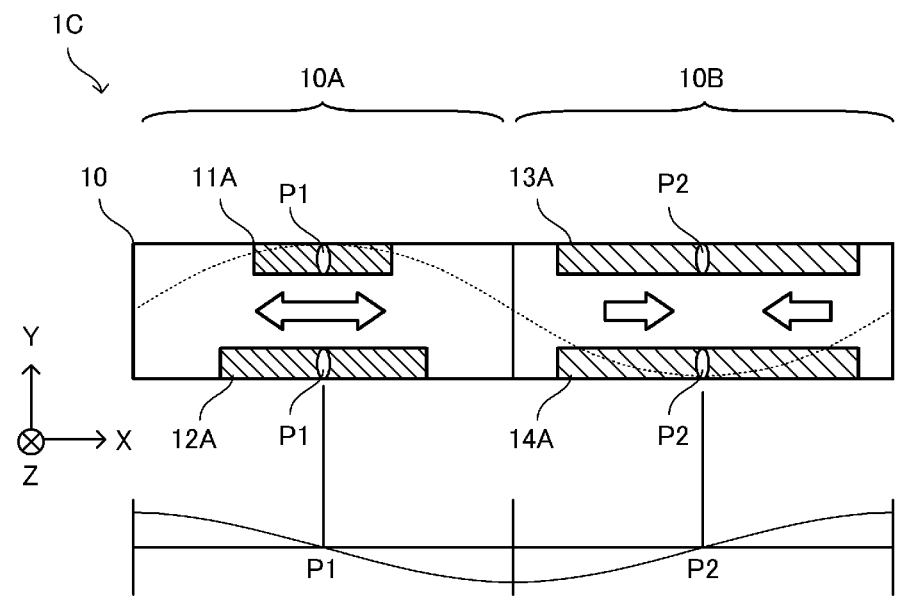
FIG. 29 is an illustration for explaining the direction in which each of an input region and an output region vibrates.

FIG. 29 is an illustration for explaining the direction in which each of the input region 10A and the output region 10B vibrates. The arrows in FIG. 29 indicate the direction of expansion/contraction of the piezoelectric element 10 in each of the input region 10A and the output region 10B. The dashed line indicates stress distribution in the piezoelectric element 10. The waveform in the lower part of FIG. 29 indicates the distribution of displacement of the piezoelectric element 10 due to vibration.

An alternating-current voltage applied on the input-side first outer electrode 11A and the input-side second outer electrode 12A creates an electric field between the input-side first inner electrode 111A and the input-side second inner electrode 121A. That is, an electric field is applied to the input region 10A in the polarization direction. At this time, for example, the electric field is applied to the input-side first inner electrode 111A in opposite directions on the positive and negative sides of the X-axis. Then, due to the inverse piezoelectric effect, a thickness longitudinal vibration is excited with the thickness being defined in the polarization direction, that is, in the X-axis direction along the first surface S1 of the piezoelectric element 10. This causes the input region 10A to expand/contract in the X-axis direction as indicated by the arrow in FIG. 29.

The excited longitudinal vibration causes a mechanical strain to develop in the output region 10B in the X-axis direction (polarization direction), causing the output region 10B to expand/contract in the X-axis direction as indicated by the arrows in FIG. 29. Since the vibration mode is $2\lambda/2$, the input region 10A and the output region 10B expand/contract in opposite directions. Then, due to the longitudinal piezoelectric effect, a potential difference develops in the polarization direction. That is, a potential difference is generated between the output-side first inner electrode 131A and the output-side second inner electrode 141A. At this time, for example, the electric field is applied to the output-side first inner electrode 131A in opposite directions on the positive and negative sides of the X-axis. Then, a transformed (stepped-down) voltage is output from the input-side first outer electrode 13A and the input-side second outer electrode 14A.

The input-side first outer electrode 11A and the input-side second outer electrode 12A are each located at a position that coincides with a first nodal point P1 in the input region 10A where vibration displacement is minimum. The output-side first outer electrode 13A and the output-side second outer electrode 14A are each located at a position that coincides with a second nodal point P2 in the output region 10B where vibration displacement is minimum. In mounting the piezoelectric transformer 1C, the piezoelectric transformer 1C is thus supported and wired at the positions of minimum vibration displacement (nodal points P1 and P2). This configuration ensures that vibration of the piezoelectric transformer 1C is not impeded, and also prevents a decrease in the reliability of connection caused by displacement of the piezoelectric element 10 after the piezoelectric transformer 1C is mounted.

Figure 30:
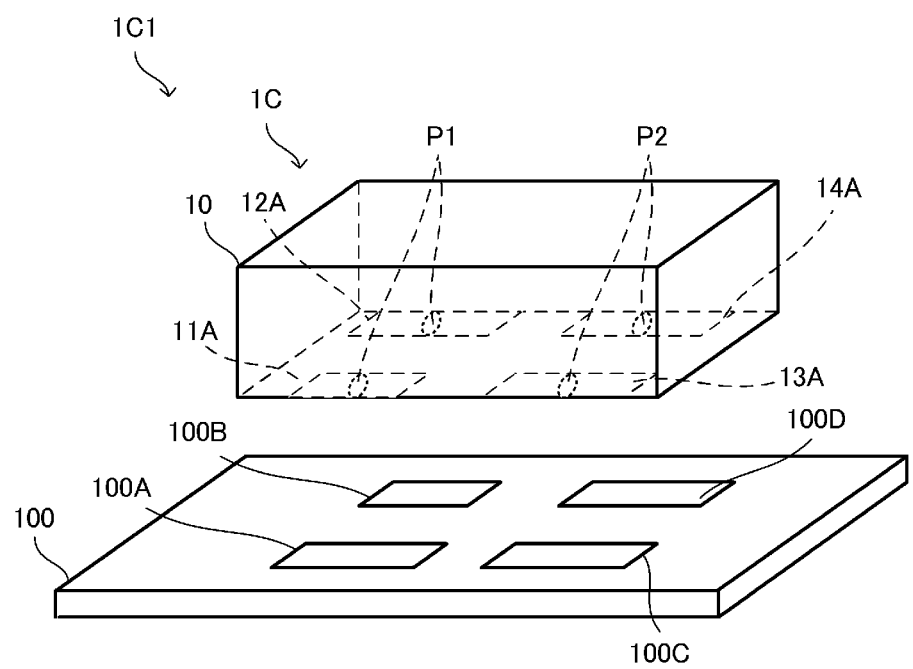
FIG. 30 illustrates a piezoelectric transformer device with a piezoelectric transformer mounted onto a board.

FIG. 30 illustrates a piezoelectric transformer device 1C1 with the piezoelectric transformer 1C mounted onto a board 100. As shown, the piezoelectric transformer device 1C1 includes the piezoelectric transformer 1C mounted on the board 100. The board 100 is provided with mounting electrodes 100A, 100B, 100C, and 100D. The mounting electrodes 100A and 100B are each connected to a component such as an output circuit (not illustrated) that outputs an alternating-current voltage. The mounting electrodes 100C and 100D are each connected to a component such as an output-side rectifying and smoothing circuit that rectifies and smoothes voltage.

The input-side first outer electrode 11A, the input-side second outer electrode 12A, the output-side first outer electrode 13A, and the output-side second outer electrode 14A are respectively soldered to the mounting electrodes 100A, 100B, 100C, and 100D. At this time, the electrodes 11A, 12A, 13A, and 14A are soldered at the nodal points P1 and P2 described above with reference to FIG. 29. Soldering at the nodal points P1 and P2 ensures that vibration of the piezoelectric element 10 is not impeded when the piezoelectric transformer 1 is mounted on the board 100.

The mounting electrode 100A represents an example of "first mounting electrode" according to the present disclosure, and the mounting electrode 100B represents an example of "second mounting electrode" according to the present disclosure. The mounting electrode 100C represents an example of "third mounting electrode" according to the present disclosure, and the mounting electrode 100D represents an example of "fourth mounting electrode" according to the present disclosure.

Eighth Embodiment

A piezoelectric transformer according to an eighth exemplary embodiment differs from the piezoelectric transformer according to the seventh embodiment in the configuration of inner electrodes provided in an input region 10A of a piezoelectric element 10. Hereinafter, the difference will be described.

Figure 31A:
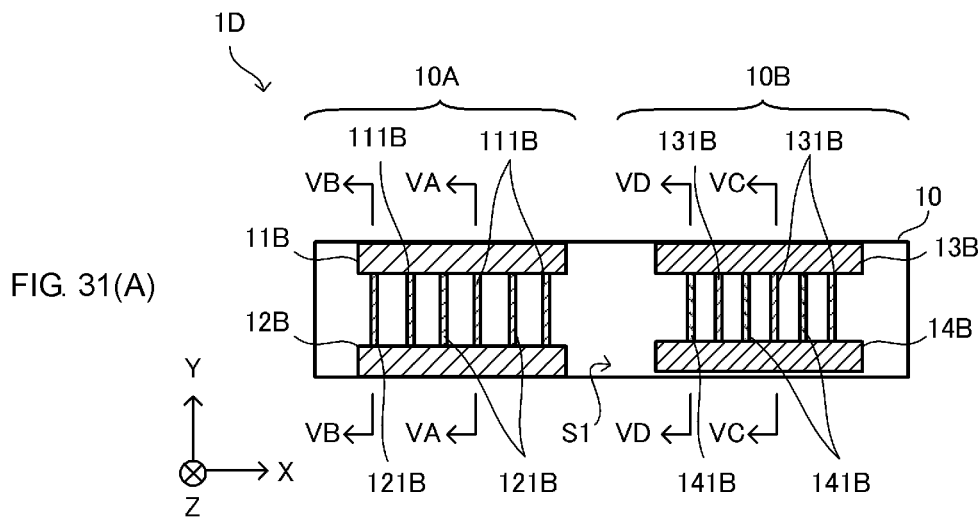
FIG. 31(A) and FIG. 31(B) are respectively a plan view and a perspective view of a piezoelectric transformer according to an eighth exemplary embodiment.
Figure 31B:
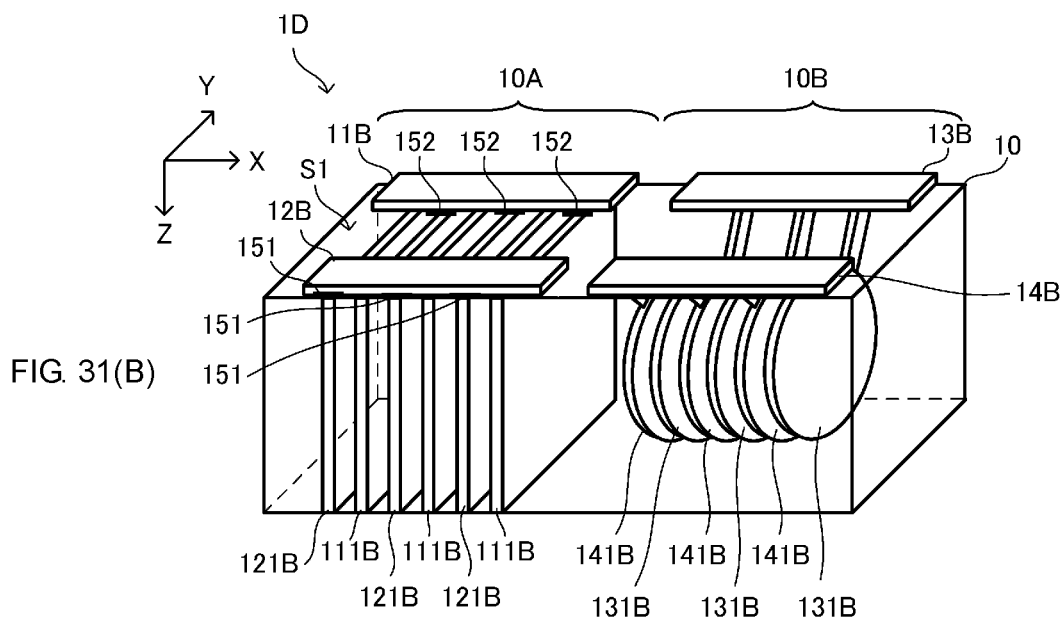
Figure 32A:
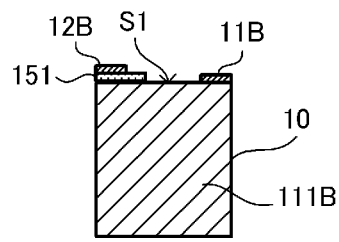
FIG. 32(A) is a cross-sectional view taken along a line VA-VA of FIG. 31(A)
Figure 32B:
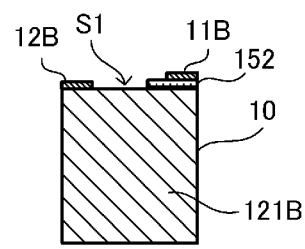
FIG. 32(B) is a cross-sectional view taken along a line VB-VB of FIG. 31(A)
Figure 32C:
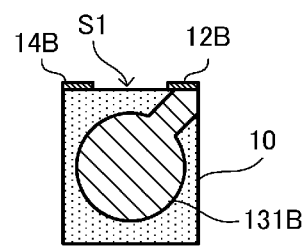
FIG. 32(C) is a cross-sectional view taken along a line VC-VC of FIG. 31(A)
Figure 32D:
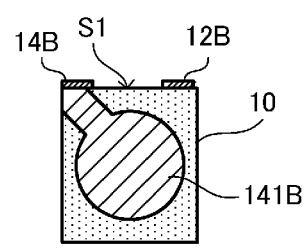
FIG. 32(D) is a cross-sectional view taken along a line VD-VD of FIG. 31(A).

FIG. 31(A) and FIG. 31(B) are respectively a plan view and a perspective view of a piezoelectric transformer 1D according to the eighth exemplary embodiment. FIG. 32(A) is a cross-sectional view taken along a line VA-VA of FIG. 31(A), FIG. 32(B) is a cross-sectional view taken along a line VB-VB of FIG. 31(A), FIG. 32(C) is a cross-sectional view taken along a line VC-VC of FIG. 31(A), and FIG. 32(D) is a cross-sectional view taken along a line VD-VD of FIG. 31(A). FIG. 31(A) and FIG. 31(B) are see-through views of the interior of the piezoelectric element 10.

An input-side first outer electrode 11B, an input-side second outer electrode 12B, an output-side first outer electrode 13B, and an output-side second outer electrode 14B are disposed on the first surface S1 in the input region 10A. The input-side first outer electrode 11B, the input-side second outer electrode 12B, the output-side first outer electrode 13B, and the output-side second outer electrode 14B are in the shape of a rectangle having a principal surface with short and long sides. The electrodes 11B, 12B, 13B, and 14B are disposed on the first surface S1 of the piezoelectric element 10 such that their long side is aligned with the X-axis direction and their short side is aligned with the Y-axis direction.

The layout of the electrodes 11B, 12B, 13B, and 14B is the same as the layout of the electrodes 11A, 12A, 13A, and 14A according to the seventh embodiment. This allows the input-side first outer electrode 11B and the input-side second outer electrode 12B, and the output-side first outer electrode 13B and the output-side second outer electrode 14B to be easily spaced away from each other, thus maintaining insulation between the electrodes. Further, the outer electrodes are disposed on the same surface of the piezoelectric element 10. This facilitates mounting of the piezoelectric transformer 1D onto the board (not illustrated).

A plurality of input-side first inner electrodes 111B, and a plurality of input-side second inner electrodes 121B are provided in the input region 10A. As illustrated in FIG. 32(A), each of the input-side first inner electrodes 111B has a principal surface with a shape substantially identical to the cross-sectional shape of the piezoelectric element 10, and is electrically continuous with the input-side first outer electrode 11B. That is, the input-side first outer electrode 11B and the input-side first inner electrode 111B constitute electrodes of the same potential. An insulating film (e.g., a glass member) 151 with a dielectric constant lower than the dielectric constant of the piezoelectric element 10 is disposed between the input-side second outer electrode 12B and the input-side first inner electrode 111B. As illustrated in FIG. 32(B), each of the input-side second inner electrodes 121B has a principal surface with a shape substantially identical to the cross-sectional shape of the piezoelectric element 10, and is electrically continuous with the input-side second outer electrode 12B. That is, the input-side second outer electrode 12B and the input-side second inner electrode 121B constitute electrodes of the same potential. An insulating film (e.g., a glass member) 152 is disposed between the input-side first outer electrode 11B and the input-side second inner electrode 121B.

The input-side first inner electrode 111B and the input-side second inner electrode 121B are disposed alternately in the X-axis direction such that the normals to their respective principal surfaces are aligned with the X-axis direction.

A plurality of output-side first inner electrodes 131B, and a plurality of output-side second inner electrodes 141B are provided in an output region 10B. As illustrated in FIG. 32(C), each of the output-side first inner electrodes 131B has a circular principal surface, and is electrically continuous with the output-side first outer electrode 13B. That is, the output-side first outer electrode 13B and the output-side first inner electrode 131B constitute electrodes of the same potential. As illustrated in FIG. 32(D), each of the output-side second inner electrodes 141B has a circular principal surface, and is electrically continuous with the output-side second outer electrode 14B. That is, the output-side second outer electrode 14B and the output-side second inner electrode 141B constitute electrodes of the same potential. The circular principal surface of the output-side first inner electrode 131B and the circular principal surface of the output-side second inner electrode 141B have substantially the same size.

The input-side first inner electrode 111B and the input-side second inner electrode 121B are disposed alternately in the X-axis direction such that the normals to their respective principal surfaces are aligned with the X-axis direction.

In the eighth embodiment, the principal surfaces of the inner electrodes 111B and 121B disposed in the input region 10A on the high voltage side have a shape substantially identical to the cross-sectional shape of the piezoelectric element 10, and the principal surfaces of the inner electrodes 131B and 141B disposed in the output region 10B on the low voltage side have a circular shape. This configuration helps to reduce cracking in the ceramic body in each of the input region 10A and the output region 10B. The following describes why cracking is reduced.

Figure 33:
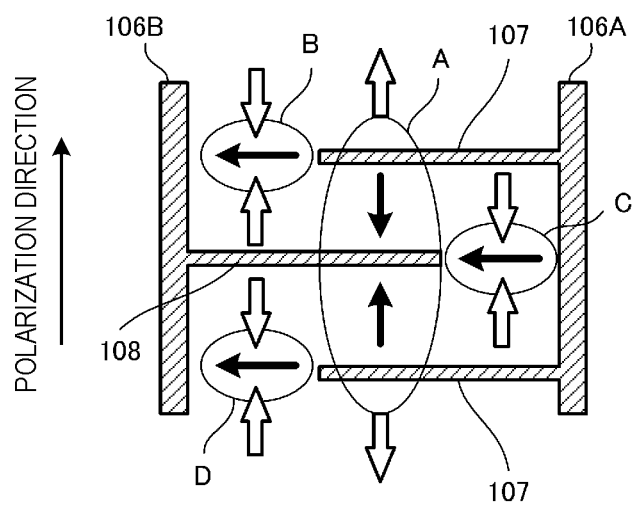
FIG. 33 is an illustration for explaining why cracking occurs in a piezoelectric element.

FIG. 33 is an illustration for explaining why cracking occurs in the piezoelectric element. The empty arrows in FIG. 33 indicate the direction of expansion/contraction of the piezoelectric element, and solid arrows indicate the direction of electric field. FIG. 33 illustrates the structure of the input and output regions of a typical piezoelectric transformer.

A plurality of flat-shaped inner electrodes 107 and a plurality of flat-shaped inner electrodes 108 are arranged alternately inside the piezoelectric element of the piezoelectric transformer. The inner electrodes 107 are connected to a common electrode 106A, and the inner electrodes 108 are connected to a common electrode 106B. If this structure is for, for example, the input region, application of voltage between the common electrodes 106A and 106B creates an electric field between the inner electrodes 107 and 108. As a result, a region A of the piezoelectric element illustrated in FIG. 33 expands as indicated by the empty arrows due to the inverse piezoelectric effect.

An electric field is also created in regions B and D each defined between the inner electrode 107 and the electrode 106B, and in a region C defined between the inner electrode 108 and the electrode 106A. This results in the regions region B, C, and D of the piezoelectric element undergoing contraction as indicated by the empty arrows due to the inverse piezoelectric effect. Since the direction of expansion/contraction is opposite between the region A and the regions B, C, and D as described above, the piezoelectric element tends to crack. The same applies to a case in which the structure illustrated in FIG. 33 is that of the output region.

In this regard, the output region 10B of the piezoelectric transformer 1 according to the eighth embodiment is on the low voltage side. The distance between the inner electrodes 131B and 141B disposed in the output region 10B is thus short. That is, the distance between the electrodes 107 and 108 in the region A illustrated in FIG. 33 is short. The short distance between the electrodes 107 and 108 means that reducing the distance between electrodes in the regions B, C, and D is unlikely to result in concentration of the electric field between the electrodes in the regions B, C, and D.

Since the principal surfaces of the inner electrodes 131B and 141B are circular, the distance between the output-side first inner electrode 131B and the output-side second outer electrode 14B (see FIG. 32(C)), and the distance between the output-side second inner electrode 141B and the output-side first outer electrode 13B (see FIG. 32(D)) are longer than the distance between the electrodes 107 and 108. As described above, on the low voltage side, reducing the distance between electrodes in the regions B, C, and D does not cause cracking to occur in the piezoelectric element, and the principal surfaces of the inner electrodes 131B and 141B can be formed in a circular shape that is unlikely to cause electric field distribution to become locally concentrated.

The input region 10A of the piezoelectric transformer 1D is on the high voltage side. The distance between the inner electrodes 111B and 121B disposed in the input region 10A is thus long. That is, the distance between the electrodes 107 and 108 in the region A illustrated in FIG. 33 is long. A longer distance between the electrodes 107 and 108 results in a lower field intensity, which can cause the electric field to become concentrated in the regions B, C, and D. This makes it necessary to increase the distance between electrodes in the regions B, C, and D. However, increasing the distance between electrodes in the regions B, C, and D results in an excessive decrease in the area over which the electrodes 107 and 108 face each other. For this reason, for the input region 10A corresponding to the high voltage side of the piezoelectric transformer 1D, the principal surfaces of the inner electrodes 111B and 121B are formed in a shape substantially identical to the cross-sectional shape of the piezoelectric element 10, and the insulating films (e.g., glass members) 151 and 152 having a dielectric constant lower than the dielectric constant of the piezoelectric element 10 are disposed between the input-side second outer electrode 12B and the input-side first inner electrodes 111B, and are disposed between the input-side first outer electrode 11B and the input-side second inner electrodes 121B. The presence of the insulating films 151 and 152 with a low dielectric constant helps to minimize concentration of electric field between the input-side second outer electrode 12B, and the input-side first inner electrodes 111B and 121B. As a result, cracking in the regions B, C, and D can be reduced. The piezoelectric transformer 1D with superior element strength can be thus provided.

Ninth Embodiment

Figure 34:
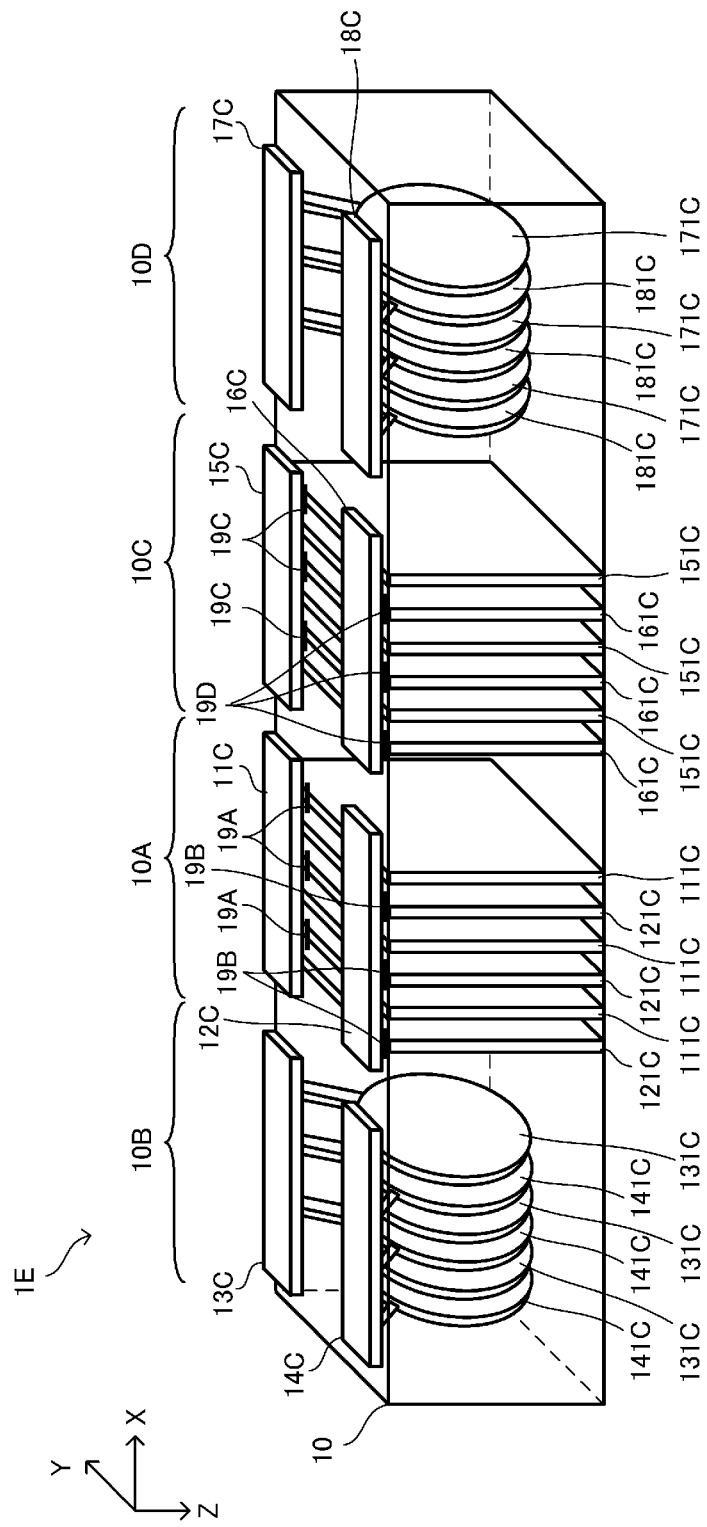
FIG. 34 is a perspective view of a piezoelectric transformer according to a ninth exemplary embodiment.

FIG. 34 is a perspective view of a piezoelectric transformer 1E according to a ninth exemplary embodiment. FIG. 34 is a see-through view of the interior of a piezoelectric element 10. The piezoelectric transformer 1E according to the ninth embodiment is formed by arranging the piezoelectric transformer 1D according to the eighth embodiment in a symmetrical fashion.

It is assumed that the piezoelectric transformer 1E vibrates in (4λ/2) resonant mode in the length direction (to be referred to as X-axis direction hereinafter). In this case, λ represents one wave length of vibration in the X-axis direction. Accordingly, the piezoelectric element 10 of the piezoelectric transformer 1E has a length in the X-axis direction of (4λ/2).

The piezoelectric element 10 has input regions 10A and 10C on the primary side, and output regions 10B and 10D on the secondary side. More specifically, the output region 10B, the input region 10A, the input region 10C, and the output region 10D are arranged in this order in the X-axis direction of the piezoelectric element 10. The piezoelectric transformer 1E according to the ninth embodiment receives an input of an alternating-current voltage from the input regions 10A and 10C, transforms the voltage, and outputs the resulting voltage from the output regions 10B and 10D. That is, the input regions 10A and 10C are on the primary side, and the output regions 10B and 10D are on the secondary side. The input regions 10A and 10C, and the output regions 10B and 10D are each polarized in the X-axis direction. The input regions 10A and 10C, and the output regions 10B and 10D may be polarized in either the same direction or opposite directions.

The input region 10A represents an example of "first primary-side portion" according to the present disclosure. The output region 10B represents an example of "first secondary-side portion" according to the present disclosure. The input region 10C represents an example of "second primary-side portion" according to the present disclosure. The output region 10D represents an example of "second secondary-side portion" according to the present disclosure.

An input-side first outer electrode 11C and an input-side second outer electrode 12C are disposed on a first surface extending in the X- and Y-axis directions of the input region 10A of the piezoelectric element 10. An output-side first outer electrode 13C and an output-side second outer electrode 14C are disposed on the first surface in the output region 10B. An input-side third outer electrode 15C and an input-side fourth outer electrode 16C are disposed on the first surface in the input region 10C. An output-side third outer electrode 17C and an output-side fourth outer electrode 18C are disposed on the first surface in the output region 10D.

The outer electrodes 11C to 18C are in the shape of a rectangle having a principal surface with long and short sides. The electrodes 11C to 18C are disposed on the first surface of the piezoelectric element 10 such that their long side is aligned with the X-axis direction and their short side is aligned with the Y-axis direction. More specifically, the outer electrodes 13C, 11C, 15C, and 17C are arranged along one long side of the first surface of the piezoelectric element 10. The outer electrodes 14C, 12C, 16C, and 18C are disposed along the other long side of the first surface of the piezoelectric element 10. The outer electrodes 13C and 14C are located opposite to each other along the Y-axis, the outer electrodes 11C and 12C are located opposite to each other along the Y-axis, the outer electrodes 15C and 16C are located opposite to each other along the Y-axis, and the outer electrodes 17C and 18C are located opposite to each other along the Y-axis.

Placing the electrodes as described above allows the outer electrodes 11C, 12C, 15C, and 16C on the primary side and the outer electrodes 13C, 14C, 17C, and 18C on the secondary side to be easily spaced away from each other, thus maintaining insulation between the electrodes. Further, the outer electrodes 11C to 18C are disposed on the same surface of the piezoelectric element 10. This facilitates mounting of the piezoelectric transformer 1E onto the board (not illustrated).

As with the first embodiment, each of the electrodes disposed as described above is located at a position that coincides with a nodal point of minimum vibration displacement of the piezoelectric element 10. In mounting the piezoelectric transformer 1E, the piezoelectric transformer 1E is thus supported and wired at the positions of minimum vibration displacement (nodal points). This configuration ensures that vibration of the piezoelectric transformer 1E is not impeded, and also prevents a decrease in the reliability of connection caused by displacement of the piezoelectric element 10 after the piezoelectric transformer 1E is mounted.

The input-side first outer electrode 11C represents an example of "first outer electrode" according to the present disclosure, and the input-side second outer electrode 12C represents an example of "second outer electrode" according to the present disclosure. The output-side first outer electrode 13C represents an example of "third outer electrode" according to the present disclosure, and the output-side second outer electrode 14C represents an example of "fourth outer electrode" according to the present disclosure. The input-side third outer electrode 15C represents an example of "fifth outer electrode" according to the present disclosure. The input-side fourth outer electrode 16C represents an example of "sixth outer electrode" according to the present disclosure. The output-side third outer electrode 17C represents an example of "seventh outer electrode" according to the present disclosure. The output-side fourth outer electrode 18C represents an example of "eighth outer electrode" according to the present disclosure.

A plurality of input-side first inner electrodes 111C, and a plurality of input-side second inner electrodes 121C are provided in the input region 10A. Each of the input-side first inner electrodes 111C is electrically continuous with the input-side first outer electrode 11C, and insulated from the input-side second outer electrode 12C by an insulating film 19B. Each of the input-side second inner electrodes 121C is electrically continuous with the input-side second outer electrode 12C, and insulated from the input-side first outer electrode 11C by an insulating film 19A. The input-side first inner electrode 111C and the input-side second inner electrode 121C are respectively identical in shape to the input-side first inner electrode 111B and the input-side second inner electrode 121B of the piezoelectric transformer 1D according to the eighth embodiment. The input-side first inner electrode 111C and the input-side second inner electrode 121C are disposed alternately in the X-axis direction such that the normals to their respective principal surfaces are aligned with the X-axis direction.

A plurality of output-side first inner electrodes 131C, and a plurality of output-side second inner electrodes 141C are provided in the output region 10B. Each of the output-side first inner electrodes 131C is electrically continuous with the output-side first outer electrode 13C, and each of the output-side second inner electrodes 141C is electrically continuous with the output-side second outer electrode 14C. The output-side first inner electrode 131C and the output-side second inner electrode 141C are respectively identical in shape to the output-side first inner electrode 131B and the output-side second inner electrode 141B of the piezoelectric transformer 1D according to the eighth embodiment. The output-side first inner electrode 131C and the output-side second inner electrode 141C are disposed alternately in the X-axis direction such that the normals to their respective principal surfaces are aligned with the X-axis direction.

A plurality of input-side third inner electrodes 151C, and a plurality of input-side fourth inner electrodes 161C are provided in the input region 10C. Each of the input-side third inner electrodes 151C is electrically continuous with the input-side third outer electrode 15C, and insulated from the input-side fourth outer electrode 16C by an insulating film 19D. Each of the input-side fourth inner electrodes 161C is electrically continuous with the input-side fourth outer electrode 16C, and insulated from the input-side third outer electrode 15C by an insulating film 19C. The input-side third inner electrode 151C and the input-side fourth inner electrode 161C are respectively identical in shape to the input-side first inner electrode 111C and the input-side second inner electrode 121C. The input-side third inner electrode 151C and the input-side fourth inner electrode 161C are disposed alternately in the X-axis direction such that the normals to their respective principal surfaces are aligned with the X-axis direction.

A plurality of output-side third inner electrodes 171C, and a plurality of output-side fourth inner electrodes 181C are provided in the output region 10D. Each of the output-side third inner electrodes 171C is electrically continuous with the output-side third outer electrode 17C, and each of the output-side fourth inner electrodes 181C is electrically continuous with the output-side fourth outer electrode 18C. The output-side third inner electrode 171C and the output-side fourth inner electrode 181C are respectively identical in shape to the output-side first inner electrode 131C and the output-side second inner electrode 141C. The output-side third inner electrode 171C and the output-side fourth inner electrode 181C are disposed alternately in the X-axis direction such that the normals to their respective principal surfaces are aligned with the X-axis direction.

The input-side first inner electrode 111C represents an example of "first inner electrode" according to the present disclosure. The input-side second inner electrode 121C represents an example of "second inner electrode" according to the present disclosure. The output-side first inner electrode 131C represents an example of "third inner electrode" according to the present disclosure. The output-side second inner electrode 141C represents an example of "fourth inner electrode" according to the present disclosure. The input-side third inner electrode 151C represents an example of "fifth inner electrode" according to the present disclosure. The input-side fourth inner electrode 161C represents an example of "sixth inner electrode" according to the present disclosure. The output-side third inner electrode 171C represents an example of "seventh inner electrode" according to the present disclosure. The output-side fourth inner electrode 181C represents an example of "eighth inner electrode" according to the present disclosure.

With the piezoelectric transformer 1E, application of an alternating-current voltage to the input-side first outer electrode 11C and the input-side second outer electrode 12C results in output of a transformed (stepped-down) voltage from the output-side first outer electrode 13C and the output-side second outer electrode 14C, and application of an alternating-current voltage to the input-side third outer electrode 15C and the input-side fourth outer electrode 16C results in output of a transformed (stepped-down) voltage from the output-side third outer electrode 17C and the output-side fourth outer electrode 18C.

As described above, the piezoelectric transformer 1E according to the ninth embodiment is configured to vibrate in a bilaterally symmetric fashion about the central portion of the piezoelectric element 10. Further, the input regions 10A and 10C are located in the inner side portion to enable efficient transfer of the vibration energy of the input regions 10A and 10C to the output regions 10B and 10D. This enables the piezoelectric transformer 1E to perform efficient voltage transformation.

The piezoelectric transformer and the piezoelectric transformer device according to each of the seventh to ninth embodiments may not necessarily have the configuration described above but may be of any configuration including the features described below.

(Feature 1)

A piezoelectric transformer having a first outer electrode, a second outer electrode, a third outer electrode, and a fourth outer electrode that are disposed on a piezoelectric body, in which application of a voltage to one of the first and second outer electrodes and the third and fourth outer electrodes causes a voltage to be excited in the other one of the first and second outer electrodes and the third and fourth outer electrodes, the piezoelectric transformer including: the piezoelectric body having a rectangular first surface; a plurality of first inner electrodes disposed inside the piezoelectric body and connected to the first outer electrode; a plurality of second inner electrodes disposed inside the piezoelectric body and connected to the second outer electrode; a plurality of third inner electrodes disposed inside the piezoelectric body and connected to the third outer electrode; and a plurality of fourth inner electrodes disposed inside the piezoelectric body and connected to the fourth outer electrode, wherein the first outer electrode, the second outer electrode, the third outer electrode, and the fourth outer electrode are disposed on the first surface of the piezoelectric body such that the first, second, third, and fourth outer electrodes are insulated from each other, wherein the first outer electrode and the third outer electrode are arranged along a direction of one side of the first surface of the piezoelectric body, wherein the second outer electrode and the fourth outer electrode are arranged along the direction of the one side of the first surface of the piezoelectric body, wherein the first outer electrode and the second outer electrode are arranged along a direction orthogonal to the direction of the one side of the first surface of the piezoelectric body, and wherein the third outer electrode and the fourth outer electrode are arranged along the direction orthogonal to the direction of the one side of the first surface of the piezoelectric body.

(Feature 2)

The piezoelectric transformer according to Feature 1, wherein the first inner electrode, the second inner electrode, the third inner electrode, and the fourth inner electrodes are planar electrodes, and a normal to the principal surface of each of the planar electrodes is aligned in the same direction.

(Feature 3)

The piezoelectric transformer according to Feature 2, wherein the piezoelectric body has a rectangular parallelepiped shape with a long side extending in the direction of the normal to the principal surface.

(Feature 4)

The piezoelectric transformer according to Feature 3, wherein the first outer electrode and the second outer electrode are high voltage-side electrodes, wherein the third outer electrode and the fourth outer electrode are low voltage-side electrodes, wherein the first inner electrode and the second inner electrode are planar electrodes each having a principal surface that is identical in shape to a cross-section of the piezoelectric body taken orthogonal to the long side of the piezoelectric body, and wherein the third inner electrode and the fourth inner electrode are planar electrodes each having a circular principal surface.

(Feature 5)

The piezoelectric transformer according to any one of Features 1 to 4, wherein the first outer electrode and the second outer electrode form a primary-side electrode pair, and the third outer electrode and the fourth outer electrode form a secondary-side electrode pair.

(Feature 6)

The piezoelectric transformer according to Feature 5, wherein the piezoelectric body has a first secondary-side portion, a first primary-side portion, a second primary-side portion, and a second secondary-side portion that are arranged along the direction of the one side of the first surface, wherein the first inner electrode, the second inner electrode, the first outer electrode, and the second outer electrode are disposed in or on the first primary-side portion of the piezoelectric body, wherein the third inner electrode, the fourth inner electrode, the third outer electrode, and the fourth outer electrode are disposed in or on the first secondary-side portion of the piezoelectric body, wherein the piezoelectric transformer further includes a fifth outer electrode and a sixth outer electrode that are disposed on the first surface located in the second primary-side portion of the piezoelectric body, a seventh outer electrode and an eighth outer electrode that are disposed on the first surface located in the second secondary-side portion of the piezoelectric body, a plurality of fifth inner electrodes disposed in the second primary-side portion of the piezoelectric body and connected to the fifth outer electrode, a plurality of sixth inner electrodes disposed in the second primary-side portion of the piezoelectric body and connected to the sixth outer electrode, a plurality of seventh inner electrodes disposed in the second secondary-side portion of the piezoelectric body and connected to the seventh outer electrode, and a plurality of eighth inner electrodes disposed in the second secondary-side portion of the piezoelectric body and connected to the eighth outer electrode, wherein the fifth outer electrode and the seventh outer electrode are arranged along the direction of the one side of the first surface of the piezoelectric body, wherein the sixth outer electrode and the eighth outer electrode are arranged along the direction of the one side of the first surface of the piezoelectric body, wherein the fifth outer electrode and the sixth outer electrode are arranged along a direction orthogonal to the direction of the one side of the first surface of the piezoelectric body, and wherein the seventh outer electrode and the eighth outer electrode are arranged along the direction orthogonal to the direction of the one side of the first surface of the piezoelectric body.

(Feature 7)

A piezoelectric transformer device further including: the piezoelectric transformer according to any one of Features 1 to 6, the piezoelectric body of the piezoelectric transformer being configured to vibrate in a thickness longitudinal vibration mode with a thickness defined in a direction along the first surface; and a board to which the piezoelectric body is mounted, wherein the board includes a first mounting electrode to which the first outer electrode is mounted, a second mounting electrode to which the second outer electrode is mounted, a third mounting electrode to which the third outer electrode is mounted, and a fourth mounting electrode to which the fourth outer electrode is mounted, wherein each of the first mounting electrode, the second mounting electrode, the third mounting electrode, and the fourth mounting electrode at least partially coincides with a point that becomes a nodal point of vibration when the piezoelectric body mounted on the board vibrates.

(Feature 8)

The piezoelectric transformer device according to Feature 7, wherein the first mounting electrode and the second mounting electrode are each located at a position that coincides a first nodal point, and wherein the third mounting electrode and the fourth mounting electrode are each located at a position that coincides a second nodal point.

Tenth to fourteenth embodiments described below differ from the above-mentioned embodiments in the configuration of a piezoelectric transformer and a piezoelectric transformer module. A piezoelectric transformer and a piezoelectric transformer module according to each of the tenth to fourteenth embodiments make it possible to minimize propagation of an undesired signal between an input portion and an output portion that are insulated from each other.

Tenth Embodiment

Figure 35:
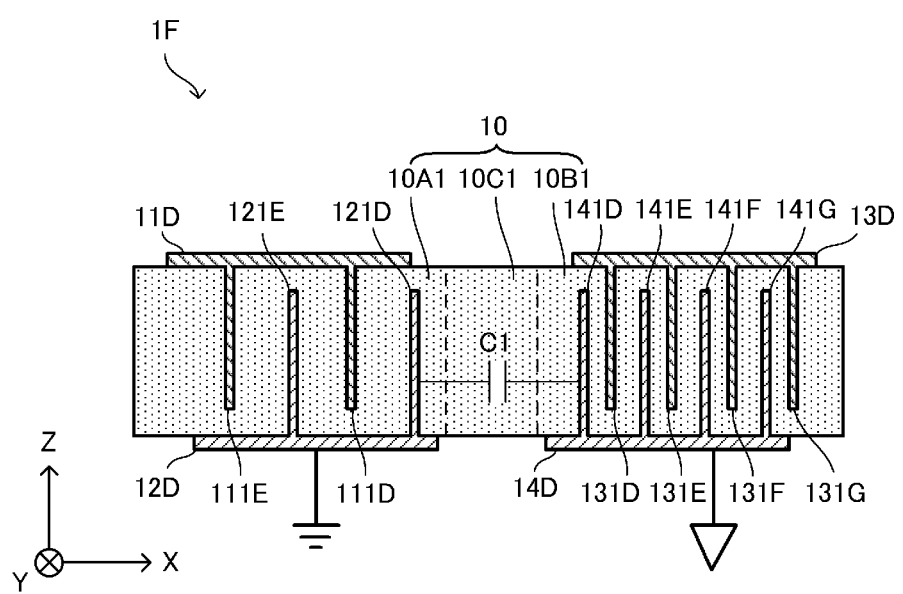
FIG. 35 illustrates the configuration of a piezoelectric transformer according to a tenth exemplary embodiment.

FIG. 35 illustrates the configuration of a piezoelectric transformer 1F according to a tenth exemplary embodiment.

The piezoelectric transformer 1F includes a piezoelectric element 10 having a rectangular parallelepiped shape. The piezoelectric element 10 is formed as, for example, a laminate of PZT ceramic sheets. In the following description, the longitudinal direction, the width direction, and the thickness directions will be respectively defined as the X-axis direction, the Y-axis direction, and the Z-axis direction. The piezoelectric element 10 has an input region 10A1, an output region 10B1, and an insulating region 10C1 that are defined along the X-axis. More specifically, the input region 10A1 and the output region 10B1 are located in opposite end portions of the piezoelectric element 10 with the insulating region 10C1 interposed therebetween. That is, the input region 10A1 and the output region 10B1 are insulated by the insulating region 10C1.

The input region 10A1 and the output region 10B1 are each polarized in the X-axis direction. The poling process in this case is performed by, for example, applying a voltage of 2 kV/mm to the piezoelectric element 10 in an insulating oil at 170° C. The input region 10A1 and the output region 10B1 may be polarized in either the same direction or opposite directions.

An input-side first outer electrode 11D and an input-side second outer electrode 12D are disposed on upper and lower surfaces of the input region 10A1 located opposite to each other with respect to the Z-axis direction. An alternating-current voltage output circuit (not illustrated) is connected to the input-side first outer electrode 11D to apply an alternating-current voltage to the input-side first outer electrode 11D. The input-side second outer electrode 12D is connected to an input-side reference potential.

The input-side first outer electrode 11D is provided with a plurality of planar input-side first inner electrodes 111D and 111E. That is, the input-side first outer electrode 11D and the input-side first inner electrodes 111D and 111E are at the same potential. The input-side second outer electrode 12D is provided with a plurality of planar input-side second inner electrodes 121D and 121E. That is, the input-side second outer electrode 12D and the input-side second inner electrodes 121D and 121E are at the same potential.

The input-side first inner electrodes 111D and 111E, and the input-side second inner electrodes 121D and 121E have substantially the same size, and are disposed orthogonal to the X-axis direction, which is the direction of polarization. The input-side first inner electrodes 111D and 111E, and the input-side second inner electrodes 121D and 121E are arranged alternately in the X-axis direction. More specifically, the input-side second inner electrode 121D, the input-side first inner electrode 111D, the input-side second inner electrode 121E, and the input-side first inner electrode 111E are arranged in this order in the X-axis direction from the insulating region 10C1.

An output-side first outer electrode 13D and an output-side second outer electrode 14D are disposed on upper and lower surfaces of the output region 10B1 located opposite to each other with respect to the Z-axis direction. A load (not illustrated) is connected to the output-side first outer electrode 13D. The output-side second outer electrode 14D is connected to an output-side reference potential. The load connected to the output-side first outer electrode 13D operates with reference to the output-side reference potential. The output-side reference potential differs from the input-side reference potential.

The output-side first outer electrode 13D is connected with a plurality of planar output-side first inner electrodes 131D to 131G. That is, the output-side first outer electrode 13D and the output-side first inner electrodes 131D to 131G are at the same potential. The output-side second outer electrode 14D is connected with a plurality of planar output-side second inner electrodes 141D to 141G. That is, the output-side second outer electrode 14D and the output-side second inner electrodes 141D to 141G are at the same potential.

The output-side first inner electrodes 131D to 131G and the output-side second inner electrodes 141D to 141G have substantially the same size, and are disposed orthogonal to the X-axis direction, which is the direction of polarization. The output-side first inner electrodes 131D to 131G and the output-side second inner electrodes 141D to 141G are disposed alternately in the X-axis direction. More specifically, the output-side second inner electrode 141D, the output-side first inner electrode 131D, the output-side second inner electrode 141E, the output-side first inner electrode 131E, the output-side second inner electrode 141F, the output-side first inner electrode 131F, the output-side second inner electrode 141G and the output-side first inner electrode 131G are arranged in this order in the X-axis direction from the insulating region 10C1.

With the piezoelectric transformer 1F configured as described above, application of voltage between the input-side first outer electrode 11D and the input-side second outer electrode 12D creates an electric field between the input-side first inner electrodes 111D and 111E, and the input-side second inner electrodes 121D and 121E. That is, an electric field is applied to the input region 10A1 in the polarization direction. At this time, for example, the direction of polarization between the input-side first inner electrode 111D and the input-side second inner electrode 121E, and the direction of polarization between the input-side first inner electrode 111E and the input-side second inner electrode 121E are opposite to each other. Then, due to the inverse piezoelectric effect, a longitudinal vibration is excited in the polarization direction, that is, in the X-axis direction of the piezoelectric element 10.

The excited longitudinal vibration causes a mechanical strain to develop in the output region 10B1 in the X-axis direction (polarization direction). As a result, a potential difference is generated in the polarization direction due to the longitudinal piezoelectric effect. That is, a potential difference is generated between the output-side first inner electrodes 131D to 131G and the output-side second inner electrodes 141D to 141G. At this time, for example, the direction of polarization between the output-side first inner electrode 131D and the output-side second inner electrode 141D, and the direction of polarization between the output-side first inner electrode 131D and the output-side second inner electrode 141E are opposite to each other. A low voltage is then output from the output-side first outer electrode 13D.

The piezoelectric transformer 1F configured as described above ensures insulation between the input region 10A1 and the output region 10B1, and helps to minimize propagation of an undesired signal such as noise between the input-side first inner electrode 111D and the output-side first inner electrode 131D. The reason for this will be described below.

The input-side second inner electrode 121D and the output-side second inner electrode 141D are interposed between the input-side first inner electrode 111D and the output-side first inner electrode 131D, which are located opposite to each other. The presence of the input-side second inner electrode 121D and the output-side second inner electrode 141D minimizes formation of stray capacitance between the input-side first inner electrode 111D and the output-side first inner electrode 131D.

Suppose that a stray capacitance is generated between the input-side first inner electrode 111D and the output-side first inner electrode 131D. This causes the two electrodes 121D and 141D to capacitively couple to each other. Consequently, if an undesired signal such as noise is superimposed on an alternating-current voltage applied to the input-side first outer electrode 11D, due to the capacitive coupling, the undesired signal is propagated from the input-side first inner electrode 111D to the output-side first inner electrode 131D. Then, the undesired signal is output from the output-side first outer electrode 13D, which is at the same potential as the output-side first inner electrode 131D, to the load connected to the output-side first outer electrode 13D.

Accordingly, the above-mentioned configuration is employed to minimize the occurrence of stray capacitance between the input-side first inner electrode 111D and the output-side first inner electrode 131D. This helps to minimize propagation of an undesired signal such as noise between the input-side first inner electrode 111D and the output-side first inner electrode 131D.

The piezoelectric transformer 1F also makes it possible to reduce fluctuations in output-side reference potential. The reason for this will be described below.

For example, if the input-side reference potential is the ground, and there is a difference between the input-side reference potential and the output-side reference potential, then the output-side reference potential is floating with respect to the input-side reference potential (ground). If the user touches (operates) the load connected to the output-side first outer electrode 13D in this state, current flows through the user and the ground, causing the output-side reference potential to fluctuate in some cases. This may cause malfunction of the load connected to the output-side first outer electrode 13D.

Accordingly, in the tenth embodiment, the input-side second inner electrode 121D and the output-side second inner electrode 141D are placed at a distance shorter than the distance between the input-side first inner electrode 111D and the output-side first inner electrode 131D. As a result, a stray capacitance C1 is generated between the input-side second inner electrode 121D and the output-side second inner electrode 141D. Due to the stray capacitance C1, the input-side second inner electrode 121D and the output-side second inner electrode 141D capacitively couple to each other, and the difference in alternating-current potential applied between the input-side second outer electrode 12D and the output-side second outer electrode 14D decreases. That is, the output-side reference potential becomes stable. This helps to prevent the above-mentioned malfunction of the load connected to the output-side first outer electrode 13D.

Although the piezoelectric transformer 1F according to the tenth embodiment is configured such that the distance between the input-side second inner electrode 121D and the output-side second inner electrode 141D is shorter than the distance between the input-side first inner electrode 111D and the output-side first inner electrode 131D, this should not be construed restrictively. It suffices that the stray capacitance generated between the input-side second inner electrode 121D and the output-side second inner electrode 141D be greater than the stray capacitance generated between the input-side first inner electrode 111D and the output-side first inner electrode 131D.

Eleventh Embodiment

Figure 36A:
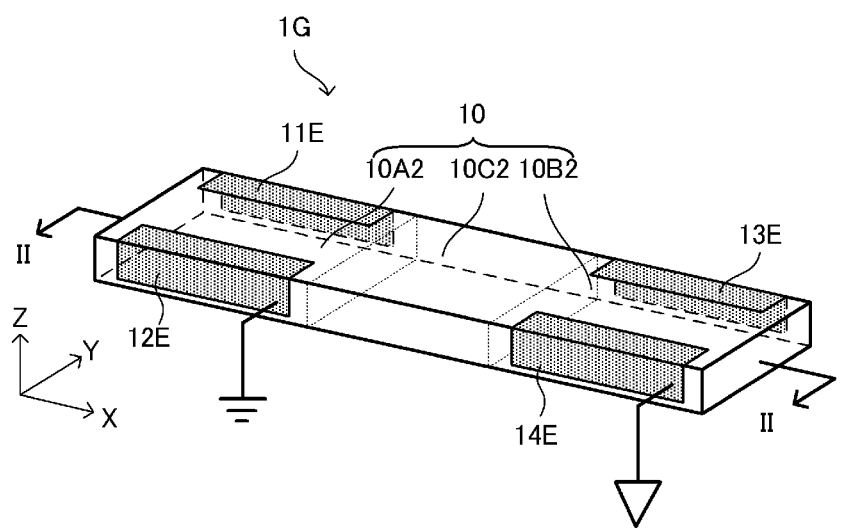
FIG. 36(A) is a perspective view of a piezoelectric transformer according to an eleventh exemplary embodiment.
Figure 36B:
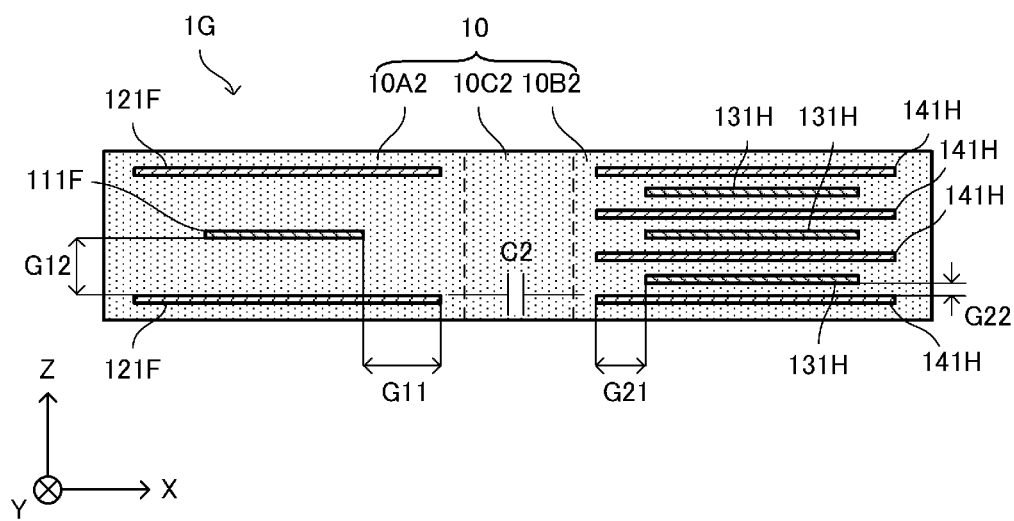
FIG. 36(B) is a cross-sectional view taken along a line II-II of FIG. 36(A).

FIG. 36(A) is a perspective view of a piezoelectric transformer 1G according to an eleventh exemplary embodiment, and FIG. 36(B) is a cross-sectional view taken along a line II-II of FIG. 36(A).

The piezoelectric transformer 1G includes a piezoelectric element 10 having a rectangular parallelepiped shape. The piezoelectric element 10 is formed as, for example, a laminate of PZT ceramic sheets. In the following description, the longitudinal direction, the width direction, and the thickness directions will be respectively defined as the X-axis direction, the Y-axis direction, and the Z-axis direction. The piezoelectric element 10 has an input region 10A2, an output region 10B2, and an insulating region 10C2 that are defined along the X-axis. More specifically, the input region 10A2 and the output region 10B2 are located in opposite end portions of the piezoelectric element 10 with the insulating region 10C2 interposed therebetween. That is, the input region 10A2 and the output region 10B2 are insulated from each other.

The input region 10A2 and the output region 10B2 are each polarized in the Z-axis direction.

An input-side first outer electrode 11E and an input-side second outer electrode 12E are disposed on lateral surfaces of the input region 10A2 located opposite to each other in the Y-axis direction. An alternating-current voltage output circuit (not illustrated) is connected to the input-side first outer electrode 11E to apply an alternating-current voltage to the input-side first outer electrode 11E. The input-side second outer electrode 12E is connected to an input-side reference potential.

The input-side first outer electrode 11E is connected with a plurality of planar input-side first inner electrodes 111F. That is, the input-side first outer electrode 11E and the input-side first inner electrode 111F are at the same potential. The input-side second outer electrode 12E is connected with a plurality of planar input-side second inner electrodes 121F. That is, the input-side second outer electrode 12E and the input-side second inner electrode 121F are at the same potential.

The input-side first inner electrode 111F and the input-side second inner electrode 121F are disposed orthogonal to the Z-axis direction, which is the polarization direction. The input-side first inner electrode 111F and the input-side second inner electrode 121F are arranged alternately in the Z-axis direction. The input-side second inner electrode 121F has a length in the X-axis direction greater than the length of the input-side first inner electrode 111F. With respect to the X-axis direction, an end portion of the input-side second inner electrode 121F near the insulating portion is located closer to the insulating region 10C2 than is an end portion of the input-side first inner electrode 111F near the insulating portion.

Now, let G11 represent the distance in the X-axis direction from an end portion of the input-side first inner electrode 111F near the insulating region 10C2, to an end portion of the input-side second inner electrode 121F near the insulating region 10C2, and let G12 represent the distance between the layer where the input-side first inner electrode 111F is located and the layer where the input-side second inner electrode 121F is located. In this case, the input-side first inner electrode 111F and the input-side second inner electrode 121F are disposed so as to satisfy the following condition: G11>G12.

An output-side first outer electrode 13E and an output-side second outer electrode 14E are disposed on lateral surfaces of the output region 10B2 located opposite to each other with respect to the Y-axis direction. A load (not illustrated) is connected to the output-side first outer electrode 13E. The output-side second outer electrode 14E is connected to an output-side reference potential. The load connected to the output-side first outer electrode 13E operates with reference to the output-side reference potential. The output-side reference potential differs from the input-side reference potential.

The output-side first outer electrode 13E is provided with a plurality of planar output-side first inner electrodes 131H. That is, the output-side first outer electrode 13E and the output-side first inner electrode 131H are at the same potential. The output-side second outer electrode 14E is provided with a plurality of planar output-side second inner electrodes 141H. That is, the output-side second outer electrode 14E and the output-side second inner electrode 141H are at the same potential.

The output-side first inner electrode 131H and the output-side second inner electrode 141H are disposed orthogonal to the Z-axis direction, which is the polarization direction. The output-side first inner electrode 131H and the output-side second inner electrode 141H are arranged alternately in the Z-axis direction. The output-side second inner electrode 141H has a length in the X-axis direction greater than the length of the output-side first inner electrode 131H. With respect to the X-axis direction, the output-side second inner electrode 141H is located closer to the insulating region 10C2 than is the output-side first inner electrode 131H.

The output-side second inner electrode 141H is located in the same layer as the input-side second inner electrode 121F. That is, the input-side second inner electrode 121F and the output-side second inner electrode 141H are located in the same plane.

Now, let G21 represent the distance in the X-axis direction from an end portion of the output-side first inner electrode 131H near the insulating region 10C2, to an end portion of the output-side second inner electrode 141H near the insulating region 10C2, and let G22 represent the distance between the layer where the output-side first inner electrode 131H is located and the layer where the output-side second inner electrode 141H is located. In this case, the output-side first inner electrode 131H and the output-side second inner electrode 141H are disposed so as to satisfy the following condition: G21>G22.

With the piezoelectric transformer 1G configured as described above, application of voltage to the input-side first outer electrode 11E creates an electric field between the input-side first inner electrode 111F, which is at the same potential as the input-side first outer electrode 11E, and the input-side second inner electrode 121F. That is, an electric field is applied to the input region 10A2 in the polarization direction. Then, due to the inverse piezoelectric effect, a vibration is excited in a direction orthogonal to the polarization direction, that is, in the X-axis direction of the piezoelectric element 10.

Excitation of a vibration in the X-axis direction causes a mechanical strain to develop in the output region 10B2 in the Z-axis direction (polarization direction). As a result, a potential difference is generated in the polarization direction due to the transverse piezoelectric effect. As a result of this potential difference, the output region 10B2 becomes a low voltage portion, and a low voltage is output from the output-side first outer electrode 13E.

As with the tenth embodiment described above, the distance between the input-side first inner electrode 111F and the output-side first inner electrode 131H is increased to reduce the stray capacitance generated between the electrodes 111F and 131H, thus preventing coupling between the electrodes 111F and 131H. This helps to minimize propagation of an undesired signal such as noise between the input-side first inner electrode 111F and the output-side first inner electrode 131H. Since the input-side first inner electrode 111F and the output-side first inner electrode 131H are not positioned with their planes facing other, the stray capacitance generated between the electrodes 111F and 131H can be reduced, thus preventing coupling between the electrodes 111F and 131H.

A stray capacitance C2 is generated between the input-side second inner electrode 121F and the output-side second inner electrode 141H. The electrodes 121F and 141H are located in the same plane, with the stray capacitance C2 generated between the electrodes 121F and 141H. Due to the stray capacitance C2, the input-side second inner electrode 121F and the output-side first inner electrode 131H capacitively couple to each other, and the difference in alternating-current potential applied between the input-side second outer electrode 12E and the output-side second outer electrode 14E decreases. That is, the output-side reference potential becomes stable. This helps to prevent the above-mentioned malfunction of the load connected to the output-side first outer electrode 13E.

Twelfth Embodiment

The following description of a twelfth embodiment will be directed to a piezoelectric transformer module including two piezoelectric transformers.

Figure 37:
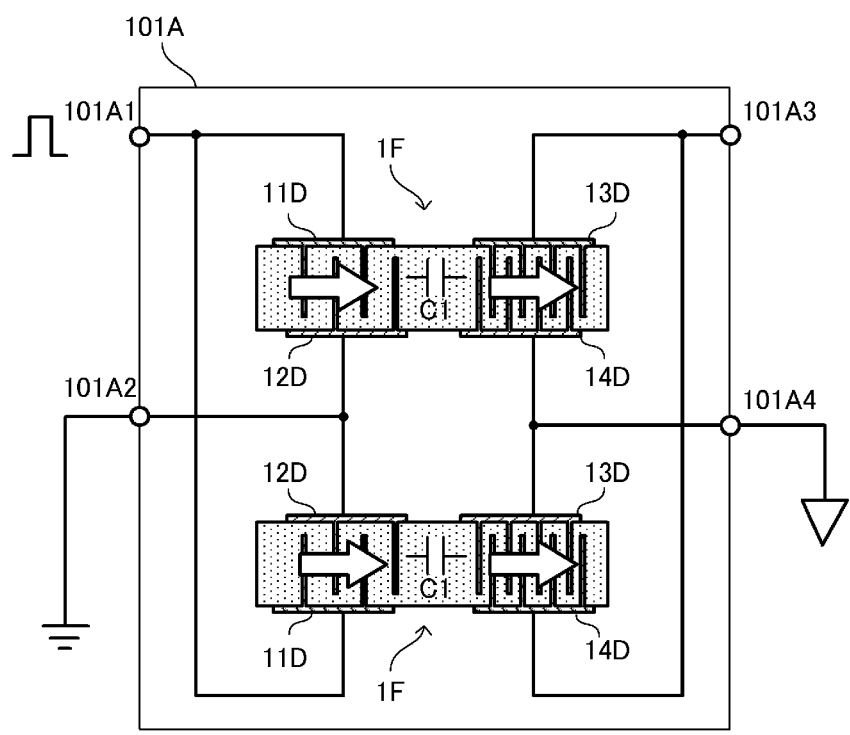
FIG. 37 illustrates a piezoelectric transformer module according to a twelfth exemplary embodiment.

FIG. 37 illustrates a piezoelectric transformer module 101A according to the twelfth exemplary embodiment. As shown, the piezoelectric transformer module 101A includes input portions 101A1 and 101A2, and output portions 101A3 and 101A4. An alternating-current voltage is input to the input portion 101A1. The input portion 101A2 is connected to an input-side reference potential. The output portion 101A3 is connected to a load (not illustrated), and the output portion 101A4 is connected to an output-side reference potential.

The piezoelectric transformer module 101A includes two piezoelectric transformers 1F according to the tenth embodiment. Arrows in FIG. 37 indicate polarization direction. As illustrated in FIG. 37, the input side (the input region 10A1 illustrated in FIG. 35) and output side (the output region 10B1 illustrated in FIG. 35) of the piezoelectric transformer 1F are polarized in the same direction.

The input-side first outer electrode 11D of each of the two piezoelectric transformers 1F is connected to the input portion 101A1. The input-side second outer electrode 12D is connected to the input portion 101A2. That is, the input side of the piezoelectric transformer 1F is connected in parallel to the input portion 101A1, and a voltage of the same magnitude is applied to each of the two piezoelectric transformers 1F. This configuration ensures that the two piezoelectric transformers 1F are driven in a well-balanced manner.

The output-side first outer electrode 13D of the piezoelectric transformer 1F is connected to the output portion 101A3, and the output-side second outer electrode 14D is connected to the output portion 101A4.

When the piezoelectric transformer module 101A configured as described above receives an input of an alternating-current voltage from the input portion 101A1, a voltage is applied to the input-side first outer electrode 11D of the piezoelectric transformer 1F, and a low voltage is output from the output-side first outer electrode 13D. Then, the output voltage is output to the load connected to the output portion 101A3.

As described above with reference to the tenth embodiment, by minimizing capacitive coupling between the input-side first outer electrode 11D and output-side first outer electrode 13D of the piezoelectric transformer 1F to ensure insulation, propagation of an undesired signal such as noise between the input-side first outer electrode 11D and the output-side first outer electrode 13D can be minimized. That is, even if an undesired signal such as noise is superimposed on the alternating-current voltage input from the input portion 101A1, such a signal is not output from the output portion 101A3. This helps to prevent malfunction of the load connected to the output portion 101A3.

As described above with reference to the tenth embodiment, the input-side second outer electrode 12D and output-side second outer electrode 14D of the piezoelectric transformer 1F are capacitively coupled to each other by the stray capacitance C1. As a result, the output-side reference potential and the input-side reference potential are substantially the same alternating-current potential. This helps to minimize fluctuations in output-side reference potential, thus stabilizing the output-side reference potential.

Further, in the twelfth embodiment, the stray capacitance C1 is connected in parallel between the input portion 101A2 and the output portion 101A4. This helps to reduce the difference between the input-side reference potential and the output-side reference potential, thus enabling further stabilization of the output-side reference potential.

The use of two piezoelectric transformers 1F for the piezoelectric transformer module 101A enables the piezoelectric transformer module 101A to handle greater electric power.

Thirteenth Embodiment

Figure 38:
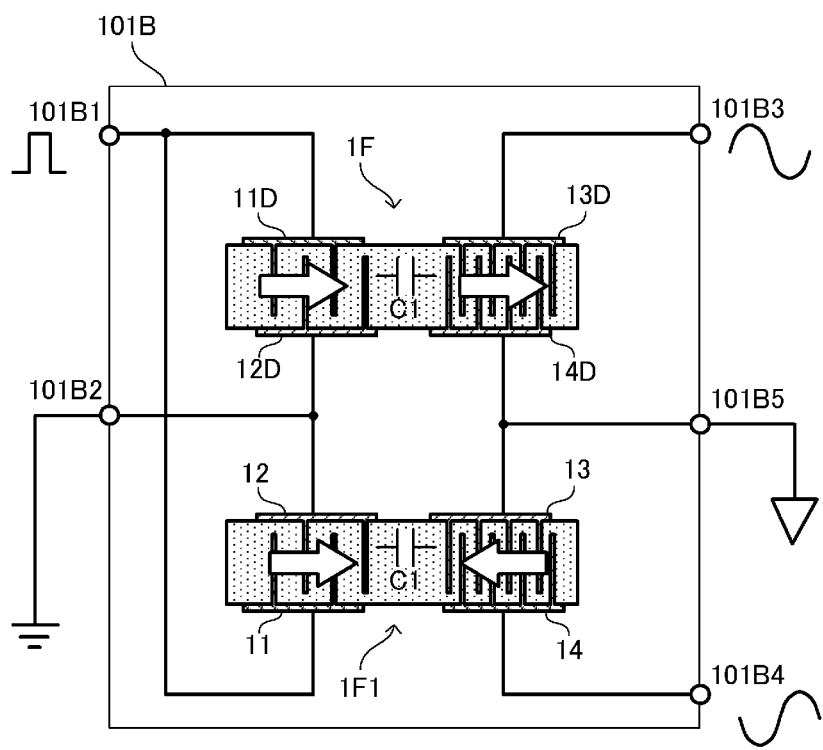
FIG. 38 illustrates a piezoelectric transformer module according to a thirteenth exemplary embodiment.

FIG. 38 illustrates a piezoelectric transformer module 101B according to a thirteenth exemplary embodiment. As shown, the piezoelectric transformer module 101B includes input portions 101B1 and 101B2, and output portions 101B3, 101B4, and 101B5. An alternating-current voltage is input to the input portion 101B1. The input portion 101B2 is connected to an input-side reference potential. The output portions 101B3 and 101B4 are each connected to a load (not illustrated), and the output portion 101B5 is connected to an output-side reference potential.

The piezoelectric transformer module 101B includes the piezoelectric transformer 1F and a piezoelectric transformer 1F1. The piezoelectric transformer 1F1, which has substantially the same configuration as the piezoelectric transformer 1F, differs from the piezoelectric transformer 1F in the direction of polarization (indicated by arrows in FIG. 37). More specifically, the input side (the input region 10A1 illustrated in FIG. 35) and output side (the output region 10B1 illustrated in FIG. 35) of the piezoelectric transformer 1F1 are polarized in opposite directions.

The input-side first outer electrode 11D of each of the piezoelectric transformers 1F and 1F1 is connected to the input portion 101B1. The input-side second outer electrode 12D is connected to the input portion 101B2. That is, the input side of the piezoelectric transformer 1F is connected in parallel to the input portion 101B1, and a voltage of the same magnitude is applied to each of the two piezoelectric transformers 1F and 1F1. This configuration ensures that the two piezoelectric transformers 1F and 1F1 are driven in a well-balanced manner.

The output-side first outer electrode 13D of the piezoelectric transformer 1F is connected to the output portion 101B3, and the output-side first outer electrode 13D of the piezoelectric transformer 1F1 is connected to the output portion 101B4. The output-side second outer electrode 14D of each of the piezoelectric transformers 1F and 1F1 is connected to the output portion 101B5.

When the piezoelectric transformer module 101B configured as described above receives an input of an alternating-current voltage from the input portion 101B1, the voltage is applied to the input-side first outer electrode 11D of each of the piezoelectric transformers 1F and 1F1, and a low voltage is output from the output-side first outer electrode 13D. At this time, the respective output sides of the piezoelectric transformers 1F and 1F1 are polarized in opposite directions. Thus, voltages that are opposite in phase are output from the respective output-side first outer electrodes 13D of the piezoelectric transformers 1F and 1F1. That is, the piezoelectric transformer module 101B is capable of outputting a differential voltage.

As with the twelfth embodiment, the piezoelectric transformer module 101B according to the thirteenth embodiment ensures that even if an undesired signal such as noise is superimposed on the alternating-current voltage input from the input portion 101B1, such a signal is not output from the output portions 101B3 and 101B4. This helps to prevent malfunction of the load connected to the output portion 101B3. Further, with the piezoelectric transformer module 101B according to the thirteenth embodiment, fluctuations in output-side reference potential can be reduced to stabilize the output-side reference potential.

In the thirteenth embodiment, the stray capacitance C1 is connected in parallel between the input portion 101B2 and the output portion 101B5. This helps to reduce the difference between the input-side reference potential and the output-side reference potential, thus enabling further stabilization of the output-side reference potential.

Further, the use of two piezoelectric transformers 1F and 1F1 for the piezoelectric transformer module 101B enables the piezoelectric transformer module 101B to handle greater electric power.

Fourteenth Embodiment

Figure 39:
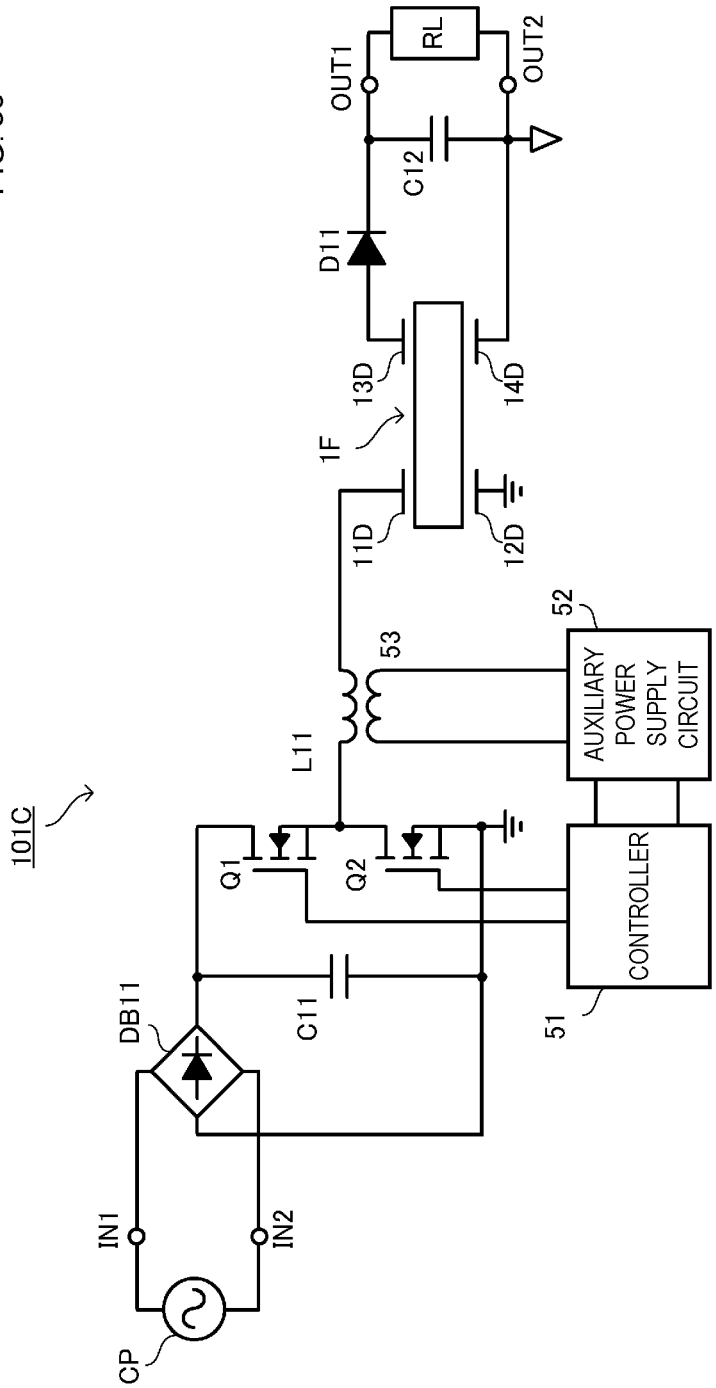
FIG. 39 is a circuit diagram of an AC adapter according to a fourteenth exemplary embodiment.

FIG. 39 is a circuit diagram of an AC adapter 101C according to a fourteenth exemplary embodiment.

The AC adapter 101C includes input portions IN1 and IN2 connected to a commercial power supply CP and to which an alternating-current voltage is input from the commercial power supply CP, and output portions OUT1 and OUT2 that are connected with a load RL and output a direct-current voltage to the load RL. The input portions IN1 and IN2 represent an example of "commercial power supply input portion" according to the present disclosure.

A diode bridge DB11 is connected to the input portions IN1 and IN2. A smoothing capacitor C11 is connected on the output side of the diode bridge DB11. An alternating-current voltage input from each of the input portions IN1 and IN2 is rectified and smoothed by the diode bridge DB11 and the smoothing capacitor C11. The diode bridge DB11 and the smoothing capacitor C11 represent an example of "input-side rectifying and smoothing circuit" according to the present disclosure.

Switching elements Q1 and Q2 in series are connected to each of the diode bridge DB11 and the smoothing capacitor C11. Although the switching elements Q1 and Q2 are n-type MOS-FETs in FIG. 39, the switching elements Q1 and Q2 may be IGBTs, bipolar transistors, or other transistors. The voltage rectified and smoothed by components such as the diode bridge DB11 is converted into a rectangular-wave voltage by the switching action of the switching elements Q1 and Q2. The switching elements Q1 and Q2 connected in series represent an example of "switching circuit" according to the present disclosure.

A controller 51 is connected to the gate of each of the switching elements Q1 and Q2. Through feedback control, the controller 51 checks whether the load RL connected to the output portions OUT1 and OUT2 is light or heavy, and in accordance with the result of this check, the controller 51 sets the switching frequency of the switching elements Q1 and Q2 so that the supply voltage to the load RL is constant. The controller 51 generates a gate voltage, and applies the gate voltage to the switching elements Q1 and Q2 to cause the switching elements Q1 and Q2 to switch on and off at preset intervals of time.

The piezoelectric transformer 1F according to the tenth embodiment is connected to the switching elements Q1 and Q2. The input-side first outer electrode 11D of the piezoelectric transformer 1F is connected to the connection point of the switching elements Q1 and Q2 via an inductor L11. The input-side second outer electrode 12D of the piezoelectric transformer 1F is connected to a reference potential (ground) described later.

The output-side first outer electrode 13D of the piezoelectric transformer 1F is connected to a diode D11. A smoothing capacitor C12 is connected to the diode D11. Further, the output portion OUT1 is connected to the diode D11. The diode D11 and the smoothing capacitor C12 represent an example of "output-side rectifying and smoothing circuit" according to an exemplary aspect.

An auxiliary winding 53 is added to the input-side first outer electrode 11D of the piezoelectric transformer 1F, and to the inductor L11 disposed between the switching elements Q1 and Q2. An output voltage from the auxiliary winding 53 is rectified and smoothed by an auxiliary power supply circuit 52 to generate a direct-current power supply voltage for the controller 51. The controller 51 thus operates with the generated direct-current power supply voltage.

Miniaturization of the AC adapter 101C is achieved by using the piezoelectric transformer 1F. As described above with reference to the tenth embodiment, the piezoelectric transformer 1F makes it possible to minimize propagation of an undesired signal such as noise between the input side and the output side. This ensures that even if switching noise is output from the switching elements Q1 and Q2, the noise is not output to the load RL. Further, the output-side reference potential can be fixed to the input-side reference potential to stabilize the output-side reference potential. This helps to prevent malfunction of the load RL.

In FIG. 39, the circuit including the switching circuit formed by the switching elements Q1 and Q2, the piezoelectric transformer 1F, the diode D11, and the smoothing capacitor C12 corresponds to "DC-DC converter" according to the present disclosure. The circuit including the diode bridge DB11, the switching circuit formed by the switching elements Q1 and Q2, the piezoelectric transformer 1F, the diode D11, and the smoothing capacitor C12 corresponds to "AC-DC converter" according to the present disclosure.

The piezoelectric transformer and the piezoelectric transformer module, and the DC-DC converter, the AC-DC converter, and the AC adapter each including the piezoelectric transformer and the piezoelectric transformer module according to each of the tenth to fourteenth embodiments may not necessarily have the configuration described above but may be of any configuration including the features described below.

(Feature 1)

A piezoelectric transformer including a piezoelectric body having an input portion that is polarized, an output portion that is polarized, and an insulating portion disposed between the input portion and the output portion; an input-side first inner electrode and an input-side second inner electrode that are disposed in the input portion and located opposite to each other; and an output-side first inner electrode and an output-side second inner electrode that are disposed in the output portion and located opposite to each other, wherein the input-side second inner electrode is connected to an input-side reference potential, and at least a part of the input-side second inner electrode is located closer to the insulating portion than is the input-side first inner electrode, and wherein the output-side second inner electrode is connected to an output-side reference potential, and at least a part of the output-side second inner electrode is located closer to the insulating portion than is the output-side first inner electrode.

(Feature 2)

The piezoelectric transformer according to Feature 1, wherein the input portion and the output portion are polarized in a direction in which the input portion and the output portion are located opposite to each other, and wherein each of the input-side first inner electrode, the input-side second inner electrode, the output-side first inner electrode, and the output-side second inner electrode is a planar electrode having a principal surface, the principal surface being disposed orthogonal to the direction in which the input portion and the output portion are located opposite to each other.

(Feature 3)

The piezoelectric transformer according to Feature 1, wherein the input portion and the output portion are polarized in a direction orthogonal to a direction in which the input portion and the output portion are located opposite to each other, and wherein each of the input-side first inner electrode, the input-side second inner electrode, the output-side first inner electrode, and the output-side second inner electrode is a planar electrode having a principal surface, the principal surface being disposed parallel to the direction in which the input portion and the output portion are located opposite to each other.

(Feature 4)

The piezoelectric transformer according to Feature 3, wherein the input-side second inner electrode has a length greater than a length of the input-side first inner electrode with respect to the direction in which the input portion and the output portion are located opposite to each other.

(Feature 5)

The piezoelectric transformer according to Feature 3 or 4, wherein the output-side second inner electrode has a length greater than a length of the output-side first inner electrode with respect to the direction in which the input portion and the output portion are located opposite to each other.

(Feature 6)

The piezoelectric transformer according to any one of Features 3 to 5, wherein a condition G11>G12 is satisfied, wherein G11 represents a distance, in the direction in which the input portion and the output portion are located opposite to each other, between an end portion of the input-side first inner electrode near the insulating portion, and an end portion of the input-side second inner electrode near the insulating portion, and wherein G12 represents a distance, in the direction in which the input portion and the output portion are located opposite to each other, between a layer where the input-side first inner electrode is located and a layer where the input-side second inner electrode is located.

(Feature 7)

The piezoelectric transformer according to any one of Features 3 to 6, wherein a condition G21>G22 is satisfied, wherein G21 represents a distance, in the direction in which the input portion and the output portion are located opposite to each other, between an end portion of the output-side first inner electrode near the insulating portion, and an end portion of the output-side second inner electrode near the insulating portion, and wherein G22 represents a distance, in the direction in which the input portion and the output portion are located opposite to each other, between a layer where the output-side first inner electrode is located and a layer where the output-side second inner electrode is located.

(Feature 8)

A piezoelectric transformer including: a piezoelectric body having an input portion that is polarized, an output portion that is polarized, and an insulating portion disposed between the input portion and the output portion; an input-side first inner electrode and an input-side second inner electrode that are disposed in the input portion and located opposite to each other; and an output-side first inner electrode and an output-side second inner electrode that are disposed in the output portion and located opposite to each other, wherein the input-side second inner electrode is connected to an input-side reference potential, wherein the output-side second inner electrode is connected to an output-side reference potential, and wherein a capacitance generated between the input-side second inner electrode and the output-side second inner electrode is greater than a capacitance generated between the input-side first inner electrode and the output-side first inner electrode.

(Feature 9)

A piezoelectric transformer module including two piezoelectric transformers, wherein each of the piezoelectric transformers includes a piezoelectric body having an input portion that is polarized, an output portion that is polarized, and an insulating portion disposed between the input portion and the output portion, an input-side first inner electrode and an input-side second inner electrode that are disposed in the input portion and located opposite to each other, and an output-side first inner electrode and an output-side second inner electrode that are disposed in the output portion and located opposite to each other, wherein the input-side second inner electrode is connected to an input-side reference potential, and at least a part of the input-side second inner electrode is located closer to the insulating portion than is the input-side first inner electrode, wherein the output-side second inner electrode is connected to an output-side reference potential, and at least a part of the output-side second inner electrode is located closer to the insulating portion than is the output-side first inner electrode, wherein the input-side second inner electrode of each of the two piezoelectric transformers is connected to the input-side reference potential, and wherein the output-side second inner electrode of each of the two piezoelectric transformers is connected to the output-side reference potential.

(Feature 10)

The piezoelectric transformer module according to Feature 9, wherein in one of the two piezoelectric transformers, the input portion and the output portion of the piezoelectric body are polarized in the same direction, and wherein in the other one of the two piezoelectric transformers, the input portion and the output portion of the piezoelectric body are polarized in opposite directions.

(Feature 11)

A DC-DC converter including: a switching circuit including a switching element that is switched on and off to convert a direct-current voltage into an alternating-current voltage; a piezoelectric transformer having an input portion to which the switching circuit is connected, and an output portion, the piezoelectric transformer being configured to transform a voltage input to the input portion and outputs the transformed voltage from the output portion; and an output-side rectifying and smoothing circuit that rectifies and smoothes the voltage output from the output portion, wherein the piezoelectric transformer includes a piezoelectric body having an input portion that is polarized, an output portion that is polarized, and an insulating portion disposed between the input portion and the output portion, an input-side first inner electrode and an input-side second inner electrode that are disposed in the input portion and located opposite to each other, and an output-side first inner electrode and an output-side second inner electrode that are disposed in the output portion and located opposite to each other, wherein the input-side second inner electrode is connected to an input-side reference potential, and at least a part of the input-side second inner electrode is located closer to the insulating portion than is the input-side first inner electrode, and wherein the output-side second inner electrode is connected to an output-side reference potential, and at least a part of the output-side second inner electrode is located closer to the insulating portion than is the output-side first inner electrode.

(Feature 12)

An AC-DC converter including: an input-side rectifying and smoothing circuit that converts an alternating-current voltage into a direct-current voltage; a switching circuit including a switching element that is switched on and off to convert the direct-current voltage from the input-side rectifying and smoothing circuit into an alternating-current voltage; a piezoelectric transformer having an input portion to which the switching circuit is connected, and an output portion, the piezoelectric transformer being configured to transform a voltage input to the input portion and outputs the transformed voltage from the output portion; and an output-side rectifying and smoothing circuit that rectifies and smoothes the voltage output from the output portion, wherein the piezoelectric transformer includes a piezoelectric body having an input portion that is polarized, an output portion that is polarized, and an insulating portion disposed between the input portion and the output portion, an input-side first inner electrode and an input-side second inner electrode that are disposed in the input portion and located opposite to each other, and an output-side first inner electrode and an output-side second inner electrode that are disposed in the output portion and located opposite to each other, wherein the input-side second inner electrode is connected to an input-side reference potential, and at least a part of the input-side second inner electrode is located closer to the insulating portion than is the input-side first inner electrode, and wherein the output-side second inner electrode is connected to an output-side reference potential, and at least a part of the output-side second inner electrode is located closer to the insulating portion than is the output-side first inner electrode.

(Feature 13)

An AC adapter including: a commercial power supply input portion connected to a commercial power supply to receive an input of a voltage from the commercial power supply; an input-side rectifying and smoothing circuit that rectifies and smoothes the voltage input from the commercial power supply input portion; a switching circuit that converts the voltage rectified and smoothed by the input-side rectifying and smoothing circuit into an alternating-current voltage; a piezoelectric transformer having an input portion to which the switching circuit is connected, and an output portion, the piezoelectric transformer being configured to transform a voltage input to the input portion and outputs the transformed voltage from the output portion; an output-side rectifying and smoothing circuit that rectifies and smoothes the voltage output from the output portion; a controller that controls the switching circuit; and an auxiliary power supply circuit that is disposed between the commercial power supply input portion and the input portion of the piezoelectric transformer, and supplies electric power to the controller, wherein the piezoelectric transformer includes a piezoelectric body having an input portion that is polarized, an output portion that is polarized, and an insulating portion disposed between the input portion and the output portion, an input-side first inner electrode and an input-side second inner electrode that are disposed in the input portion and located opposite to each other, and an output-side first inner electrode and an output-side second inner electrode that are disposed in the output portion and located opposite to each other, wherein the input-side second inner electrode is connected to an input-side reference potential, and at least a part of the input-side second inner electrode is located closer to the insulating portion than is the input-side first inner electrode, and wherein the output-side second inner electrode is connected to an output-side reference potential, and at least a part of the output-side second inner electrode is located closer to the insulating portion than is the output-side first inner electrode.

Lastly, the foregoing description of the embodiments is intended to be illustrative in all respects and not to be construed as limiting. Various modifications and variations will occur to those skilled in the art. For example, features described with reference to different embodiments may be partially substituted for or combined with each other. The scope of the present invention is defined not by the above embodiments but by the appended claims. Further, the scope of the invention is intended to cover all such variations that may fall within the scope of the appended claims and their equivalents.

REFERENCE SIGNS LIST

AS axis of symmetry
A, B, C, D region
BM1 first support portion
BM2 second support portion
C1 stray capacitance
C11, C12 smoothing capacitor
C2 stray capacitance
CP commercial power supply
D11 diode
DB11 diode bridge
IN1, IN2 input portion
L11 inductor
OUT1, OUT2 output portion
P1, P2 nodal point
Q1, Q2 switching element
RL load
S1 first surface
S2 second surface
1, 1A, 1B, 1C, 1D, 1E, 1F, 1F1, 1G piezoelectric transformer
1AS, 1BS mounting region
1C1 piezoelectric transformer device
2, 2A, 2B, 2C flexible board
2P protective film
2S1, 2S2 space
3 case
4 holding member
10 piezoelectric element
10A, 10A1, 10A2, 10C input region
10B, 10B1, 10B2, 10D output region
10C1, 10C2 insulating region
11, 11A, 11B, 11C, 11D, 11E input-side first outer electrode
12, 12A, 12B, 13C, 12D, 12E input-side second outer electrode
13, 13A, 13B, 13C, 13D, 13E output-side first outer electrode
14, 14A, 14B, 14C, 14D, 14E output-side second outer electrode
15C input-side third outer electrode
16C input-side fourth outer electrode
17C output-side third outer electrode
18C output-side fourth outer electrode
19A, 19B, 19C, 19D insulating film
20F, 20F1, 20F2 frame
20L extended portion
20L1 input-side first extended portion
20L2 input-side second extended portion
20L3 output-side first extended portion
20L4 output-side second extended portion
20R basal portion
20R1 input-side first basal portion
20R2 input-side second basal portion
20R3 output-side first basal portion
20R4 output-side second basal portion
21, 21A, 21B element-mounting terminal
22, 22A, 22B element-mounting terminal
23, 23A, 23B element-mounting terminal
24, 24A, 24B element-mounting terminal
25A, 25B, 26, 27A, 27B, 28 external connection terminal
26A, 26B, 26C, 26D, 26E, 26F conductor pattern 26G input-side first conductor pattern
26H input-side second conductor pattern
26I output-side first conductor pattern
26J output-side second conductor pattern
29A, 29B, 29C, 29D, 29E, 29F external connection terminal
31 first case portion
31C ceiling portion
31S leg portion
31T, 32T top plate portion
32 second case portion
32E engaging portion
32F, 32S securing portion
51 controller
52 auxiliary power supply circuit
53 auxiliary winding
100 board
100A, 100B, 100C, 100D mounting electrode
101, 101A, 101B piezoelectric transformer module
101A1, 101A2 input portion
101A3, 101A4 output portion
101B1, 101B2 input portion
101B3, 101B4, 101B5 output portion
101C AC adapter
106A, 106B electrode
107, 108 inner electrode
111, 111A, 111B, 111C, 111D, 111E, 111F input-side first inner electrode
121, 121A, 121B, 121C, 121D, 121E, 121F input-side second inner electrode
131, 131A, 131B, 131C, 131D, 131E, 131F, 131G 131H output-side first inner electrode
141, 141A, 141B, 141C, 141D, 141E, 141F, 141G 141H output-side second inner electrode
151, 152 insulating film
151C third inner electrode
161C fourth inner electrode
171C third inner electrode
181C fourth inner electrode
200 wiring board
204 inner electrode
214 outer electrode
225, 226 connection terminal
225A, 225B, 226, 227A, 227B, and 228 connection terminal
232S slot
300 mounting structure
400 ceramic body
401, 402, 403, 404 inner electrode
411, 412, 413, and 414 outer electrode

The invention claimed is:

1. A piezoelectric vibration device comprising:
a piezoelectric vibrator that includes a piezoelectric element and an outer electrode on a surface of the piezoelectric element;
a flexible board that includes an element-mounting terminal connected to the outer electrode of the piezoelectric vibrator and an external connection terminal configured to be connected to a wiring board; and
a case that includes a ceiling and a securing member configured to secure the case to the wiring board,
wherein, when the piezoelectric vibration device is mounted on the wiring board, the securing member defines a space between the ceiling and the wiring board to accommodate the piezoelectric vibrator and the flexible board, and the piezoelectric vibrator is suspended inside the case onto the ceiling of the case by a holding member,
wherein the outer electrode is disposed on a first surface of the piezoelectric element, and a second surface of the piezoelectric element opposite the first surface is held to the ceiling of the case, and
wherein the holding member is disposed between a node of mechanical vibration of the piezoelectric vibrator and the ceiling.

2. The piezoelectric vibration device according to claim 1, wherein the securing member of the case is configured to hold the ceiling of the case.

3. The piezoelectric vibration device according to claim 1, wherein the ceiling of the case is a resin molding, and the securing member of the case is a metal molding.

4. The piezoelectric vibration device according to claim 1, wherein the piezoelectric vibrator is a piezoelectric transformer.

5. The piezoelectric vibration device according to claim 4,
wherein the piezoelectric element has a rectangular parallelepiped shape,
wherein the piezoelectric transformer includes an input vibration portion on a first side and an output vibration portion on a second side with respect to a longitudinal direction of the piezoelectric element, and
wherein the piezoelectric vibrator is configured to vibrate in a longitudinal vibration mode.

6. The piezoelectric vibration device according to claim 1,
wherein the piezoelectric vibrator includes a first piezoelectric transformer, and a second piezoelectric transformer,
wherein the flexible board has a first mounting region to which the first piezoelectric transformer is mounted, and a second mounting region to which the second piezoelectric transformer is mounted, with the first and mounting regions being located on opposite sides of an axis of symmetry, and
wherein the respective outer electrodes of each of the first and second piezoelectric transformers include a primary-side first outer electrode, a primary-side second outer electrode, and a secondary-side outer electrode, with the first and second piezoelectric transformers being mounted to the flexible board such that the respective primary-side first outer electrodes, the primary-side second outer electrodes, and the secondary-side outer electrodes of the first and second piezoelectric transformers are line-symmetric to each other with respect to the axis of symmetry.

7. The piezoelectric vibration device according to claim 6, wherein the element-mounting terminal of the flexible board includes:
a first mounting electrode connected to the primary-side first outer electrode of the first piezoelectric transformer,
a second mounting electrode connected to the primary-side second outer electrode of the first piezoelectric transformer,
a third mounting electrode connected to the secondary-side outer electrode of the first piezoelectric transformer,
a fourth mounting electrode connected to the primary-side first outer electrode of the second piezoelectric transformer,
a fifth mounting electrode connected to the primary-side second outer electrode of the second piezoelectric transformer, and a sixth mounting electrode connected to the secondary-side outer electrode of the second piezoelectric transformer.

8. The piezoelectric vibration device according to claim 7,
wherein the first and fourth mounting electrodes line-symmetric to each other with respect to the axis of symmetry,
wherein the second and fifth mounting electrodes are line-symmetric to each other with respect to the axis of symmetry, and
wherein the third and sixth mounting electrodes are line-symmetric to each other with respect to the axis of symmetry.

9. The piezoelectric vibration device according to claim 1, wherein the flexible board includes:
a frame, a first extended member that extends from the frame, and a second extended member that extends from the frame, and
a first element-mounting terminal disposed on the first extended member that is connected to a first outer electrode of the piezoelectric vibrator, and a second element-mounting terminal disposed on the second extended member that is connected to a second outer electrode of the piezoelectric vibrator.

10. The piezoelectric vibration device according to claim 9, wherein a first basal portion of the first extended member connected to the frame is located closer to the second element-mounting terminal than the first element-mounting terminal.

11. The piezoelectric vibration device according to claim 1,
wherein the outer electrode of the piezoelectric vibrator includes a first outer electrode, a second outer electrode, a third outer electrode, and a fourth outer electrode,
wherein the piezoelectric vibrator is a piezoelectric transformer, and
wherein a voltage applied to one of the first and second outer electrodes and the third and fourth outer electrodes of the piezoelectric transformer causes a voltage to be excited in another one of the first and second outer electrodes and the third and fourth outer electrodes.

12. The piezoelectric vibration device according to claim 11, wherein the piezoelectric element has a rectangular first surface, and the piezoelectric transformer includes:
a plurality of first inner electrodes disposed inside the piezoelectric element and connected to the first outer electrode,
a plurality of second inner electrodes disposed inside the piezoelectric element and connected to the second outer electrode,
a plurality of third inner electrodes disposed inside the piezoelectric element and connected to the third outer electrode, and
a plurality of fourth inner electrodes disposed inside the piezoelectric element and connected to the fourth outer electrode.

13. The piezoelectric vibration device according to claim 12,
wherein each of the first, second, third and fourth outer electrodes are disposed on the first surface of the piezoelectric element such that the first, second, third, and fourth outer electrodes are insulated from each other,
wherein the first outer electrode and the second outer electrode are disposed along a direction of a first side of the first surface of the piezoelectric element,
wherein the third outer electrode and the fourth outer electrode are disposed along the direction of the first side of the first surface of the piezoelectric element,
wherein the first outer electrode and the third outer electrode are respectively aligned with each other and extend in a direction orthogonal to the direction of the first side of the first surface of the piezoelectric element, and
wherein the second outer electrode and the fourth outer electrode are respectively aligned with each other and extend in the direction orthogonal to the direction of the first side of the first surface of the piezoelectric element.

14. The piezoelectric vibration device according to claim 1,
wherein the piezoelectric vibrator is a piezoelectric transformer,
wherein the piezoelectric element has an input that is polarized, an output that is polarized, and an insulator disposed between the input and the output,
wherein the piezoelectric transformer includes an input-side first inner electrode and an input-side second inner electrode that are disposed in the input and located opposite to each other, and an output-side first inner electrode and an output-side second inner electrode that are disposed in the output and located opposite to each other.

15. The piezoelectric vibration device according to claim 14,
wherein the input-side second inner electrode is connected to an input-side reference potential, and at least a part of the input-side second inner electrode is located closer to the insulator than the input-side first inner electrode, and
wherein the output-side second inner electrode is connected to an output-side reference potential, and at least a part of the output-side second inner electrode is located closer to the insulator than the output-side first inner electrode.

16. A piezoelectric vibration device comprising:
a piezoelectric vibrator that includes a piezoelectric element and an outer electrode on a surface of the piezoelectric element;
a flexible board that includes an element-mounting terminal connected to the outer electrode of the piezoelectric vibrator and an external connection terminal configured to be connected to a wiring board; and
a case that includes a ceiling and a securing member configured to secure the case to the wiring board,
wherein, when the piezoelectric vibration device is mounted on the wiring board, the securing member defines a space between the ceiling and the wiring board to accommodate the piezoelectric vibrator and the flexible board, and the piezoelectric vibrator is suspended inside the case onto the ceiling of the case by a holding member,
wherein the outer electrode is disposed on a first surface of the piezoelectric element, and a second surface of the piezoelectric element opposite the first surface is held to the ceiling of the case, and
wherein the outer electrode is connected to the element-mounting terminal at a node of mechanical vibration on the first surface of the piezoelectric element by a conductive joining material.

17. A piezoelectric vibration device comprising:
a piezoelectric vibrator that includes a piezoelectric element and an outer electrode on a surface of the piezoelectric element;
a flexible board that includes an element-mounting terminal connected to the outer electrode of the piezoelectric vibrator and an external connection terminal configured to be connected to a wiring board; and
a case that includes a ceiling and a securing member configured to secure the case to the wiring board,
wherein, when the piezoelectric vibration device is mounted on the wiring board, the securing member defines a space between the ceiling and the wiring board to accommodate the piezoelectric vibrator and the flexible board, and the piezoelectric vibrator is suspended inside the case onto the ceiling of the case by a holding member,
wherein the flexible board has a frame, and an extended member that extends from the frame, and
wherein the element-mounting terminal is disposed on the extended member, and the external connection terminal is disposed on the frame.

18. The piezoelectric vibration device according to claim 17, wherein the extended member is connected to the frame at a basal portion, and the element-mounting terminal is disposed at a distal end of the extended member.

* * * * *